United States Patent
Okazaki et al.

(10) Patent No.: US 7,015,090 B2
(45) Date of Patent: Mar. 21, 2006

(54) METHOD OF MANUFACTURING A SEMICONDUCTOR DEVICE HAVING TRENCHES FOR ISOLATION AND CAPACITOR FORMATION TRENCHES

(75) Inventors: Tsutomu Okazaki, Ome (JP); Daisuke Okada, Kunitachi (JP); Yoshihiro Ikeda, Hamura (JP); Keisuke Tsukamoto, Hitachinaka (JP); Tatsuya Fukumura, Ome (JP); Shoji Shukuri, Koganei (JP); Keiichi Haraguchi, Hitachinaka (JP); Koji Kishi, Higashiyamato (JP)

(73) Assignee: Renesas Technology Corp., Tokyo (JP)

( * ) Notice: Subject to any disclaimer, the term of this patent is extended or adjusted under 35 U.S.C. 154(b) by 23 days.

(21) Appl. No.: 10/408,353

(22) Filed: Apr. 8, 2003

(65) Prior Publication Data
US 2004/0038492 A1  Feb. 26, 2004

(30) Foreign Application Priority Data
Apr. 17, 2002 (JP) ............................. 2002-114967

(51) Int. Cl.
*H01L 21/8248* (2006.01)

(52) U.S. Cl. ...................... 438/243; 438/248; 438/391

(58) Field of Classification Search ................ 438/248, 438/391, 243, 244, 386, 387, 389, 390, 392, 438/246, 247, 249; 257/E21.011
See application file for complete search history.

(56) References Cited

U.S. PATENT DOCUMENTS

| | | | | |
|---|---|---|---|---|
| 4,921,815 A | * | 5/1990 | Miyazawa ................... | 438/248 |
| 5,342,480 A | * | 8/1994 | Nishizawa et al. .......... | 438/164 |
| 5,380,674 A | * | 1/1995 | Kimura et al. .............. | 438/241 |
| 6,087,214 A | * | 7/2000 | Cunningham ............... | 438/244 |
| 6,617,651 B1 | * | 9/2003 | Ohsawa ...................... | 257/366 |

FOREIGN PATENT DOCUMENTS

| | | |
|---|---|---|
| JP | 11-251547 | 9/1999 |
| JP | 2002-222924 | 8/2002 |
| JP | 2001-85633 | 3/2003 |

* cited by examiner

*Primary Examiner*—George Fourson
*Assistant Examiner*—Fernando L. Toledo
(74) *Attorney, Agent, or Firm*—Antonelli, Terry, Stout and Kraus, LLP.

(57) ABSTRACT

At least not less than one capacitor formation trench providing an uneven surface is formed on the surface of a capacitor formation region. Thus, the surface area of a capacitor is increased, which enables improvement of the capacitance of the capacitor per unit area. Further, by forming the capacitor formation trench and an element formation trench that are formed in the surface of the semiconductor substrate by the same step, it is possible to simplify the manufacturing process. Whereas, a dielectric film of the capacitor in the capacitor formation region and a high-voltage gate insulating film in a MISFET formation region are formed by the same step; alternatively, the dielectric film of the capacitor in the capacitor formation region and a memory gate interlayer film between a polysilicon layer and a polysilicon layer in the memory cell formation region are formed by the same step.

38 Claims, 55 Drawing Sheets

METHOD OF MANUFACTURING A SEMICONDUCTOR DEVICE HAVING TRENCHES FOR ISOLATION AND CAPACITOR FORMATION TRENCHES

BACKGROUND OF THE INVENTION

The present invention relates to a method of manufacture of a semiconductor device, and to the semiconductor device. More particularly, it relates to a method of forming a capacitor in conjunction with a semiconductor device.

In recent years, with the trend toward smaller size, lower power consumption, and higher integration of a semiconductor device, the operating voltage of a semiconductor device has become increasingly lower, and the voltage supplied from an external power source has become increasingly lower. Under such circumstances, a semiconductor device is typically equipped with a booster circuit, such as a charge pump circuit, for generating the operating voltage needed by the semiconductor device from the external power supply voltage. This kind of booster circuit includes a capacitor (capacitive element) which is formed of, for example, a MIS capacitive element utilizing a MISFET (Metal Insulator Semiconductor Field Effect Transistor) as the capacitor.

Japanese Unexamined Patent Publication No. 2001-85633 (hereinafter referred to as the first example) discloses the following technology: In a semiconductor device having a nonvolatile memory, the capacitance of a capacitor of a charge pump circuit is formed such that a first capacitance between a first gate and a second gate and a second capacitance between the first gate and a well region are connected in parallel to each other. As a result, the area of the charge pump circuit is reduced.

Japanese Unexamined Patent Publication No. Hei 11 (1999)-251547 (hereinafter referred to as the second example) discloses the following technology: A first trench capacitor is formed which constitutes the memory cell of a DRAM (Dynamic Random Access Memory), and a second trench capacitor, having almost the same configuration as that of the first trench capacitor, is formed in another region. The second trench capacitor is also used as a capacitor in a region other than that of the DRAM.

Japanese Unexamined Patent Publication No. 2002-222924 (hereinafter referred to as the third example) discloses a technology for simultaneously forming a trench for element isolation and a desired pattern in a region where a capacitive element is formed in a semiconductor substrate.

SUMMARY OF THE INVENTION

In the above-mentioned first example, the boosted voltage value is proportional to the area of the capacitor. For this reason, if the area is reduced with a reduction in size of the device, the areas of a first gate and a second gate are reduced. As a result, the capacitance is reduced. Therefore, in order to form a high-voltage stable booster circuit, the area of the capacitors required for a charge pump circuit must be increased.

In the above-mentioned second example, the number of manufacturing steps is unfavorably increased, because a capacitor having almost the same configuration as that of the memory cell of the DRAM is formed.

In the above-mentioned third example, a dielectric film and a wiring layer are formed for forming the capacitive elements. Accordingly, the number of manufacturing steps for respectively forming them is undesirably increased.

It is therefore an object of the present invention to provide a technology which enables an improvement of the capacitor capacitance per unit area.

Further, it is another object of the present invention to provide a technology for simplifying the manufacturing process in the formation of a semiconductor device having capacitors.

The foregoing and other objects and novel features of the present invention will be apparent from the following description as provided in this specification and from the accompanying drawings.

Out of the aspects of the present invention disclosed in this application, the general outlines of typical ones will be described as follows.

Namely, in accordance with the present invention, in a semiconductor device having semiconductor elements, such as MISFETs, and capacitors (capacitive elements) on a semiconductor device, each of the capacitors (capacitive elements) is formed of a plurality of capacitor formation trenches formed in a capacitor formation region, a capacitor dielectric film formed on the capacitor formation region including the inside of the plurality of the capacitor formation trenches, and a capacitor electrode. As a result, it is possible to increase the surface area of the capacitor, and, thereby, to improve the capacitor capacitance per unit area.

Further, in a method of manufacturing a semiconductor device having semiconductor elements, such as MISFETs, and capacitors (capacitive elements) on a semiconductor substrate, at least not less than one capacitor formation trench is formed by a step of forming an element isolation trench for isolation between the semiconductor elements in the semiconductor substrate. As a result, it is possible to increase the surface area of the capacitor, and, thereby, to improve the capacitor capacitance per unit area. In addition, it is possible to simplify the manufacturing process. The capacitor formation trench is formed in the shape of a hole or a stripe. Also, by forming it in this manner, it is possible to increase the surface area of the capacitor, and, thereby, to improve the capacitor capacitance per unit area.

Still further, in accordance with the present invention, in the step of forming a gate oxide film of the MISFETs, the capacitor dielectric film is formed on the capacitor formation trenches. As a result, it is possible to simplify the manufacturing process. Herein, the MISFETs include a MISFET for high voltage and a MISFET for low voltage. It is also possible to use the gate insulating film of the high-voltage MISFET and the gate insulating film of the low-voltage MISFET differently for different purposes.

Furthermore, in accordance with the present invention, a memory cell is formed, including a first memory gate insulating film, a first conductive film formed on the first memory gate insulating film, and a second memory gate insulating film formed on the first conductive film. The second memory gate insulating film and the capacitor dielectric film disposed on the capacitor formation trenches are formed by the same step. As a result, it is possible to simplify the manufacturing process. Further, by using the second memory gate insulating film of the memory cell as the capacitor dielectric film in place of the gate insulating film of the MISFETs, it is possible to improve the reliability of the capacitor dielectric film and to simplify the manufacturing process.

Representative examples of a semiconductor device in accordance with typical aspects of the present invention will be briefly described as follows.

(1) A semiconductor device comprises: semiconductor elements; element isolation trenches, each for effecting isolation between the semiconductor elements; capacitor formation trenches; and capacitor electrodes, each formed inside the capacitor formation trenches via a capacitor dielectric film, characterized in that the capacitor formation trenches are formed by a step of forming the element isolation trenches in a semiconductor substrate.

(2) A semiconductor device comprises: semiconductor elements; element isolation trenches, each for effecting isolation between the semiconductor elements; a gate insulating film formed on MISFETs of the semiconductor elements; capacitor formation trenches; a capacitor dielectric film formed in the capacitor formation trenches; and capacitor electrodes formed on the capacitor dielectric film, characterized in that the capacitor dielectric film and the gate insulating film are formed of a dielectric film of the same layer.

(3) A semiconductor device comprises: semiconductor elements; element isolation trenches, each for effecting isolation between the semiconductor elements; a gate insulating film formed on MISFETs of the semiconductor elements; gate electrodes formed on the gate insulating film; capacitor formation trenches; a capacitor dielectric film formed in the capacitor formation trenches; and capacitor electrodes formed on the capacitor dielectric film, characterized in that the capacitor electrodes and the gate electrodes are formed of a dielectric film of the same layer.

(4) A semiconductor device comprises: semiconductor elements; memory cells; element isolation trenches, each for effecting isolation between the semiconductor elements; an electric charge storage layer formed in the memory cells; a memory gate insulating film formed on the electric charge storage layer; capacitor formation trenches; a capacitor dielectric film formed in the capacitor formation trenches; and capacitor electrodes formed on the capacitor formation trenches, characterized in that the capacitor dielectric film and the memory gate insulating film are formed of a dielectric film of the same layer.

(5) A semiconductor device comprises: semiconductor elements; memory cells; element isolation trenches, each for effecting isolation between the semiconductor elements; an electric charge storage layer formed in the memory cells; capacitor formation trenches; a capacitor dielectric film formed in the capacitor formation trenches; and capacitor electrodes formed on the capacitor dielectric film, characterized in that the capacitor electrodes and the electric charge storage layer are formed of a conductive film of the same layer.

(6) A semiconductor device comprises: semiconductor elements; memory cells; element isolation trenches, each for effecting isolation between the semiconductor elements; an electric charge storage layer formed in the memory cells; a memory gate insulating film formed on the electric charge storage layer; memory gate electrodes formed on the memory gate insulating film; capacitor formation trenches; a capacitor dielectric film formed in the capacitor formation trenches; and capacitor electrodes formed on the capacitor dielectric film, characterized in that the capacitor electrodes and the memory gate electrodes are formed of a conductive film of the same layer.

(7) A semiconductor device comprises: semiconductor elements; element isolation trenches, each for effecting isolation between the semiconductor elements; a gate insulating film formed in MISFETs of the semiconductor elements; gate electrodes formed on the gate insulating film; memory cells; an electric charge storage layer formed in the memory cells; a memory gate insulating film formed on the electric charge storage layer; memory gate electrodes formed on the memory gate insulating film; capacitor formation trenches; a capacitor dielectric film formed in the capacitor formation trenches; and capacitor electrodes formed on the capacitor dielectric film, characterized in that the capacitor electrodes, the gate electrodes, and the memory gate electrodes are formed of a conductive film of the same layer.

(8) The semiconductor device according to the item (1), wherein the depth of the capacitor formation trenches is substantially equal to the depth of the element isolation trenches.

(9) The semiconductor device according to the item (1), wherein the capacitor formation trenches are formed in the shape of holes, stripes, or a matrix.

(10) The semiconductor device according to the item (2), wherein the MISFETs include a first MISFET for high voltage and a second MISFET for low voltage, and the thickness of the gate insulating film of the first MISFET is larger than the thickness of the gate insulating film of the second MISFET.

(11) The semiconductor device according to the item (7), wherein the memory gate insulating film and the capacitor dielectric film include a multilayer film composed of a silicon oxide film and a silicon nitride film.

(12) The semiconductor device according to the item (7), wherein the electric charge storage layer includes a silicon nitride film or a Si nano-dot.

(13) The semiconductor device according to the item (7), wherein the electric charge storage layer is formed of a polysilicon film.

(14) The semiconductor device according to the item (7), wherein the memory gate electrode includes a polysilicon film.

(15) The semiconductor device according to the item (1), wherein the capacitor dielectric film and each of the capacitor electrodes are formed on a plurality of the capacitor formation trenches.

(16) The semiconductor device according to the item (15), wherein the plurality of the capacitor formation trenches are formed in the shape of holes, stripes, or a matrix.

(17) A semiconductor device comprises a capacitor having a plurality of capacitor formation trenches formed in a capacitor formation region, a capacitor dielectric film, and capacitor electrodes formed on the capacitor formation region, including the inside of the plurality of the capacitor formation trenches.

(18) The semiconductor device according to the item (17), wherein the plurality of the capacitor formation trenches are formed in a well region; the well region forms one electrode of the capacitor; and the capacitor electrode forms another electrode of the capacitor.

(19) The semiconductor device according to the item (17), wherein the plurality of the capacitor formation trenches are formed in the shape of holes, stripes, or a matrix.

(20) The semiconductor device according to the item (7), further comprising capacitors, each including the capacitor formation trenches, the capacitor dielectric film, and the capacitor electrodes; and a charge pump circuit formed of a plurality of the capacitors, and a plurality of the MISFETs, wherein the charge pump circuit is electrically connected to the memory gate electrodes.

DETAILED DESCRIPTION OF THE PREFERRED EMBODIMENTS

Figure 1:
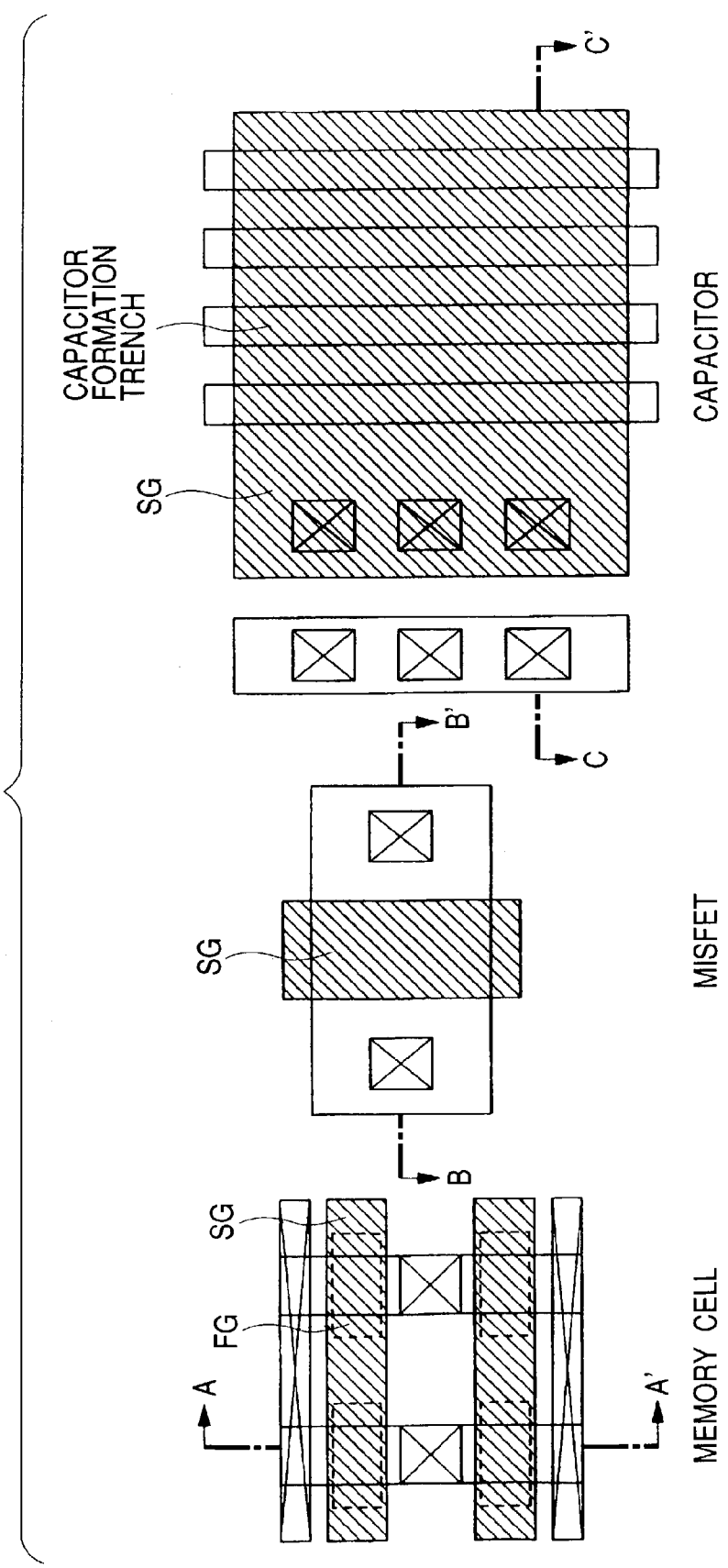
FIG. 1 is a plan view of basic parts of a semiconductor device, including a memory cell, a MISFET and a capacitor, representing Embodiment 1 of the present invention.

The present invention will be described by way of various embodiments with reference to the accompanying drawings. Incidentally, throughout the drawings, elements having the same function are represented by the same reference numerals and characters, and a repeated description thereof is omitted.

Embodiment 1

Figure 2:
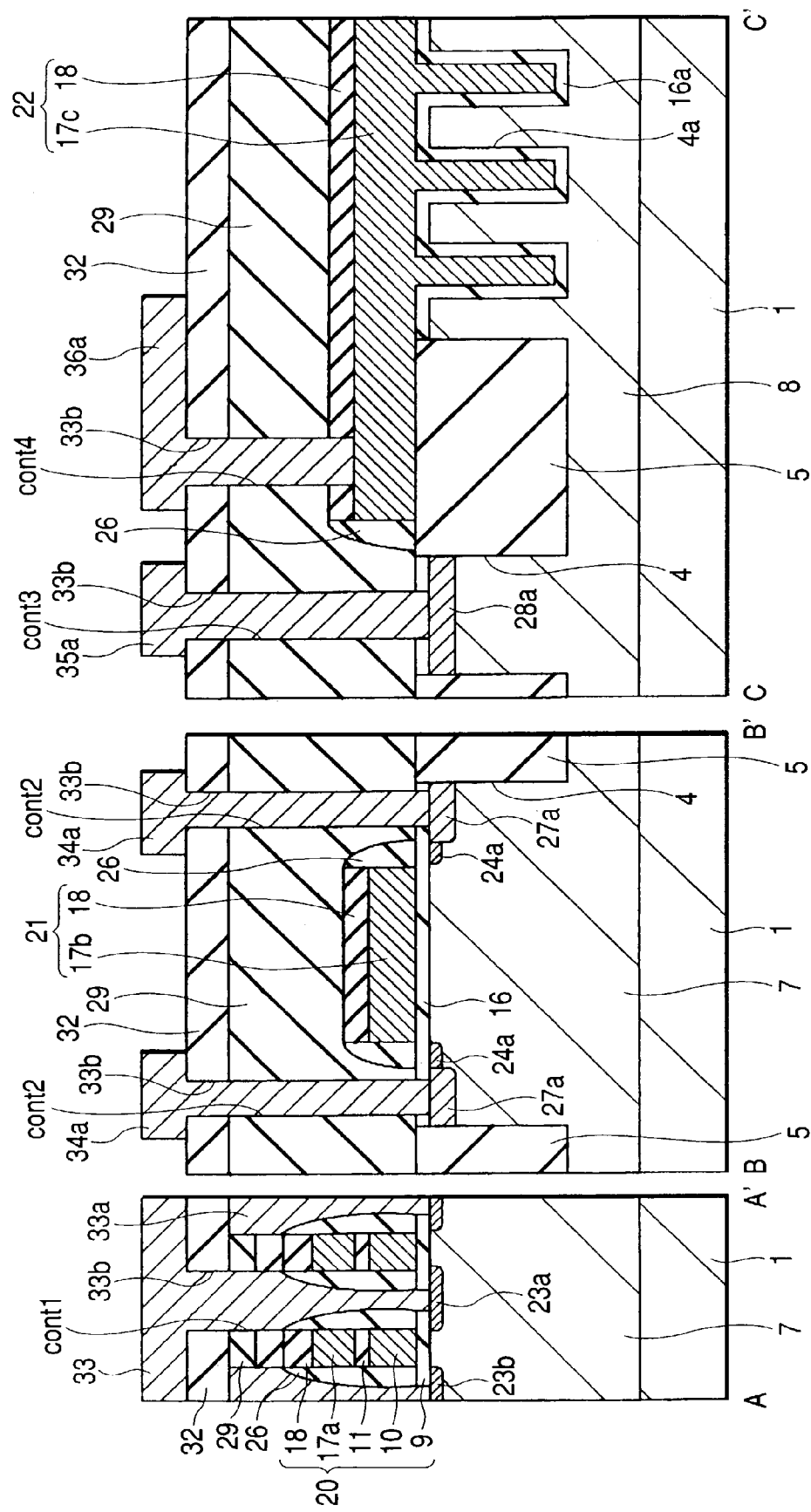
FIG. 2 is a cross sectional view of the respective parts of one version of the semiconductor device, as seen along line A-A', B-B' and C-C'; respectively, in FIG. 1.

FIG. 1 shows a plan view of the basic parts of a semiconductor device having a nonvolatile memory, which represents one embodiment of the present invention. FIG. 1 shows the plan view of a memory cell of the nonvolatile memory on the left-hand side, a MISFET at the central part, and a capacitor (capacitive element) on the right-hand side. FIG. 2 shows cross sectional diagrams of the memory cell on the left-hand side, a MISFET for high voltage (a high-voltage MISFET) at the central part, and a capacitor on the right-hand side, which correspond to cross sectional diagrams taken along the lines A-A', B-B', and C-C' of FIG. 1, respectively. The capacitor shown in FIG. 2 uses a gate insulating film of the high-voltage MISFET as its dielectric film.

Figure 3:
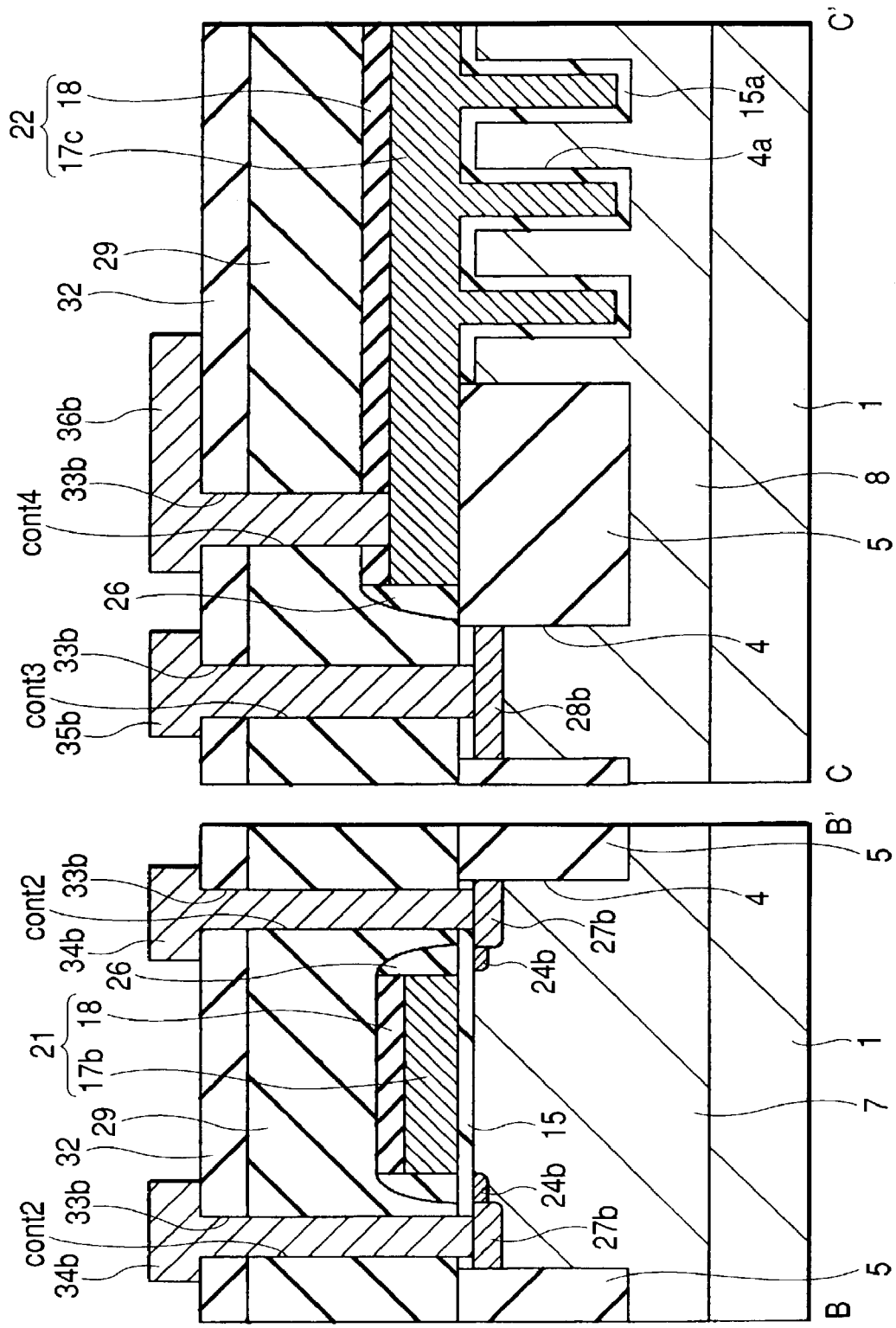
FIG. 3 is a cross sectional view of the respective parts of another version of the semiconductor device, as seen along lines B-B' and C-C'; respectively, in FIG. 1.

FIG. 3 shows the respective cross sectional diagrams of a MISFET for low voltage (a low-voltage MISFET) on the left-hand side and a capacitor on the right-hand side, which are the cross sectional diagrams taken along B-B' and C-C' of FIG. 1, respectively. The capacitor shown in FIG. 3 uses a gate insulating film of the low-voltage MISFET as its dielectric film.

Thus, the right-hand side of FIG. 2 shows a capacitor formation region in which a high-voltage gate insulating film of the MISFET is used as the capacitor dielectric film. Whereas, the right-hand side of FIG. 3 shows a capacitor formation region in which a low-voltage gate insulating film is used as the capacitor dielectric film. Herein, FIG. 3 shows only a MISFET and capacitor that are different in configuration from those of FIG. 2.

First, the basic configuration in this embodiment 1 will be described by reference to FIGS. 1 to 3.

On a semiconductor substrate 1, a memory cell of a nonvolatile memory, a MISFET, and a capacitor are formed. Incidentally, as the MISFET, an N-channel type MISFET is shown, but a P-channel type MISFET is not shown for simplification of the following description.

The memory cell is mainly composed of a memory tunnel insulating film (first memory gate insulating film) 9 formed on a P-type impurity layer (P-type well region) 7 formed on the semiconductor substrate 1, a floating gate electrode 10 which is an electric charge storage layer, a control gate electrode (memory gate electrode) 17a formed on the floating gate electrode 10, a silicon oxide film 18 formed on the control gate electrode 17a, a memory gate interlayer film (second memory gate insulating film) 11 formed between the floating gate electrode 10 and the control gate electrode 17a, a sidewall 26 formed on the sidewall of a memory gate electrode structure 20, an N-type impurity layer 23a serving as a drain region, and an N-type impurity layer 23b serving as a source region formed in the P-type impurity layer (P-type well region). Incidentally, the memory gate electrode structure 20 is formed of the memory tunnel insulating film 9, the floating gate electrode 10, the memory gate interlayer film 11, the control gate electrode 17a, and the silicon oxide film 18.

The memory tunnel insulating film (first memory gate insulating film) 9 is composed of, for example, a thermal oxide film. The memory gate interlayer film (second memory gate insulating film) 11 is composed of, for example, a so-called NONO film in which a silicon nitride film is formed on an oxide film, another oxide film is formed on the silicon nitride film, and another silicon nitride film is formed on the oxide film.

The floating gate electrode 10, which is an electric charge storage layer, is formed of, for example, a polysilicon film. The control gate electrode (memory gate electrode) 17a is formed of, for example, a multilayer film of a polysilicon film and a silicide film, such as a cobalt silicide (CoSi) film.

The control gate electrode (memory gate electrode) 17a is electrically connected to a word line.

A wiring layer 33 constitutes a bit line, and it is electrically connected to the N-type impurity layer 23a serving as a drain region. A plug layer 33a forms a source line, and it is electrically connected to the N-type impurity layer 23b serving as a source region. The wiring layer 33 and the plug layer 33a are formed of a metal film of, for example, tungsten (W), or copper (Cu).

In the memory cell, writing of data is performed in the following manner. For example, a ground voltage (0 V) is applied to the source region; a voltage of about 5 V is applied to the N-type impurity layer 23a; and a voltage of about 10 V is applied to the control gate electrode 17a. Thus, hot electrons are injected and stored in the floating gate electrode 10, which is an electric charge storage layer.

Data erasure is performed in the following manner. For example, 10 V is applied to the P-type impurity layer (P-type well region); the source/drain regions are open; and a high voltage of about −10 V of an inverse potential to that for writing is applied to the control gate electrode 17a. Thus, the electrons stored in the floating gate electrode 10, which is an electric charge storage layer, are drawn to the P-type impurity layer (P-type well region) 7 by electron tunneling through the memory tunnel insulating film (first memory gate insulating film) 9.

Reading of data is performed in the following manner. For example, 0 V is applied to the source region; about 1 V is applied to the drain region; and about 2 to 4 V is applied to the control gate electrode 17a.

Thus, in the writing/erasing operation of the nonvolatile memory cell, a high voltage whose absolute value is higher relative to the ground voltage (0 V) is required. On the other hand, with the desire for reduction in size and power consumption, the trend toward a lower voltage is accelerating down to use of a ground voltage (0 V) for an external power supply voltage Vss to be supplied from an external power source, and down to about 1.8 to 3.3 V for use as an external power supply voltage Vcc. Such being the case, a booster circuit, such as a charge pump circuit is mounted on the semiconductor substrate to generate the respective high voltages from the external power sources. Incidentally, the term high voltage denotes a voltage whose absolute value is higher than the external power supply voltage. In the nonvolatile memory in this embodiment, a high voltage of not less than about 10 V is required.

For this reason, the MISFETs constituting the peripheral circuit comprises high-voltage MISFETs having a high-voltage gate insulating film 16 and low-voltage MISFETs having a low-voltage gate insulating film 15 as their respective gate insulating films. The MISFET whose gate electrode or source/drain is to be applied with a high voltage is composed of a high-voltage MISFET.

The capacitor (capacitive element) has a MIS capacitive element formed by utilizing the high-voltage MISFET formation step, and a MIS capacitive element formed by utilizing the low-voltage MISFET formation step.

The booster circuit, such as a charge pump circuit, is composed of these MISFETs and capacitors. It is noted that the high-voltage gate insulating film 16 is formed to have a larger thickness than the thickness of the low-voltage gate insulating film 15.

Element isolation is provided between the semiconductor elements, such as low-voltage MISFETs, high-voltage MISFETs, and capacitors, by element isolation trenches 4 and an element isolation insulating film embedded in the element isolation trenches 4. Namely, the element isolation is achieved by the element isolation trenches 4 in the semiconductor element formation regions, such as the high-voltage MISFET formation regions, the low-voltage MISFET formation regions, and the capacitor formation regions.

An N-channel type high-voltage MISFET is mainly composed of the high-voltage gate insulating film 16 formed as the gate insulating film of the MISFET on the P-type impurity layer (P-type well region) 7 formed in the semiconductor substrate 1, a gate electrode 17b of the MISFET formed on the gate insulating film 16 of the high-voltage MISFET, the sidewall 26 formed on the sidewall of a gate electrode structure 21 composed of the gate electrode 17b and a silicon oxide film 18, and N-type impurity layers 24a and 27a serving as source/drain regions formed in the P-type impurity layer (P-type well region) 7. The N-type impurity layers 24a and 27a are electrically connected to a wiring layer 34a.

The high-voltage gate electrode 17b is formed of a conductive film of the same layer as the control gate electrode (memory gate electrode) 17a of the memory cell.

A capacitor (MIS capacitive element) C formed by utilizing the high-voltage MISFET formation step is mainly composed of a dielectric film 16a of the capacitor formed by the step of forming the gate insulating film of the high-voltage MISFET on capacitor formation trenches 4a formed in an N-type impurity layer (N-type well region) 8 in the semiconductor substrate 1, and a capacitor electrode 17c formed by the step of forming the gate electrode 17b of the high-voltage MISFET. Whereas, an upper electrode structure 22 of the capacitor is formed of the capacitor electrode 17c and the silicon oxide film 18.

Namely, the capacitor formation trench 4a is formed by using the same step as the step of forming the element isolation trench 4 for isolation between the semiconductor elements, such as MISFETs. The dielectric film 16a of the capacitor is formed on the side and the bottom of the capacitor formation trench 4a. The capacitor electrode 17c is formed in such a manner as to fill in the capacitor formation trench 4a via the dielectric film 16a of the capacitor.

Incidentally, the formation of the N-type impurity layer (N-type well region) 8 in the capacitor (MIS capacitive element) formation region is accomplished by the same step as the step of forming the N-type impurity layer (N-well region) 8 in a p-channel MISFET formation region (not shown).

The capacitor electrode 17c formed by the same step as the step of forming the gate electrode 17b of the N-channel type high-voltage MISFET serves as an upper electrode of the capacitor. Whereas, the N-type impurity layer (N-type well region) 8 serves as a lower electrode of the capacitor. The N-type impurity layer (N-type well region) 8 is electrically connected to a wiring layer 35a via an N-type impurity layer 28a formed by using the step of forming the source/drain regions of the p-channel MISFET. The capacitor electrode 17c is electrically connected to a wiring layer 36a.

A low-voltage MISFET is mainly composed of the low-voltage gate insulating film 15 formed as the gate insulating film of the MISFET on the P-type impurity layer (P-type well region) 7 formed in the semiconductor substrate 1, a gate electrode 17b of the MISFET formed on the low-voltage gate insulating film 15, the sidewall 26 formed on the sidewall of the gate electrode structure 21 composed of the gate electrode 17b and the silicon oxide film 18, and N-type impurity layers 24b and 27b serving as source/drain regions formed in the P-type impurity layer (P-type well region) 7. The N-type impurity layers 24b and 27b are electrically connected to a wiring layer 34b.

The low-voltage gate electrode 17b is formed of a conductive film of the same layer as the control gate electrode (memory gate electrode) 17a of the memory cell.

A capacitor (MIS capacitive element) formed by utilizing the low-voltage MISFET formation step is mainly composed of a dielectric film 15a of the capacitor formed by the step of forming the gate insulating film of the low-voltage MISFET on the capacitor formation trench 4a formed in the N-type impurity layer (N-type well region) 8 formed in the semiconductor substrate 1, and the capacitor electrode 17c formed by the step of forming the gate electrode 17b of the low-voltage MISFET. Whereas, the upper electrode structure 22 of the capacitor is formed of the capacitor electrode 17c and the silicon oxide film 18.

The capacitor formation trench 4a is formed by using the same step as the step of forming the element isolation trench 4 for isolation between the semiconductor elements, such as MISFETs. The dielectric film 15a of the capacitor is formed on the side and the bottom of the capacitor formation trench 4a. The capacitor electrode 17c is formed in such a manner as to fill in the capacitor formation trench 4a via the dielectric film 16a of the capacitor.

The capacitor electrode 17c formed by the step of forming the gate electrode 17b of the low-voltage MISFET constitutes an upper electrode of the capacitor. Whereas, the N-type impurity layer (N-type well region) 8 constitutes a lower electrode of the capacitor. The N-type impurity layer (N-type well region) 8 is electrically connected to a wiring layer 35b via an N-type impurity layer 28b formed by using the step of forming the source/drain regions of the p-channel MISFET. The capacitor electrode 17c is electrically connected to a wiring layer 36b.

The capacitive elements of the booster circuit, such as a charge pump circuit, are composed of these capacitors. The capacitance of the capacitor, i.e., the area occupied by the MIS capacitive element, must be increased for the improvement of the capability of the booster circuit. This unfavorably results in an increase in the area occupied by the booster circuit in the chip. Namely, the capacitance value of the capacitor per unit area is required to be increased. In this embodiment, the capacitor formation trenches 4a are formed in the surface of the semiconductor substrate 1 by using the element isolation trench formation step. Then, the capacitor electrode 17c of the capacitor (MIS capacitive element) C is formed in such a manner as to be embedded in the inside thereof. As a result, it is possible to enhance the capacitor capacitance per unit area, and, hence, it is possible to increase the MIS capacitance as compared with the case where the capacitor (MIS capacitive element) is formed on the flat surface of the semiconductor substrate 1, because the area of the capacitor (MIS capacitance), i.e., the sides and the bottoms of the capacitor formation trenches 4a, correspond to the MIS capacitance.

Whereas, the capacitor (capacitive element) is formed of a plurality of capacitor formation trenches 4a formed in the capacitor formation region, the capacitor dielectric film 15a and the capacitor electrode 17c, that is formed on the capacitor formation region, including the inside of the plurality of the capacitor formation trenches 4a. As a result, it is possible to increase the surface area of the capacitor and to improve the capacitor capacitance per unit area.

Further, the capacitor formation trenches 4a are formed to be substantially equal in depth to the element isolation trench 4. The capacitor formation trenches 4a are formed by using the step of forming the element isolation trench 4. Namely, the capacitor formation trenches 4a are formed in the following manner. At least not less than one capacitor formation trench 4a is formed by using the step of forming the element isolation trench 4 for isolation between the respective semiconductor elements in the region on the semiconductor substrate 1 including the capacitor formation region. The silicon oxide film 5, which is an element isolation insulating film, is then embedded therein. Subsequently, the part of the silicon oxide film 5 which is an element isolation insulating film of the capacitor formation region is removed. Namely, at least not less than one capacitor formation trench 4a is formed by the same formation step as with the element isolation trench 4.

Whereas, the dielectric films 15a and 16a of the capacitors are formed of the insulating films of the same layers as the low-voltage gate insulating film 15 and the high-voltage gate insulating film 16 of the MISFETs, respectively. The capacitor electrode 17c is formed of the conductive film of the same layer as that of the gate electrode 17b of the MISFET and the control gate electrode 17a. Namely, the dielectric films 15a and 16a of the capacitors are the insulating films formed by the same formation steps used for formation of the low-voltage gate insulating film 15 and the high-voltage gate insulating film 16 of the MISFETs, respectively. The capacitor electrode 17c is the conductive film formed by the same formation step used for formation of the gate electrode 17 b of the MISFET and the control gate electrode 17a. As a result, it is possible to simplify the manufacturing process, and it is possible to improve the capacitor capacitance per unit area.

Figure 55:
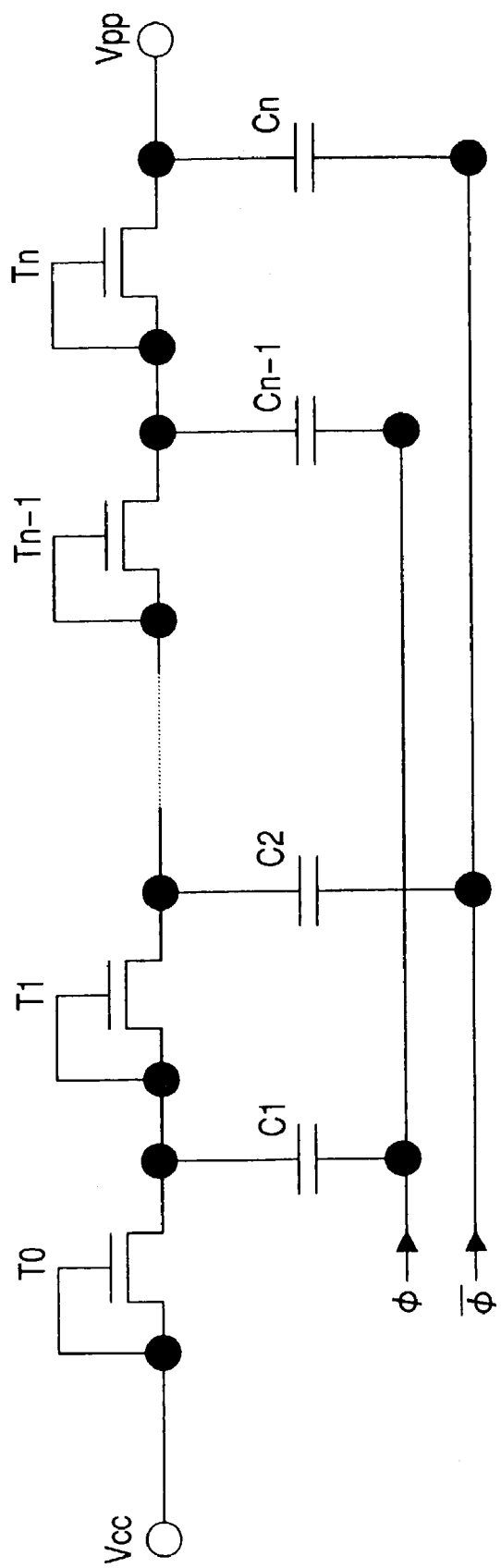
FIG. 55 is a circuit diagram of a charge pump circuit of the present invention.

A description will be given of one example of the charge pump circuit to be used in this embodiment. As shown in FIG. 55, a charge pump circuit 100 boosts the input voltage by the externally received input signals φ and /φ and the capacitors C1 to Cn, and it generates a high voltage. The capacitors C1 to Cn are formed of the capacitors formed in the capacitor formation region. The transistors T0 to Tn are formed of, for example, the N-type MISFETs out of the foregoing high-voltage MISFETs, each of which is formed in such a manner that the source region 27a and the gate electrode 17b are short-circuited. The source region 27a of such a transistor T0 is connected to an external voltage Vcc, while the drain region 27a is connected to the transistor T1 and the capacitor C1 of the subsequent stage.

Herein, when the external voltage Vcc is applied thereto, the electric charge boosted by the capacitor C1 of the first stage is stored in the capacitor C2 of the subsequent stage through the transistor T1. The electrical charge boosted by the capacitor C2 is stored in the capacitor C3 of the subsequent stage through the transistor T2. Repetition of such boosting provides an internal voltage Vpp from an output terminal. Such an internal voltage Vpp is applied to the control gate electrode 17a of the memory cell via a control circuit of the control gate. In this embodiment, the external voltage Vcc is about 1.8 to 3.3 V, and it is possible to boost the internal voltage Vpp up to about 18 V.

A method of manufacture of the semiconductor device of this embodiment 1 will be described.

Figure 4:
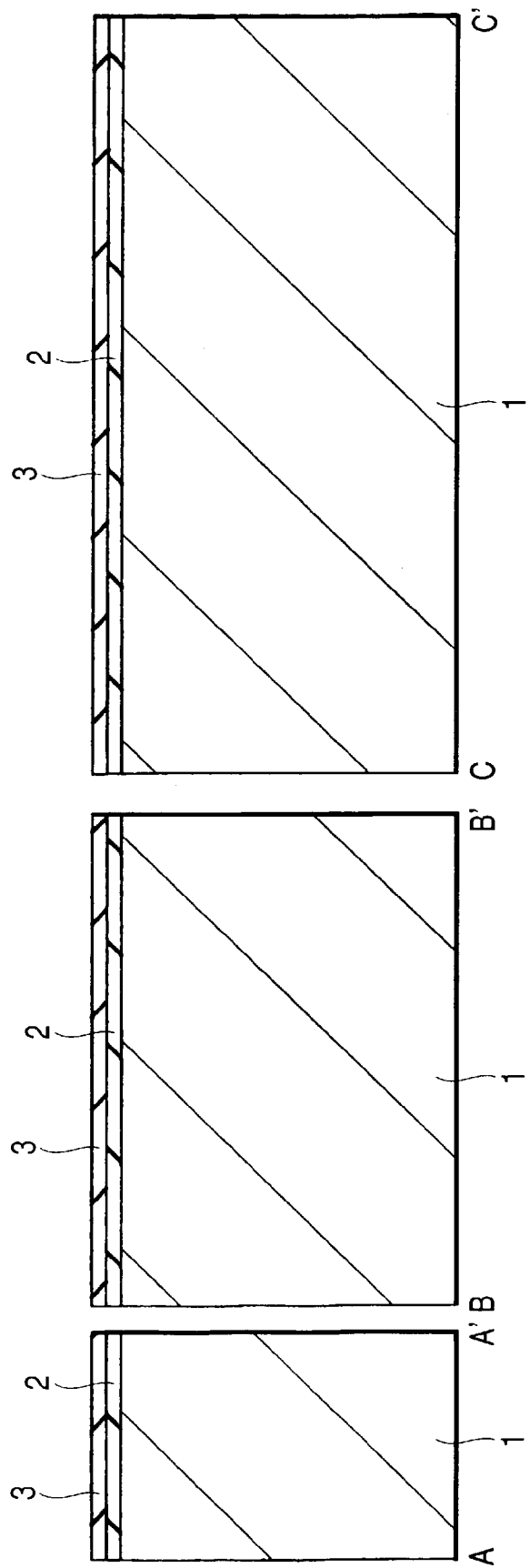
FIG. 4 is a cross sectional view of the respective parts of the semiconductor device representing Embodiment 1 of the present invention, during a step in the manufacturing process thereof.

First, as shown in FIG. 4, a semiconductor substrate 1 that is made of, for example, P-type single crystal silicon is prepared. Then, the semiconductor substrate 1 is, for example, thermally oxidized, so that a silicon oxide film 2 with a thickness of about 8 to 10 nm is formed on the surface.

Figure 5:
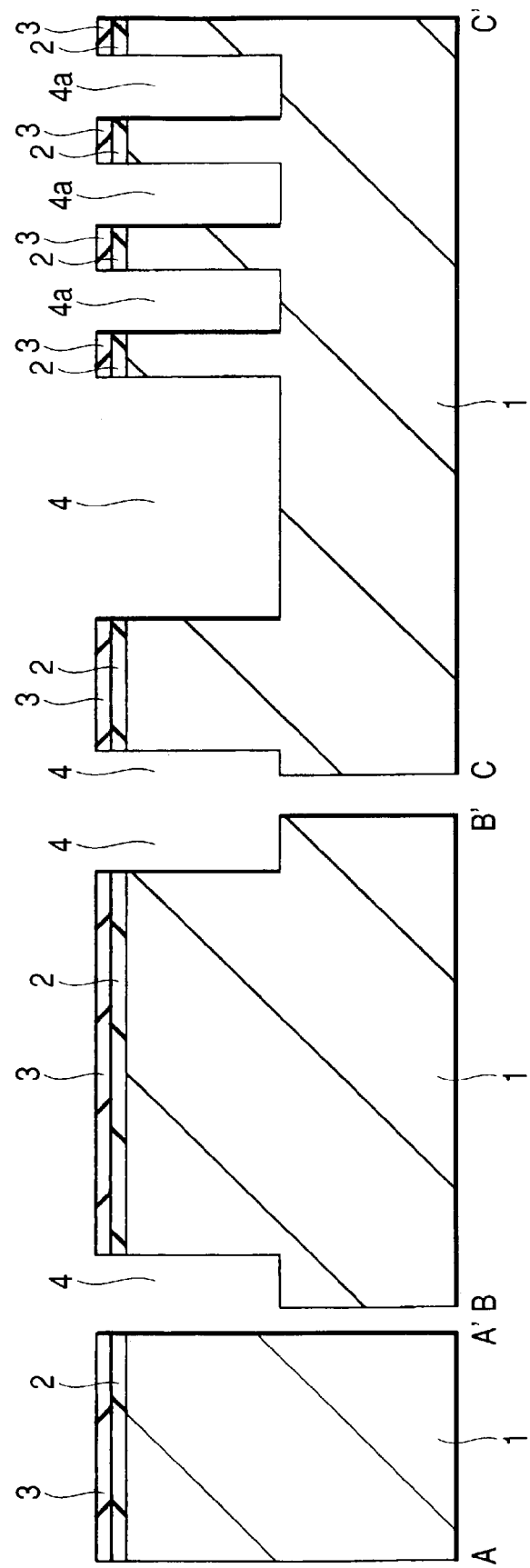
FIG. 5 is a cross sectional view of the respective parts of the semiconductor device as it appears during a manufacturing step subsequent to the step of FIG. 4.
Figure 6:
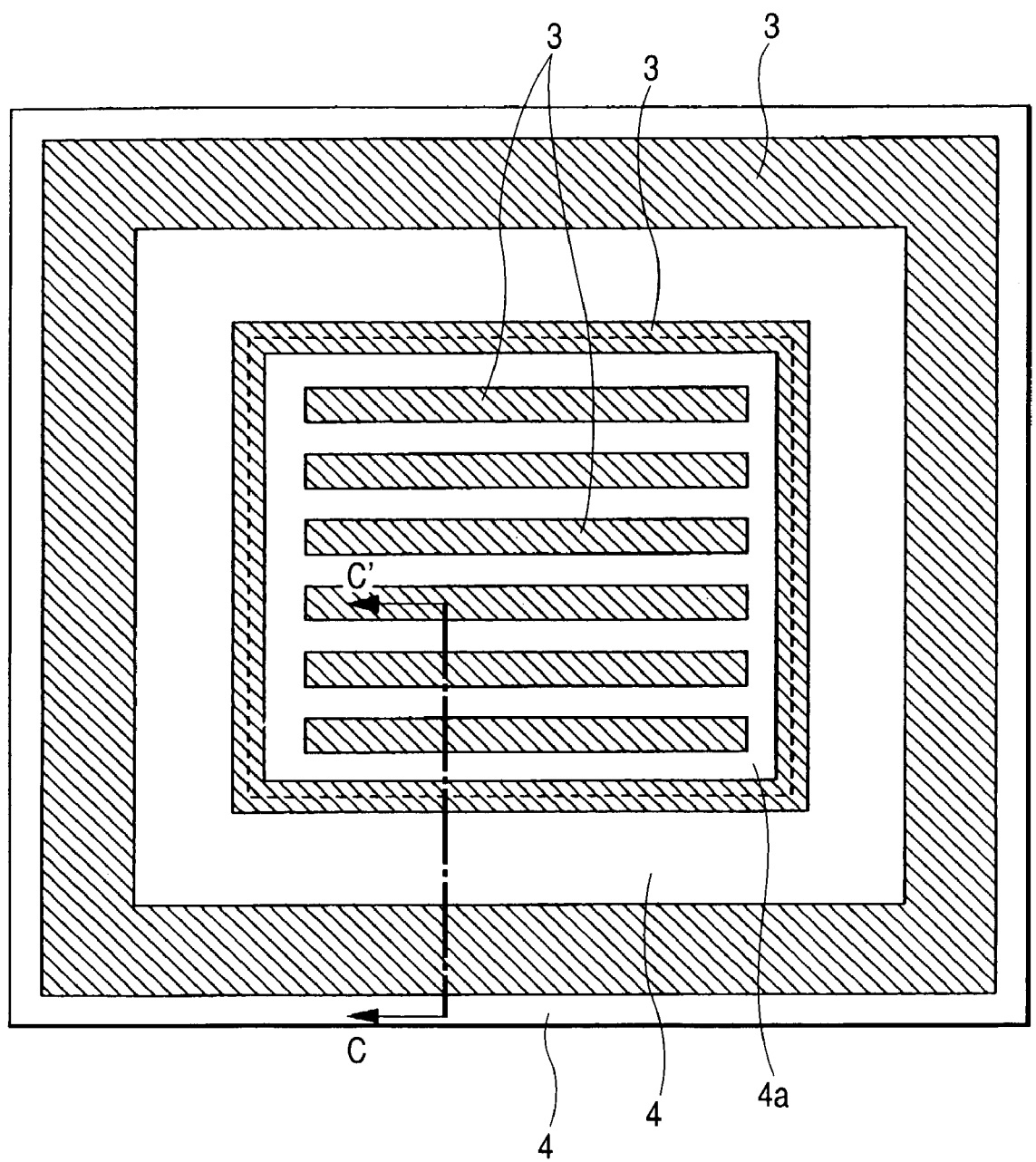
FIG. 6 is a plan view of the respective parts of the semiconductor device as it appears during a manufacturing step, showing an example of the capacitor formation trenches.
Figure 7:
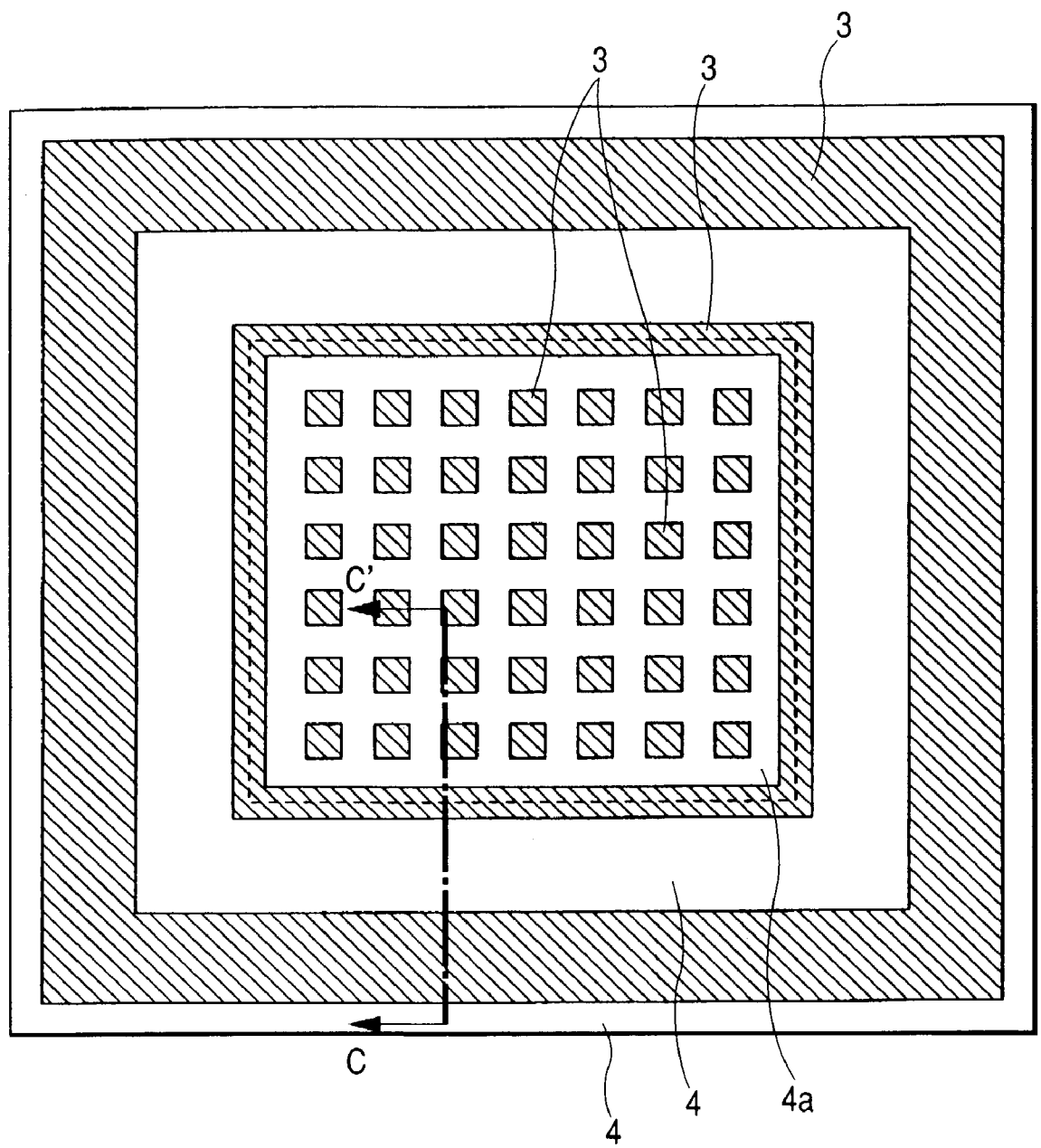
FIG. 7 is a plan view of the respective parts of the semiconductor device as it appears during a manufacturing step, showing an example of the capacitor formation trenches.
Figure 8:
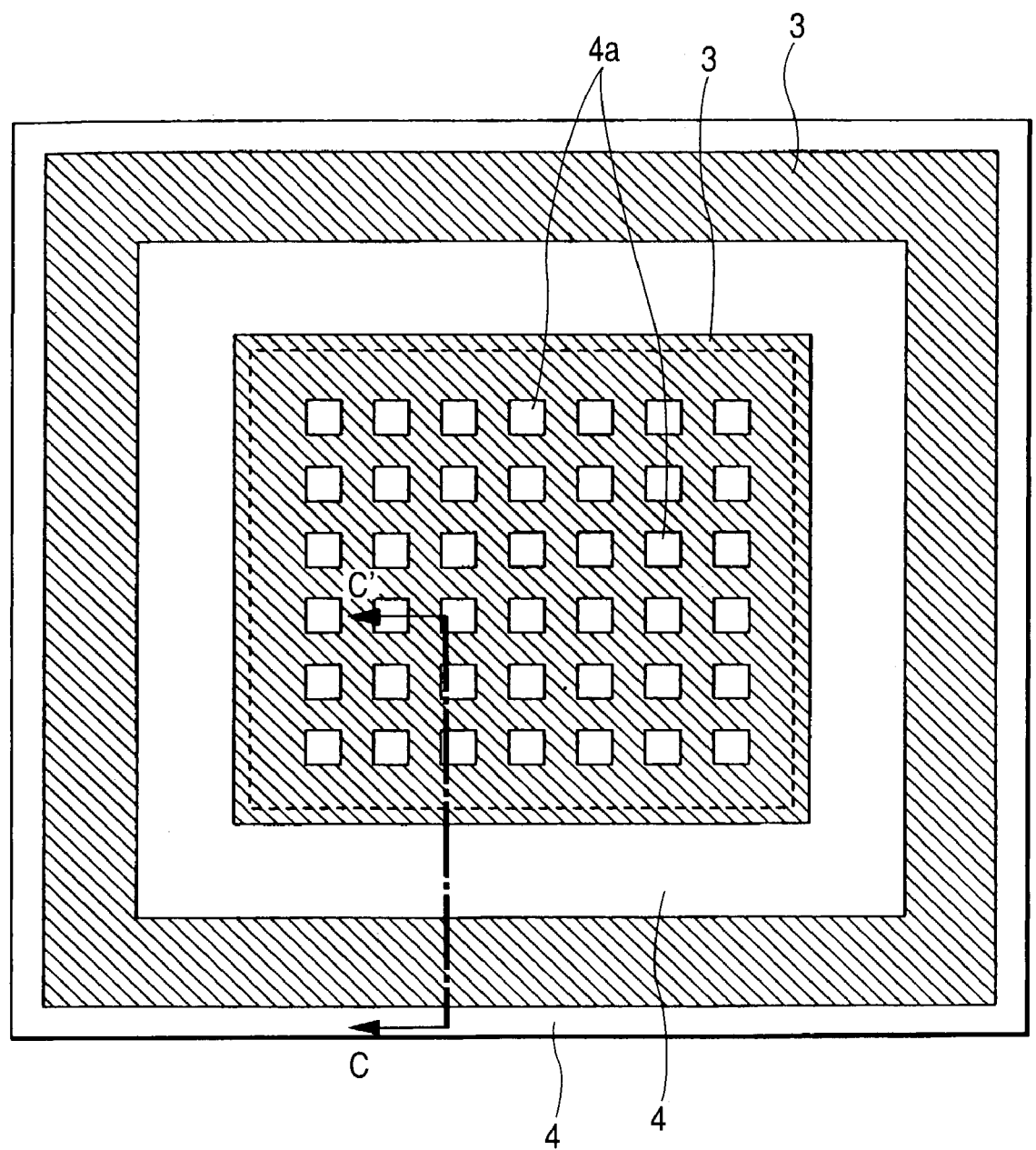
FIG. 8 is a plan view of the respective parts of the semiconductor device as it appears during a manufacturing step, showing an example of the capacitor formation trenches.

Then, as the overlying layer of the silicon oxide film 2, a silicon nitride film 3 with a thickness of about 130 to 150 nm is deposited as a protective layer by, for example, a CVD (Chemical Vapor Deposition) process. Then, as shown in FIG. 5, by using a resist pattern as a mask, the silicon nitride film 3, the silicon oxide film 2, and the semiconductor substrate 1 are sequentially dry etched, thereby to form element isolation trenches 4 in the semiconductor substrate 1. At this step, at least not less than one capacitor formation trench 4a also is formed in the capacitor formation region. The capacitor formation trenches 4a are formed as stripes, as shown in FIG. 6, in the form of holes, as shown in FIG. 7, or in a lattice form, as shown in FIG. 8. Namely, a plurality of the capacitor formation trenches 4a are formed in the shape of holes, stripes, or a lattice.

Thus, by forming the element isolation trenches 4 and the capacitor formation trenches 4a by the same step, it is possible to simplify the manufacturing process. Further, by forming at least not less than one capacitor formation trench 4a on the surface of the capacitor formation region, it is possible to improve the capacitor capacitance per unit area. The pattern of the capacitor formation trenches 4a is not limited to the shape of holes, stripes, or a matrix, but a pattern in any other shape may also be adopted, so that a change may be made thereto, unless it departs from the scope of the present invention.

Figure 9:
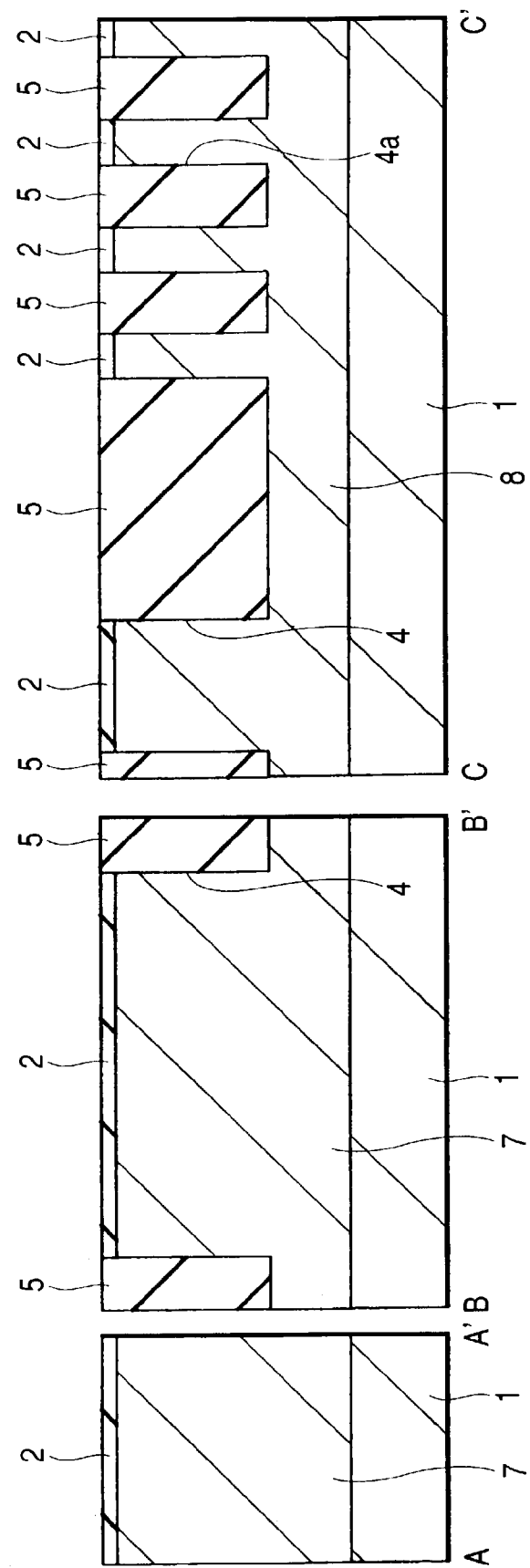
FIG. 9 is a cross sectional view of the respective parts of the semiconductor device as it appears during a manufacturing step subsequent to the step of FIG. 5.

Then, as shown in FIG. 9, on the semiconductor substrate 1, for example, the silicon oxide film 5 is deposited as an insulating film by a CVD process. Subsequently, the silicon oxide film 5 is polished by a chemical mechanical polishing (CMP) process, so that a part of the silicon oxide film 5 is left and embedded inside the element isolation trench 4, thereby to form the element isolation region. The silicon oxide film 5 is also similarly embedded inside each capacitor formation trench 4a.

Then, the silicon nitride film 3 is removed by using, for example, a hot phosphoric acid. Subsequently, a P-type impurity, such as boron (B), is ion implanted into the memory cell and the N-channel type MISFET formation region by an ion implantation process, thereby to form the P-type impurity layer (P-type well region) 7. Whereas, an N-type impurity, such as phosphorus (P) or arsenic (As), is ion implanted into the capacitors and a P-channel type MISFET formation region (not shown) by an ion implantation process, thereby to form the N-type impurity layer (N-type well region) 8.

Figure 10:
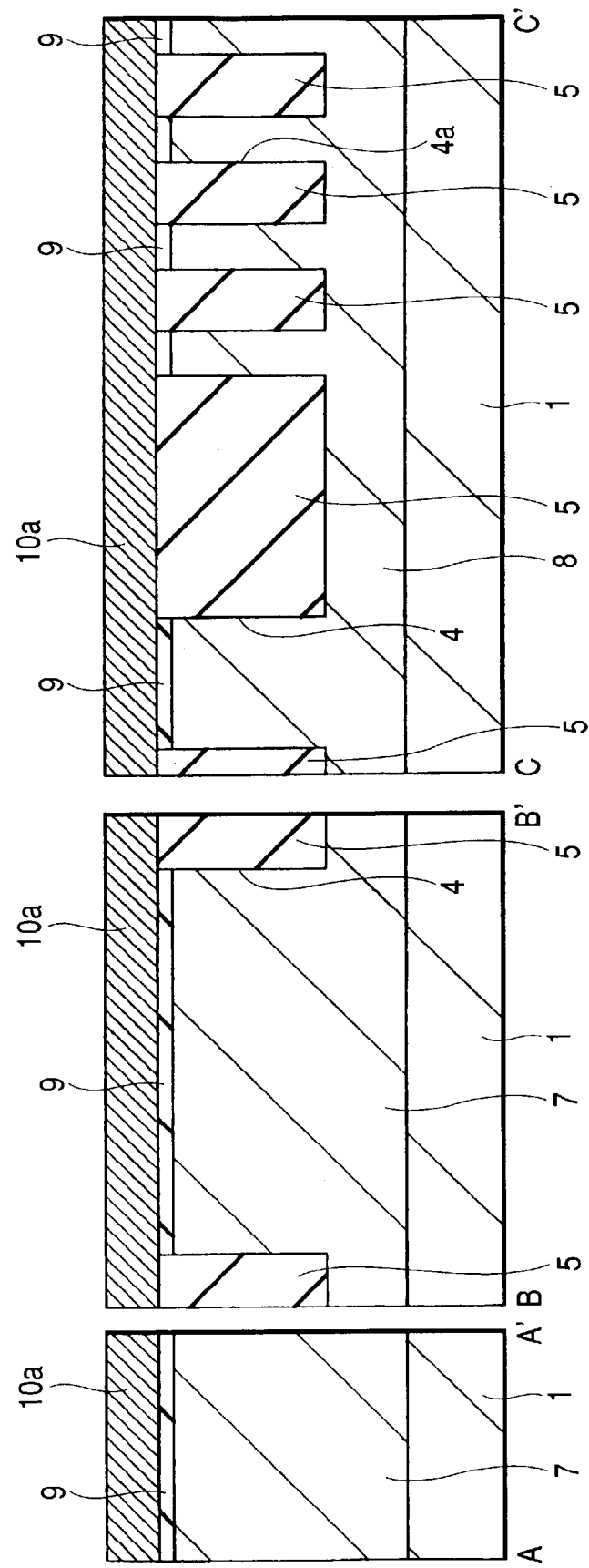
FIG. 10 is a cross sectional view of the respective parts of the semiconductor device as it appears during a manufacturing step subsequent to the step of FIG. 9.

Then, as shown in FIG. 10, for example, the semiconductor substrate 1 is thermally oxidized to form a silicon oxide film with a thickness of about 8 to 12 nm on the surface, thereby to form the memory tunnel insulating film (first memory gate insulating film) 9 of the memory cell. Subsequently, by a CVD process, a polysilicon layer 10a, which is to be the floating gate electrode (electric charge storage layer) 10 of the memory cell, is deposited on the entire surface of the semiconductor substrate 1.

Figure 11:
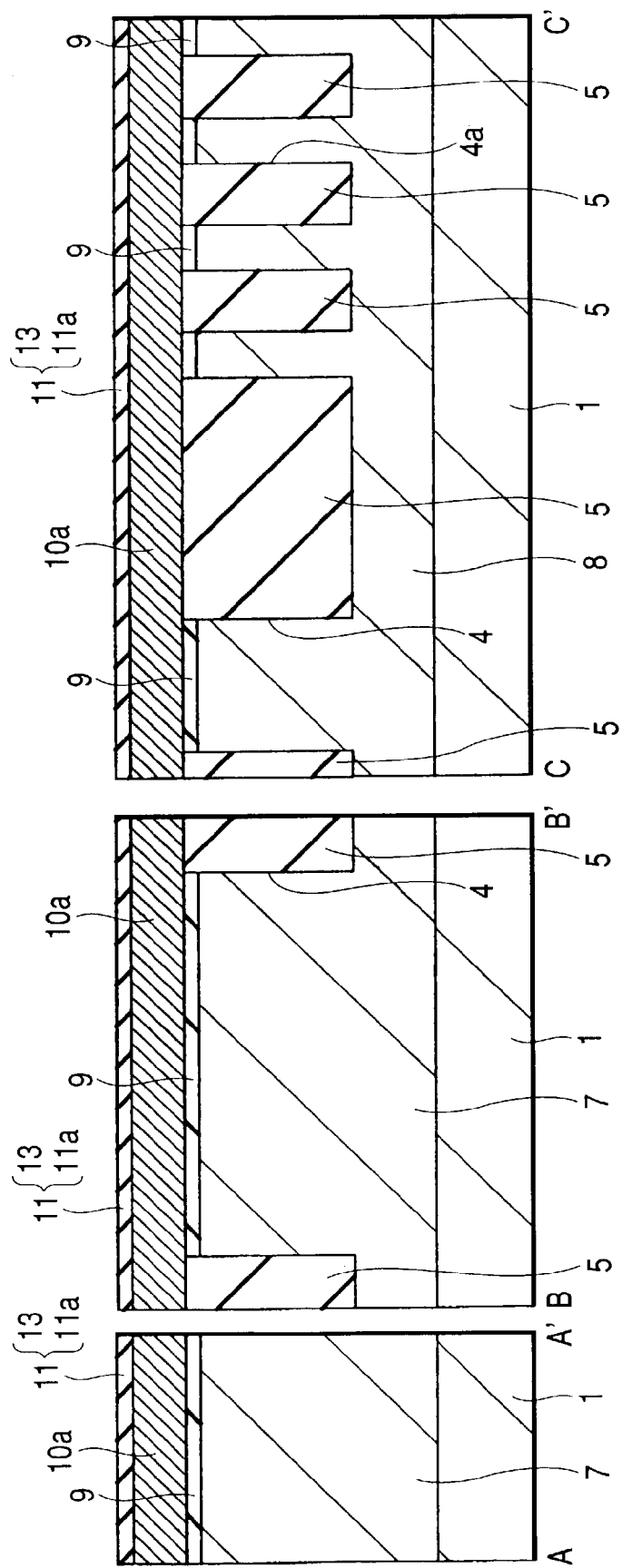
FIG. 11 is a cross sectional view of the respective parts of the semiconductor device as it appears during a manufacturing step subsequent to the step of FIG. 10.

Then, as shown in FIG. 11, a multilayer film 11a of a silicon oxide film and a silicon nitride film, serving as the memory gate interlayer film (second memory gate insulating film) of the memory cell, is formed on the entire surface of the polysilicon layer 10a. Further, on the multilayer film 11a, a silicon nitride film 13 is formed as a protective layer, thereby to form a memory gate interlayer film 11 (below, referred to as a NONO film 11) composed of the multilayer film 11a and the silicon nitride film 13. The NONO film 11 is formed by sequentially stacking a silicon oxide film with a thickness of about 2 to 6 nm, a silicon nitride film with a thickness of about 5 to 9 nm, and a silicon oxide film with a thickness of about 3 to 7 nm, and a silicon nitride film with a thickness of about 5 to 15 nm as a protective film by using, for example, a CVD process.

Figure 12:
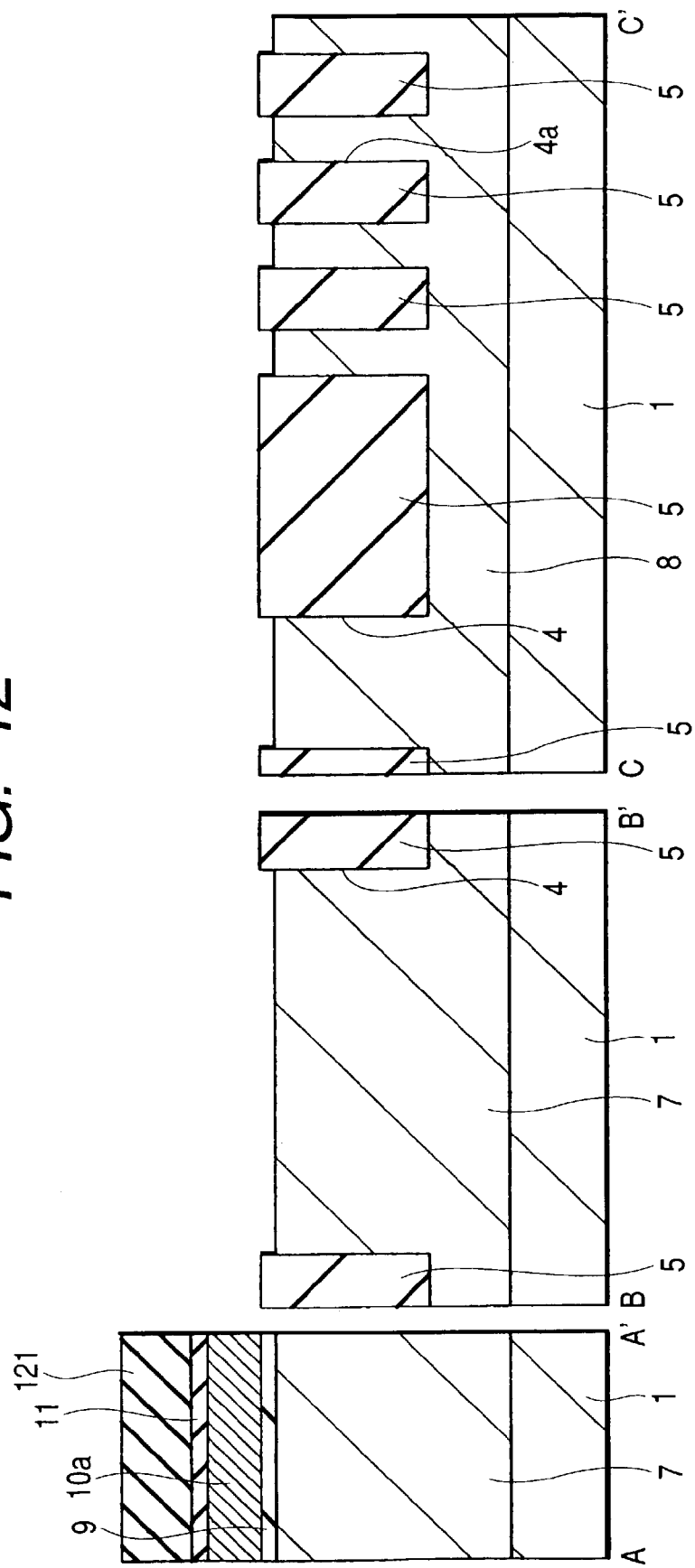
FIG. 12 is a cross sectional view of the respective parts of the semiconductor device as it appears during a manufacturing step subsequent to the step of FIG. 11.

Then, as shown in FIG. 12, the entire surface of the memory cell formation region is covered with a resist pattern 121. Thereafter, the NONO film 11, the polysilicon layer 10a, and the memory tunnel insulating film 9, that are formed on the entire surface of the MISFET formation region and on the entire surface of the capacitor formation region, are sequentially removed by, for example, dry etching.

Figure 13:
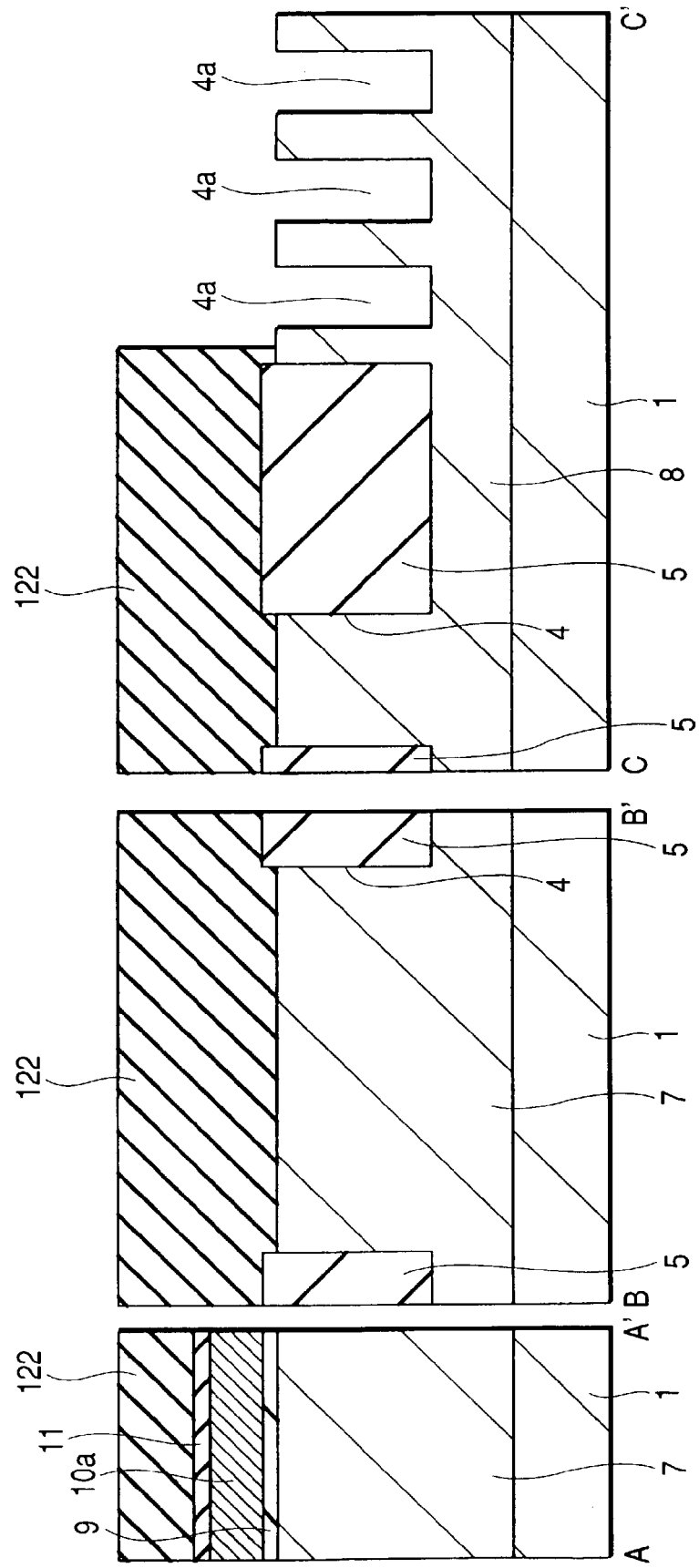
FIG. 13 is a cross sectional view of the respective parts of the semiconductor device as it appears during a manufacturing step subsequent to the step of FIG. 12.
Figure 14:
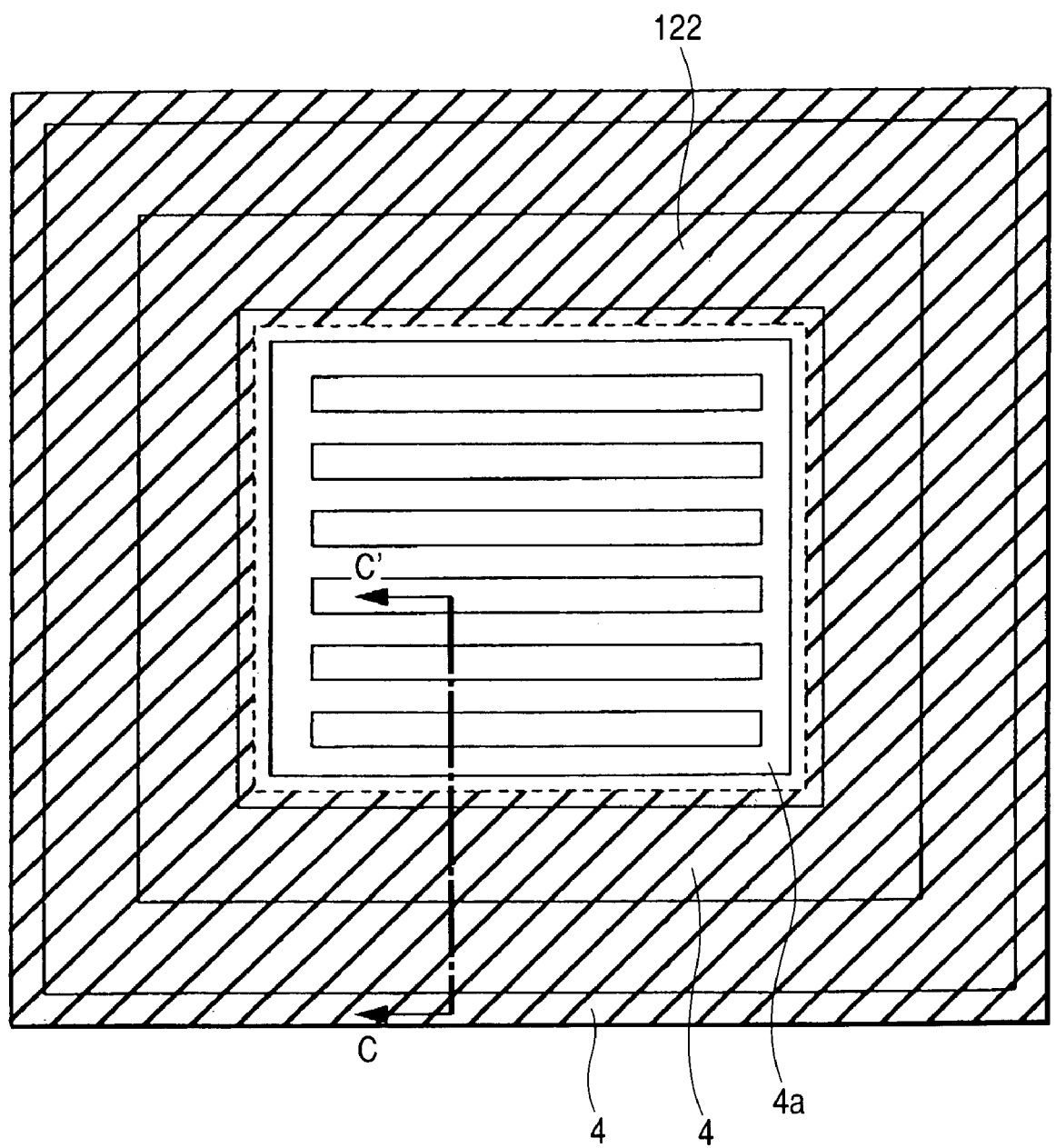
FIG. 14 is a plan view of the respective parts of the semiconductor device as it appears during a manufacturing step, showing a resist pattern used as a mask.

Then, as shown in FIG. 13, by using, as a mask, a resist pattern 122, which is formed in the plane pattern shown in FIG. 14, on the entire surface of the memory cell formation region and on the entire surface of the MISFET formation region, the silicon oxide film 5 embedded in the capacitor formation trenches 4a of the capacitor is selectively removed by, for example, dry etching.

Then, the gate insulating film of the MISFETs is formed. Herein, the gate insulating film used for the MISFETs and the capacitor dielectric film used for the capacitors are formed of a dielectric film of the same layer. Namely, the gate insulating film used for the MISFETs and the capacitor dielectric film used for the capacitors are formed by the same step. In this embodiment, as for the example of the case where the high-voltage gate insulating film and the low-voltage insulating film are formed differently in the same manufacturing process, a description will be given for (a) the case where the step of forming the capacitor dielectric film and the step of forming the high-voltage gate insulating film are the same step; and (b) the case where the step of forming the capacitor dielectric film and the step of forming the low-voltage gate insulating film are the same step.

Figure 15:
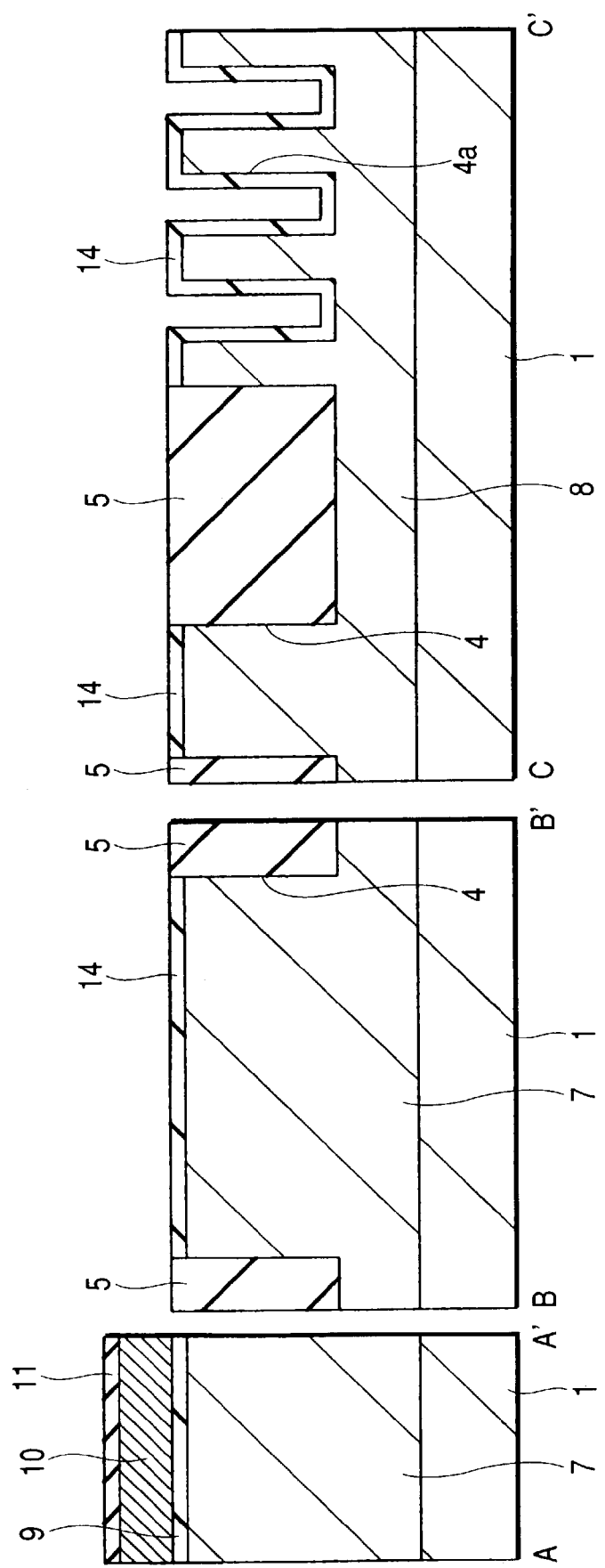
FIG. 15 is a cross sectional view of the respective parts of the semiconductor device as it appears during a manufacturing step subsequent to the step of FIG. 13.

(a) As shown in FIG. 15, for example, the semiconductor substrate 1 is thermally oxidized, thereby to form a silicon oxide film 14 with a thickness of about 12 to 16 nm, which is to be the high-voltage gate insulating film of the MISFETs and the dielectric film of the capacitors on the MISFET formation region and the capacitor formation region including the capacitor formation trenches 4a.

Figure 16:
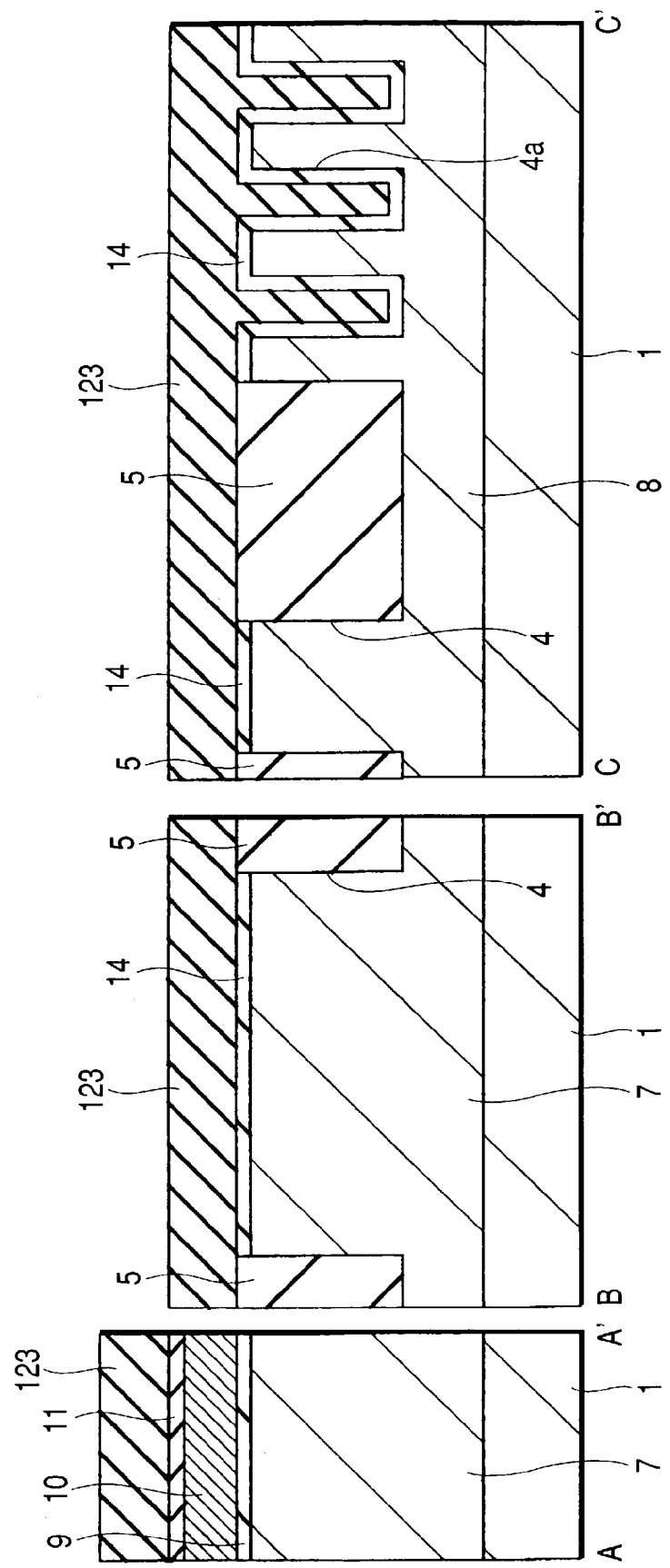
FIG. 16 is a cross sectional view of the respective parts of the semiconductor device as it appears during a manufacturing step subsequent to the step of FIG. 15.
Figure 17:
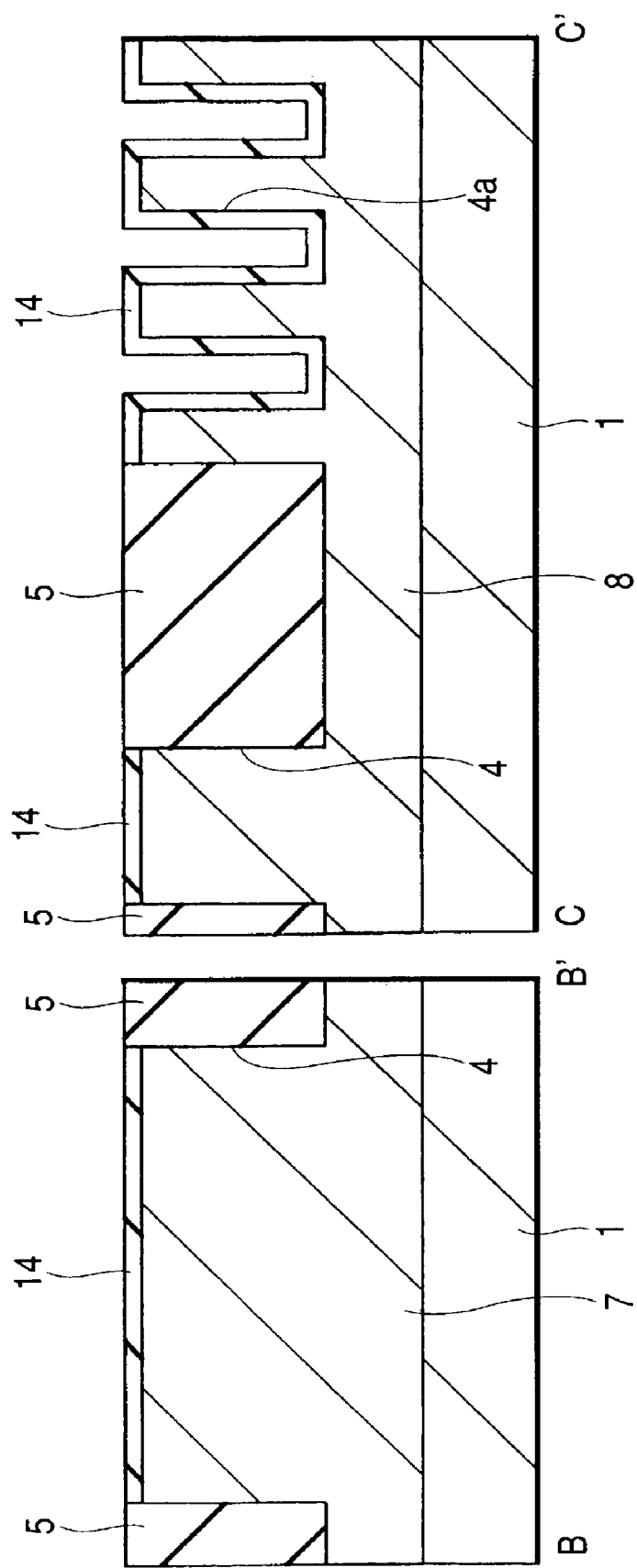
FIG. 17 is a cross sectional view of the respective parts of the semiconductor device as it appears during a manufacturing step.

(b) As shown in FIGS. 16 and 17, a resist pattern 123 is formed on the entire surface of the memory cell formation region and on the entire surface of the region where the high-voltage gate insulating film is used out of the MISFET formation region and the capacitor formation region. Namely, the resist pattern 123 is formed in such a manner as to expose the entire surface of the region where the low-voltage gate insulating film is used out of the MISFET formation region and the capacitor formation region.

Figure 18:
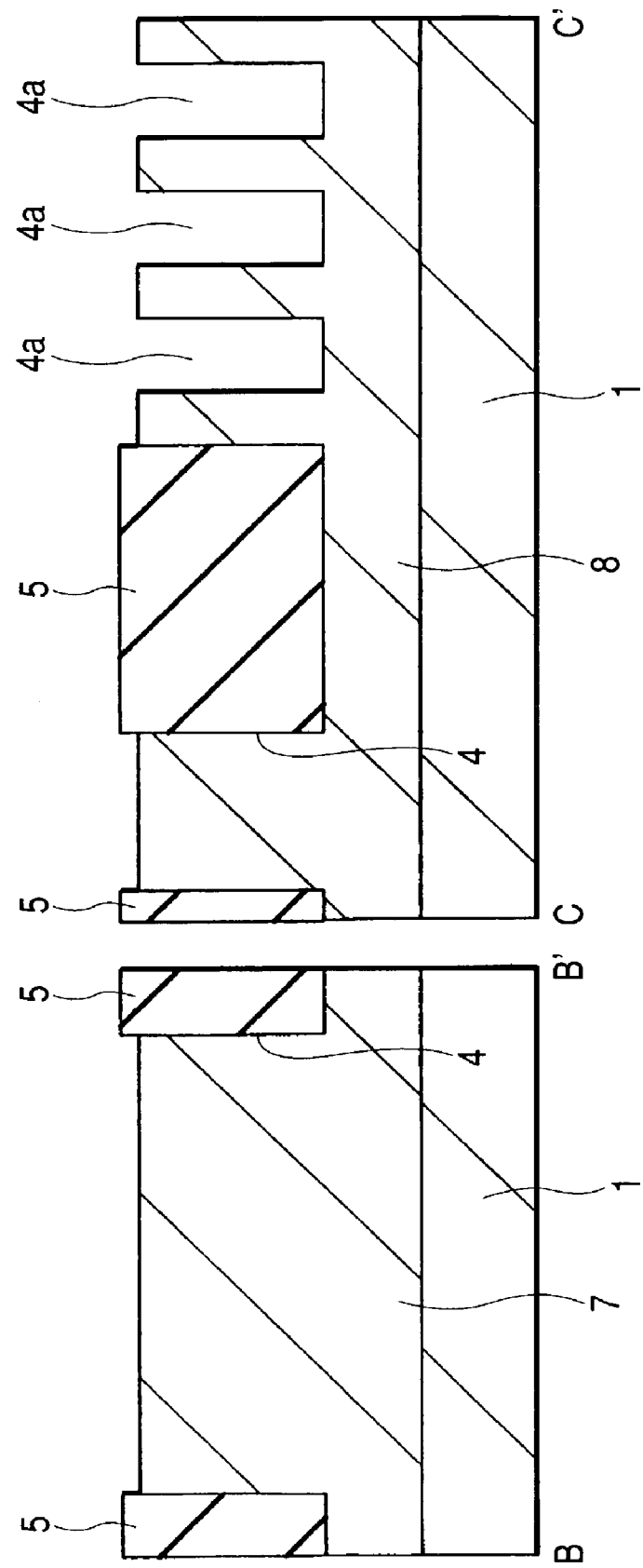
FIG. 18 is a cross sectional view of the respective parts of the semiconductor device as it appears during a manufacturing step subsequent to the step of FIG. 17.

Then, as shown in FIG. 18, the portion of the silicon oxide film 14, which is formed on the region where the low-voltage gate insulating film is used in the MISFETs and the capacitors, is removed by, for example, dry etching.

Figure 19:
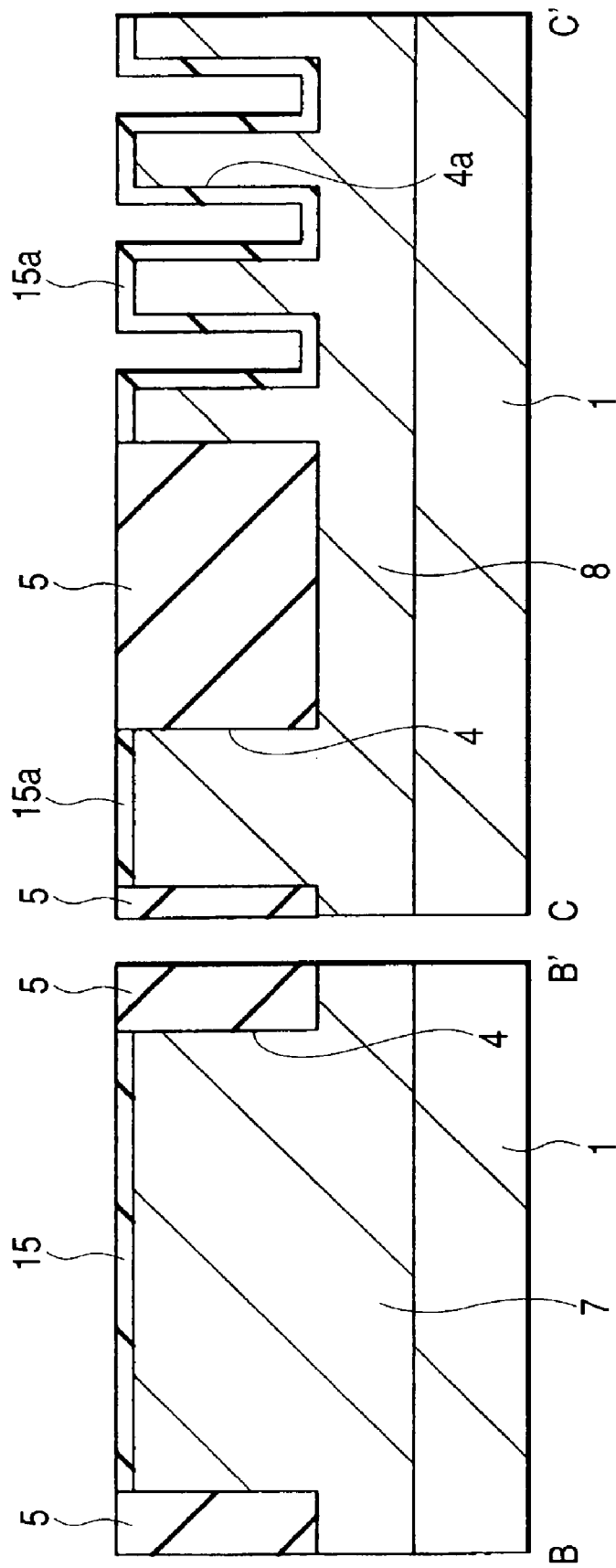
FIG. 19 is a cross sectional view of the respective parts of the semiconductor device as it appears during a manufacturing step subsequent to the step of FIG. 18.

Then, as shown in FIG. 19, after removing the resist pattern 123, for example, the semiconductor substrate 1 is thermally oxidized. As a result, a silicon oxide film with a thickness of about 4 to 8 nm, which is to serve as the low-voltage insulating film of the MISFETs and the capacitors, is deposited, thereby to form the low-voltage gate insulating film 15 and the dielectric film 15a.

Figure 20:
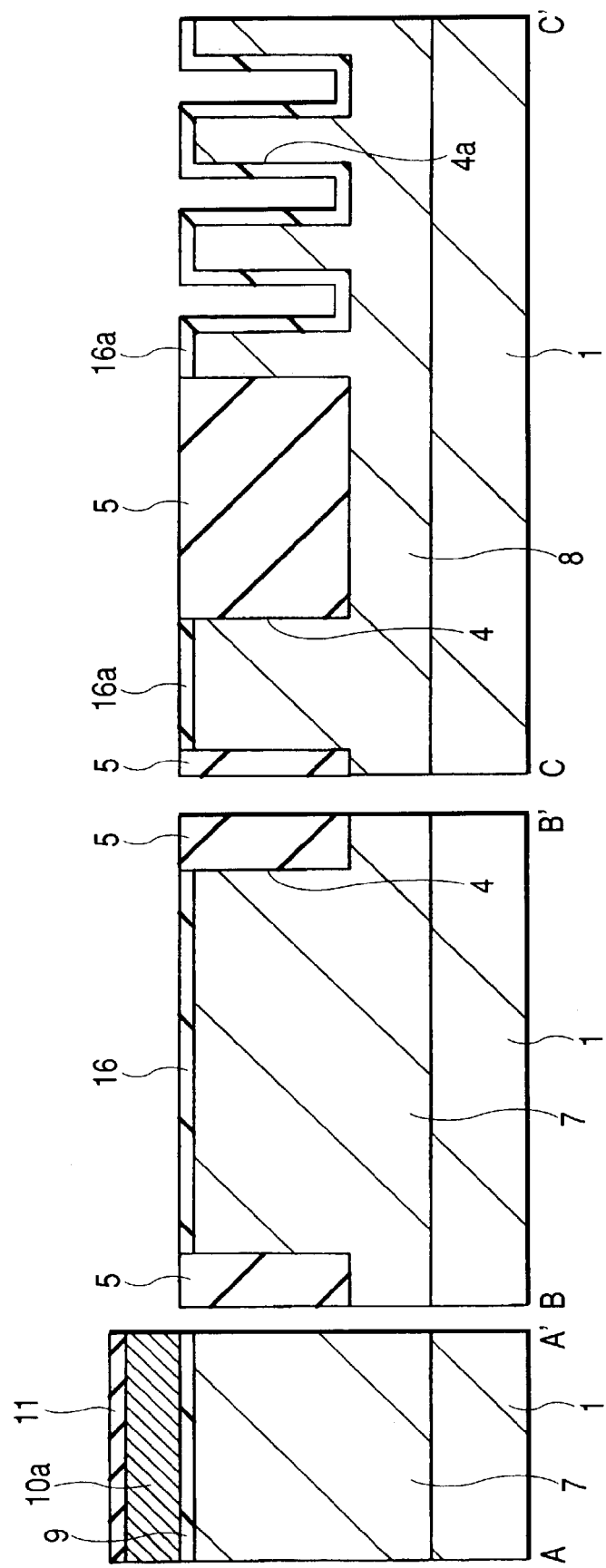
FIG. 20 is a cross sectional view of the respective parts of the semiconductor device as it appears during a manufacturing step subsequent to the step of FIG. 16.

Incidentally, as shown in FIG. 20, due to the thermal oxidation, the portion of the silicon oxide film 14 on the region where the high-voltage gate insulating film is used in the MISFETs and the capacitors is oxidized, resulting in formation of the high-voltage gate insulating film 16 and the dielectric film 16a with a thickness of about 15 to 20 nm. Namely, on the region where the high-voltage gate insulating film is used in the MISFET formation region and the capacitor formation region, the high-voltage gate insulating film 16 is formed.

On the other hand, as shown in FIG. 19, in the region where the low-voltage gate insulating film is used in the MISFET formation region and the capacitor formation region, the low-voltage gate insulating film 15 is formed. The silicon oxide film which is to be the low-voltage gate insulating film 15 functions as the low-voltage gate insulating film of the MISFETs and the capacitor dielectric film of the capacitors.

In this embodiment 1, the subsequent steps will be described mainly based for the case where the capacitor dielectric film is the same film as (a) the high-voltage gate insulating film. However, also in the case where (b) the low-voltage gate insulating film is described, the subsequent manufacturing process will be carried out in accordance with the same procedure. Therefore, a description thereof, except for a part, is omitted.

Figure 21:
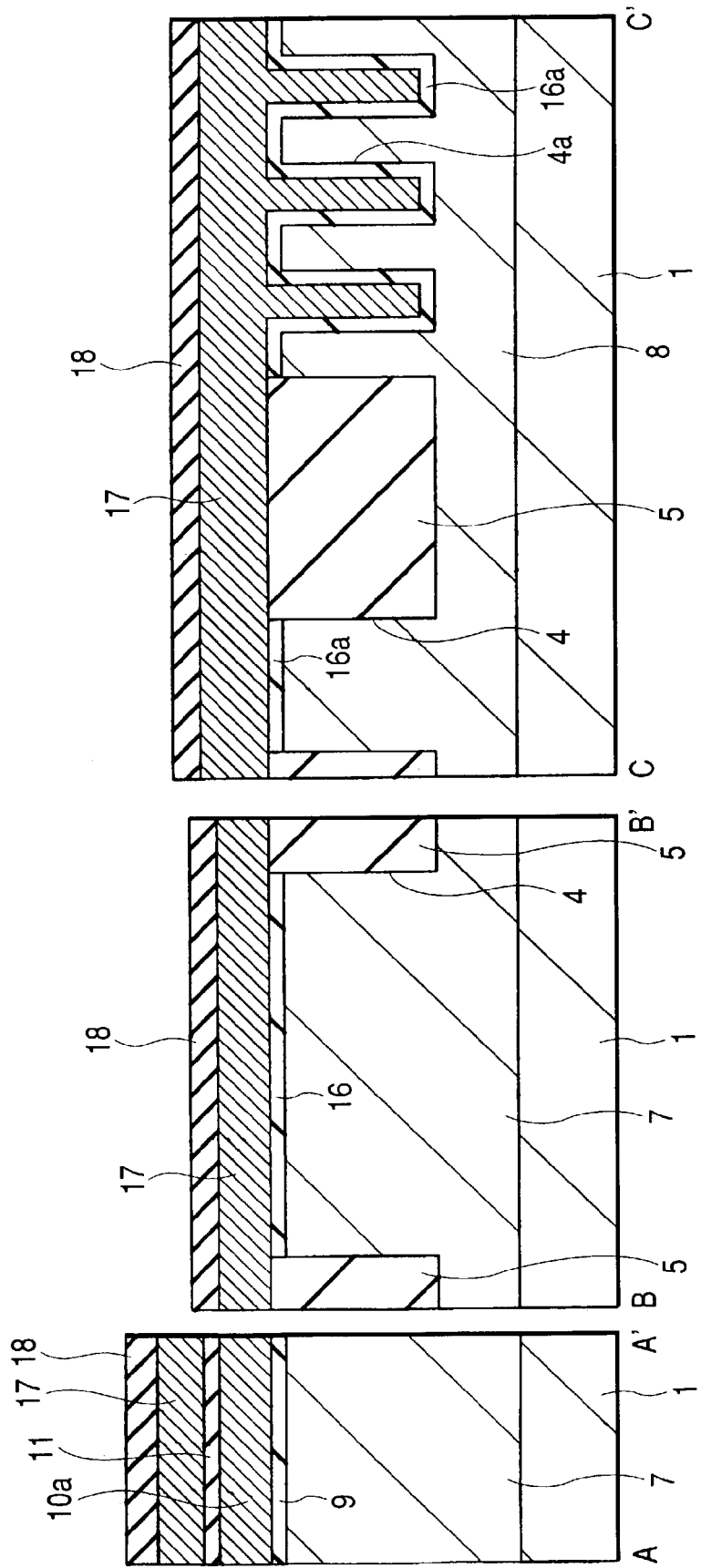
FIG. 21 is a cross sectional view of the respective parts of the semiconductor device as it appears during a manufacturing step subsequent to the step of FIG. 20.

Then, as shown in FIG. 21, on the NONO film 11 formed on the memory cell, and on the low-voltage gate insulating film 15 and the high-voltage gate insulating film 16 formed on the MISFETs and the capacitors, a polysilicon layer 17, which is to be, for example, the control gate electrode (memory gate electrode) 17a (see FIG. 2) of the memory cell, is formed. Subsequently, on the polysilicon layer 17, for example, a silicon oxide film 18 is deposited as an insulating film to serve as a cap layer of the memory cell by a CVD process.

Figure 22:
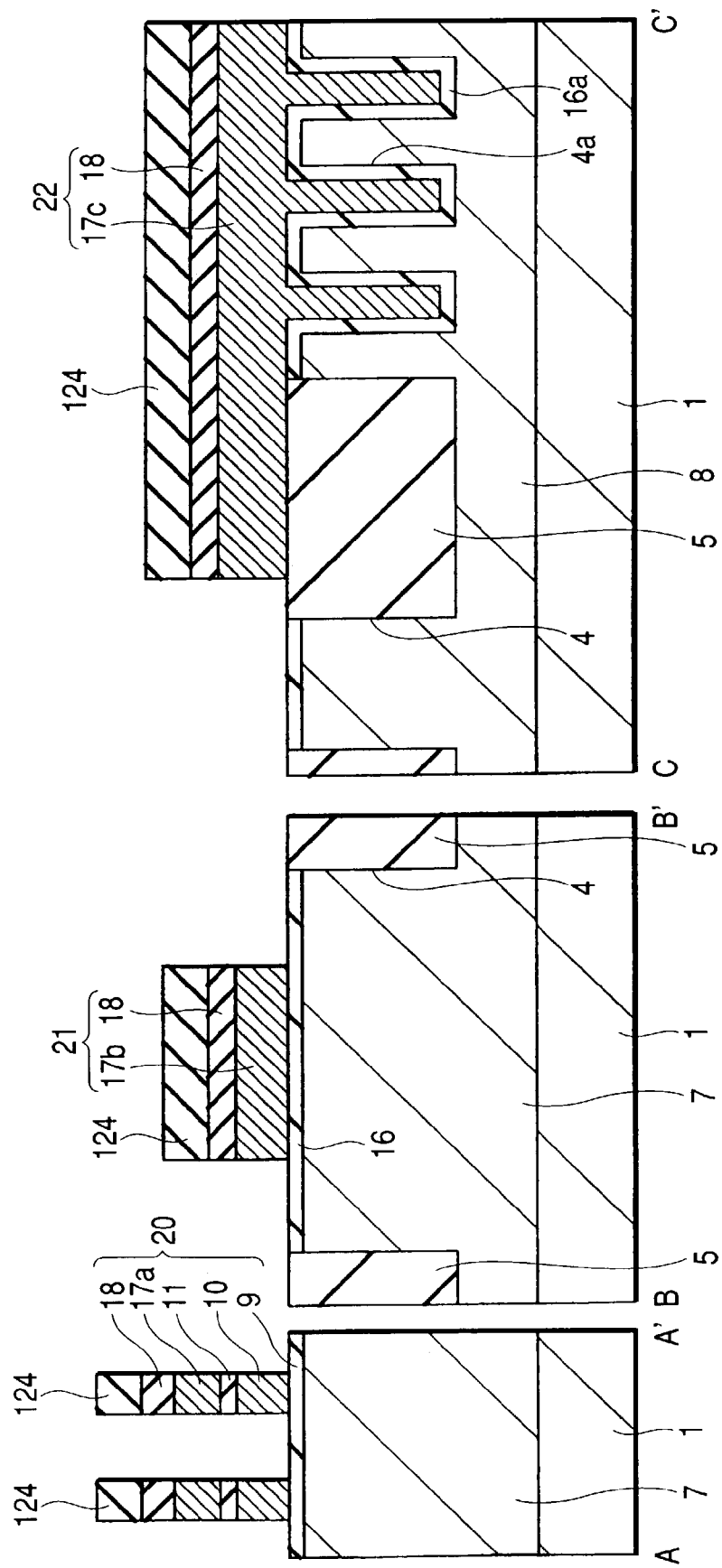
FIG. 22 is a cross sectional view of the respective parts of the semiconductor device as it appears during a manufacturing step subsequent to the step of FIG. 21.

Then, as shown in FIG. 22, a resist pattern 124 is formed on the silicon oxide film 18, so that the silicon oxide film 18, the polysilicon layer 17, the NONO film 11, and the polysilicon layer 10a are dry etched. As a result, the control gate electrode (memory gate electrode) 17a and the floating gate electrode (electric charge storage layer) 10 of the memory cell, the gate electrode 17b of each of the high-voltage and low-voltage MISFETs, and the capacitor electrode 17a of each capacitor are formed. By the steps up to this point, it is possible to form the memory gate electrode structure 20 composed of the memory tunnel insulating film 9, the floating gate electrode 10, the memory gate interlayer film 11, the control gate electrode 17a, and the silicon oxide film 18.

Incidentally, the control gate electrode (memory gate electrode) 17a of the memory cell may also be configured in a polycide structure in which a silicide film, such as a cobalt silicide (CoSi) film, is formed on the polysilicon layer.

Figure 23:
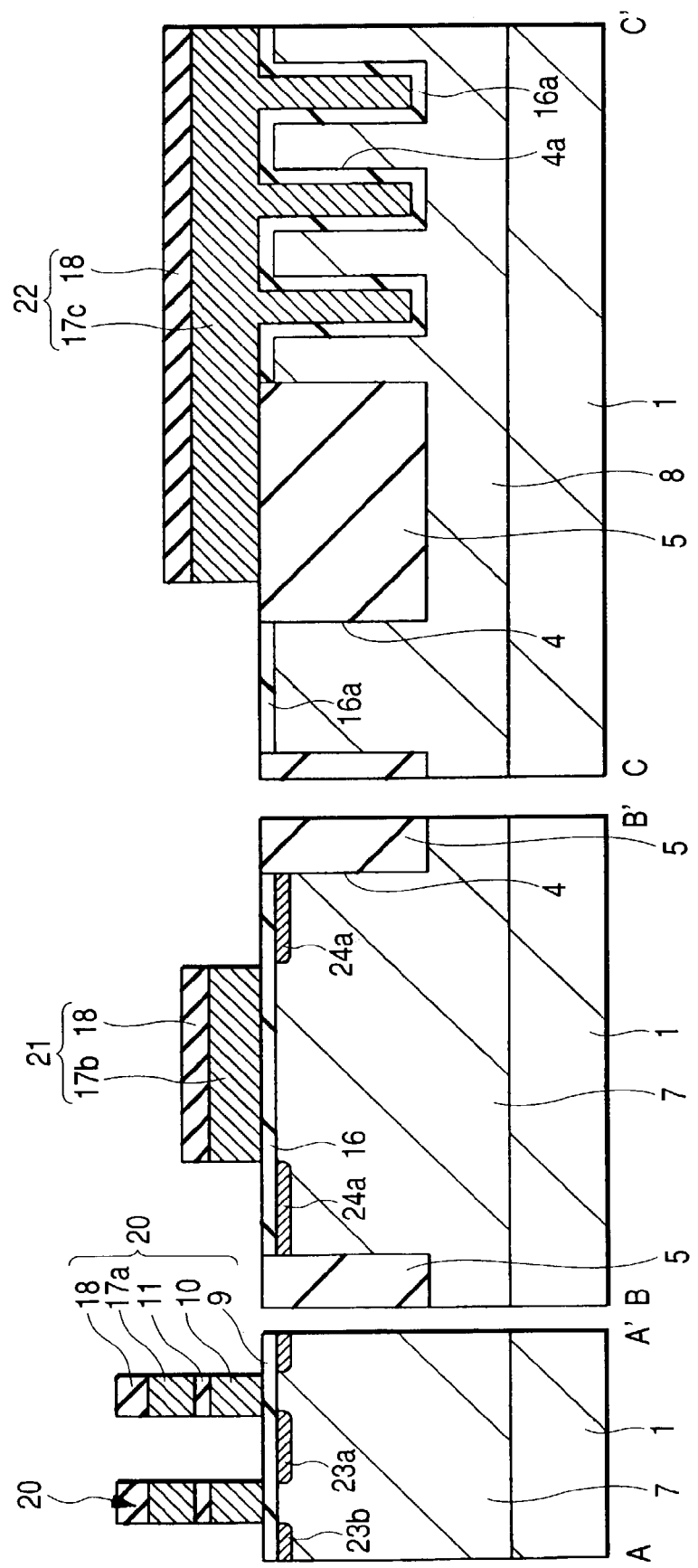
FIG. 23 is a cross sectional view of the respective parts of the semiconductor device as it appears during a manufacturing step subsequent to the step of FIG. 22.

Then, as shown in FIG. 23, after covering the entire surface of the MISFET formation region and the capacitor formation region with a resist, for example, an N-type impurity, such as arsenic (As), is ion-injected into the memory cell formation region in a self-aligned manner with respect to the memory gate electrode structure 20 by an ion implantation process. As a result, the N-type impurity layers 23a and 23b, which are to serve as source/drain regions of the memory cell, are formed. Subsequently, after covering the entire surface of the memory cell formation region and the capacitor formation region with a resist, for example, an N-type impurity, such as phosphorus (P), is ion-injected into the MISFET formation region in a self-aligned manner with respect to the gate electrode portion 21 by an ion implantation process. As a result, the N-type impurity layer 24a, which is to serve as a source/drain region of the MISFET, is formed.

Whereas, when the gate insulating film of the MISFET is the low-voltage gate insulating film 15, arsenic (As) ions are injected by an implantation process to form the N-type impurity layer 24b (see FIG. 3).

Figure 24:
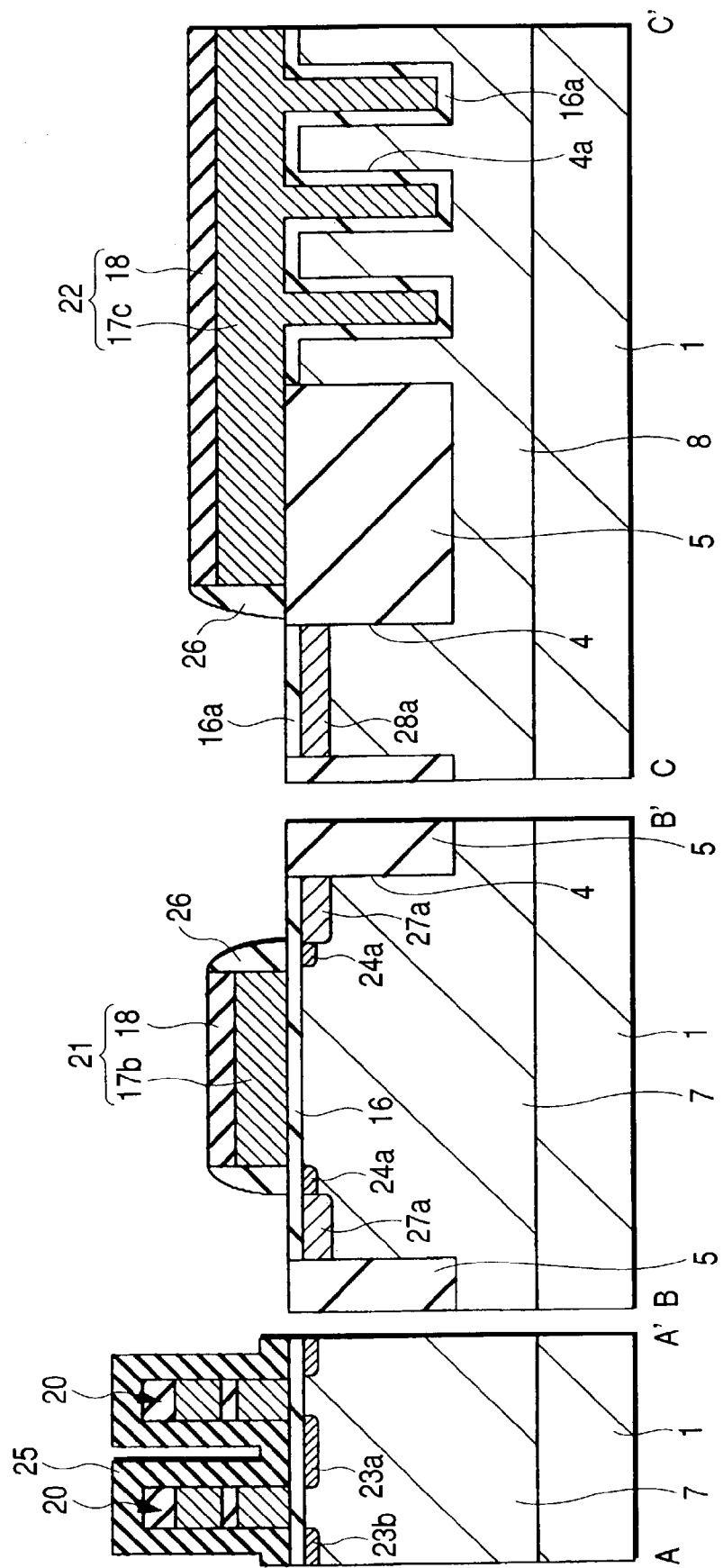
FIG. 24 is a cross sectional view of the respective parts of the semiconductor device as it appears during a manufacturing step subsequent to the step of FIG. 23.

Then, as shown in FIG. 24, on the main surface, i.e., the entire surface of the memory cell formation region, the MISFET formation region, and the capacitor formation region, a silicon nitride film 25 with a thickness of about 110 to 150 nm is deposited by, for example, a CVD process. Subsequently, after covering the entire surface of the memory cell formation region with a resist, the silicon nitride film 25 on the MISFET formation region and the capacitor formation region is anisotropically dry etched. As a result, the sidewalls 26 are formed on the sidewalls of the gate electrode of the MISFET and the capacitor electrode.

Then, an N-type impurity, such as arsenic (As), is ion-injected in a self-aligned manner with respect to the gate electrode portion 21 of the MISFET, the capacitor upper electrode portion 22, and the sidewalls 26. As a result, the N-type impurity layer 27a, which is to serve as the source/drain regions of the MISFET, and the N-type impurity region 28a, which is to serve as a diffusion layer of the lower electrode extracting portion of the capacitor, are formed.

Then, on the main surface, i.e., on the entire surface of the memory cell formation region, the MISFET and capacitor formation regions, for example, a silicon oxide film (see FIGS. 2 and 3) is deposited as an interlayer insulating film 29 by a CVD process. Then, the surface is planarized by a CMP process.

Then, after covering the entire surface of the MISFET formation region and the capacitor formation region with a resist, the interlayer insulating film 29 is subjected to patterning. As a result, a connecting hole CONT1 (see FIG. 2) reaching the N-type impurity layers 23a and 23b of the memory cell formation region is formed in the interlayer insulating film 29.

Figure 25:
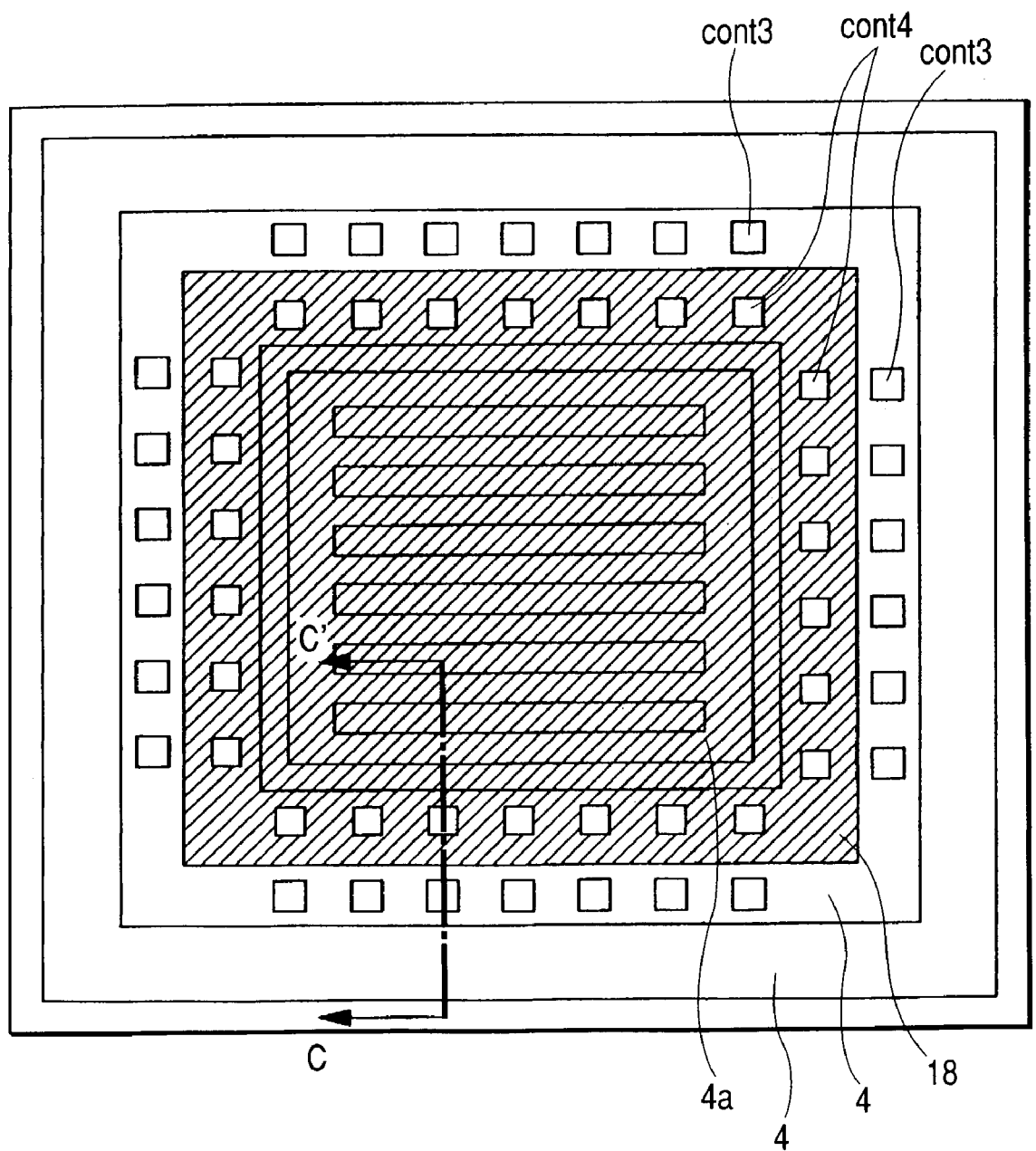
FIG. 25 is a plan view of the respective parts of the semiconductor device as it appears during a manufacturing step, showing a resist cover.
Figure 26:
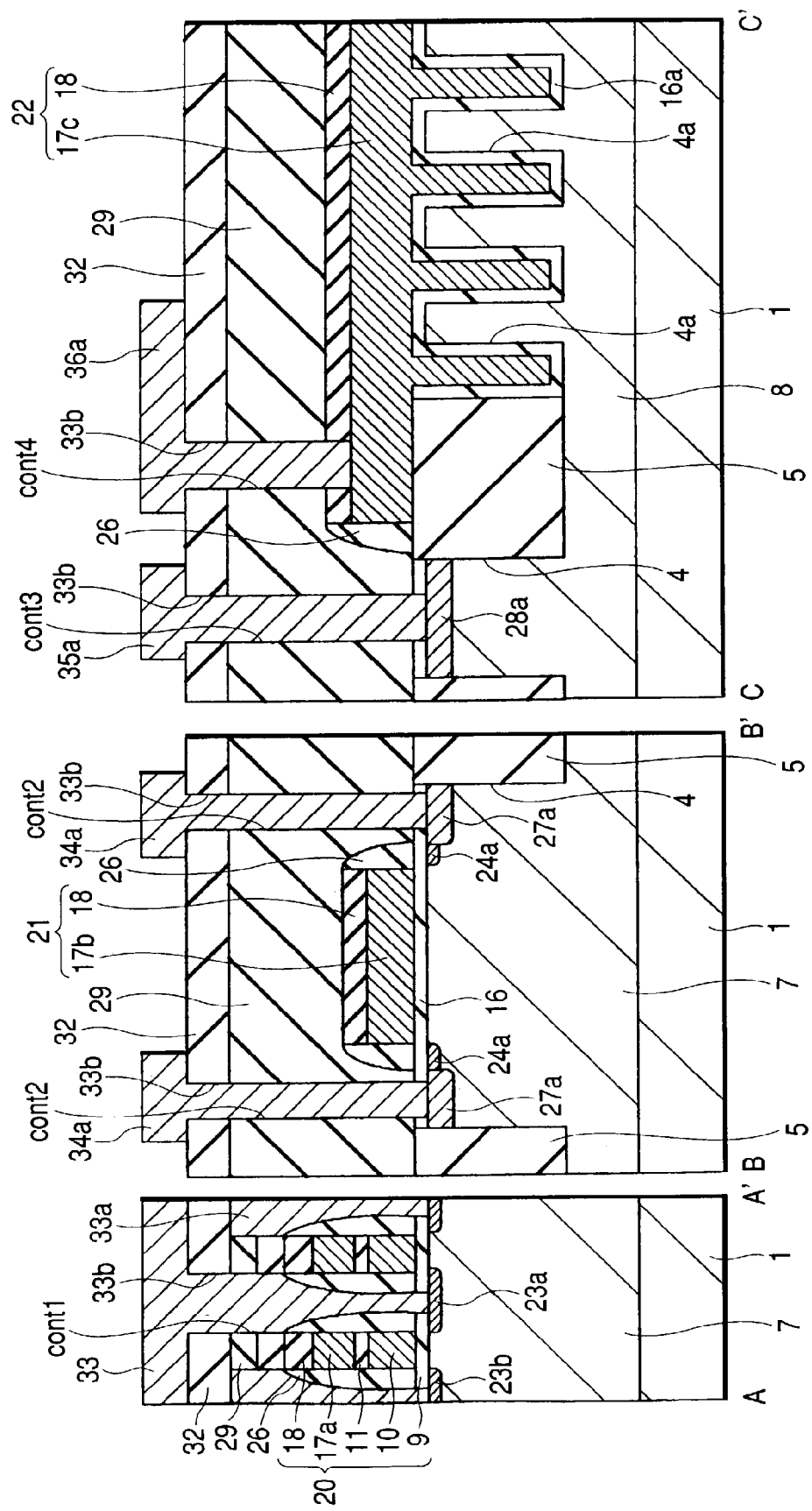
FIG. 26 is a cross sectional view of the respective parts of a semiconductor device representing an Embodiment 2 of the present invention.

Then, as shown in FIG. 25, after covering the entire surface of the memory cell formation region with a resist cover, the interlayer insulating film 29 is subjected to patterning. As a result, a connecting hole CONT2 (see FIGS. 2 and 3) exposing the N-type impurity layers 24a and 27a of the MISFET formation region, a connecting hole CONT3 (see FIGS. 2 and 3) reaching the N-type impurity layer 28a of the lower electrode extracting portion of the capacitor, and a connecting hole CONT4 (see FIGS. 2 and 3) reaching the capacitor upper electrode structure 22 are formed.

Then, on the interlayer insulating film 29, including the connecting holes CONT1 to CONT4, for example, a TiN film is deposited by using a sputtering process. Subsequently, a W film is deposited on the TiN film by using a CVD process, so that the connecting holes CONT1 to CONT4 are filled with the W film. Then, the W film and the TiN film on the interlayer insulating film 29 are removed by a CMP process, so that the portions of the W film and the TiN film are left in the connecting holes CONT1 to CONT4. Thus, a plug composed of the W film and the TiN film is formed.

Then, on the interlayer insulating film 29 and the plug layer 33a, an interlayer insulating film 32 (see FIGS. 2 and 3) composed of a silicon oxide film is deposited by, for example, a CVD process. Subsequently, after forming a lead wire hole 33b (see FIGS. 2 and 3) to the plug layer 33a, for example, a W film is embedded in the lead wire hole 33b by a sputtering process. The W film is etched back, thereby to form the wiring layer 33 (see FIG. 2) for ensuring an electrical connection to the N-type impurity layers 23a and 24b formed in the capacitor, a wiring layer 34a (see FIG. 2) for ensuring an electrical connection to the N-type impurity layers 24a and 27a formed in the high-voltage MISFET, a wiring layer 34b (see FIG. 3) for ensuring an electrical connection to the N-type impurity layers 24b and 27b formed in the low-voltage MISFET, a wiring layer 35a (see FIG. 2) and a wiring layer 35b (see FIG. 3) for ensuring an electrical connection to the N-type impurity layers 28a and 28b formed in the capacitors, respectively, and the wiring layer 36a (see FIG. 2) and the wiring layer 36b (see FIG. 3) for ensuring an electrical connection to each capacitor upper electrode 17c.

It is possible to form the configuration shown in FIG. 2 based on the foregoing embodiment. Whereas, the diagram for the case where the low-voltage gate insulating films are used as the gate insulating film of the MISFET and the capacitor dielectric film of the capacitor is as shown in FIG. 3.

In accordance with such an embodiment 1, it is possible to form the element isolation trench 4 and the capacitor formation trenches 4a by the same step. Further, it is possible to form the high-voltage gate insulating film 16 or the low-voltage gate insulating film 15 of the MISFET by the same step as the step of forming the dielectric film 16a or the dielectric film 15a of the capacitor. Namely, the high-voltage gate insulating film 16 or the low-voltage gate insulating film 15 and the insulating film used for forming the dielectric film 16a or the dielectric film 15a of the capacitor are formed by the same step. Whereas, it is possible to form the gate electrode 17b of the MISFET and the capacitor electrode 17c by the same step. Namely, the gate electrode 17b of the MISFET and the conductive film used for forming the capacitor electrode 17c are formed by the same step. This can simplify the manufacturing process of the semiconductor device of this embodiment 1.

Embodiment 2

The configuration of the essential parts of a semiconductor device of embodiment 2 of the present invention is shown in FIG. 25.

In the foregoing embodiment 1, as shown in FIG. 9, in the step of removing the silicon oxide film 5 that is embedded in the capacitor formation trenches 4a, the mask as shown in FIG. 14 was used as a resist pattern. However, in this embodiment 2, a part of the element isolation trench 4 may also be used as a part of the capacitor formation region by performing patterning by using the mask shown in FIGS. 27 and 28.

Incidentally, for convenience in the description, a description of the same part in the following process as was used in the foregoing embodiment 1 will be omitted.

Figure 27:
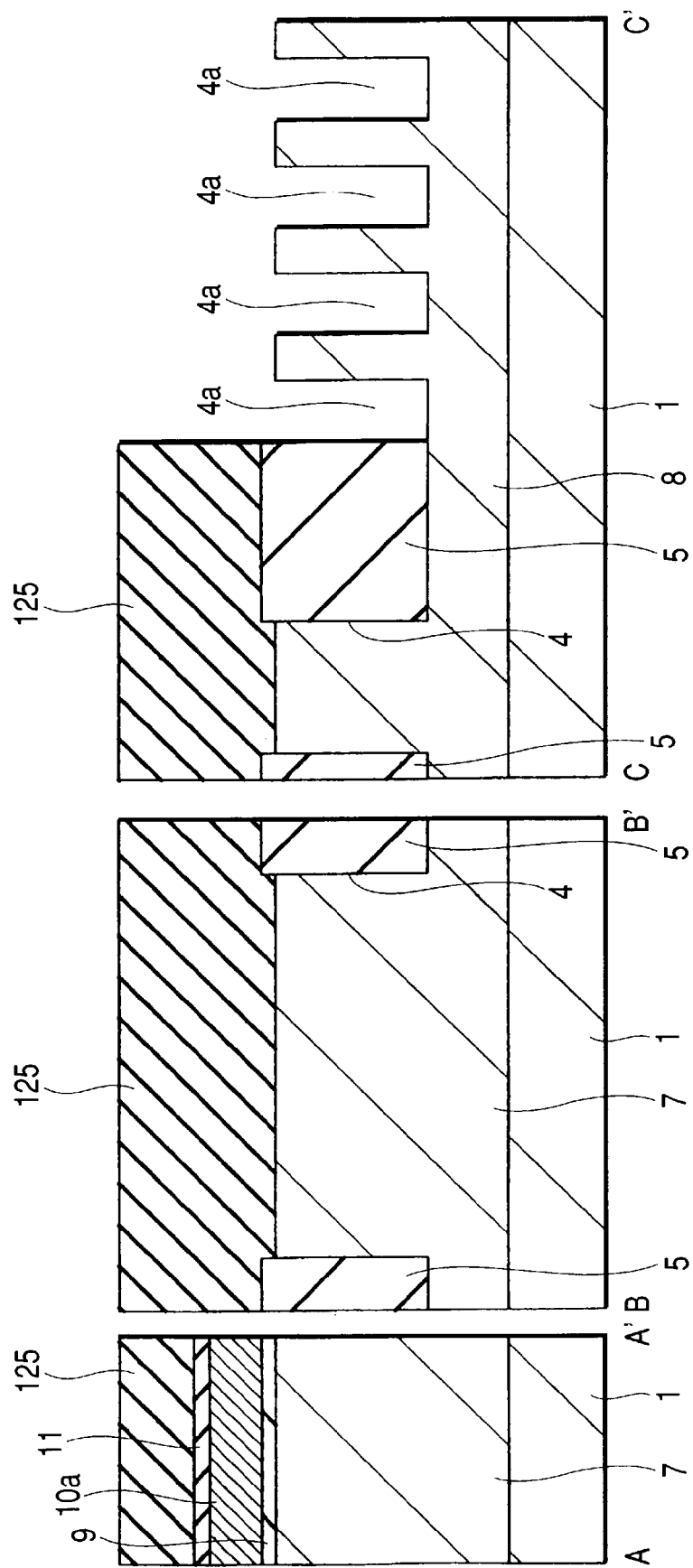
FIG. 27 is a cross sectional view of the respective parts of the semiconductor device representing Embodiment 2 of the present invention, during a step in the manufacturing process thereof.
Figure 28:
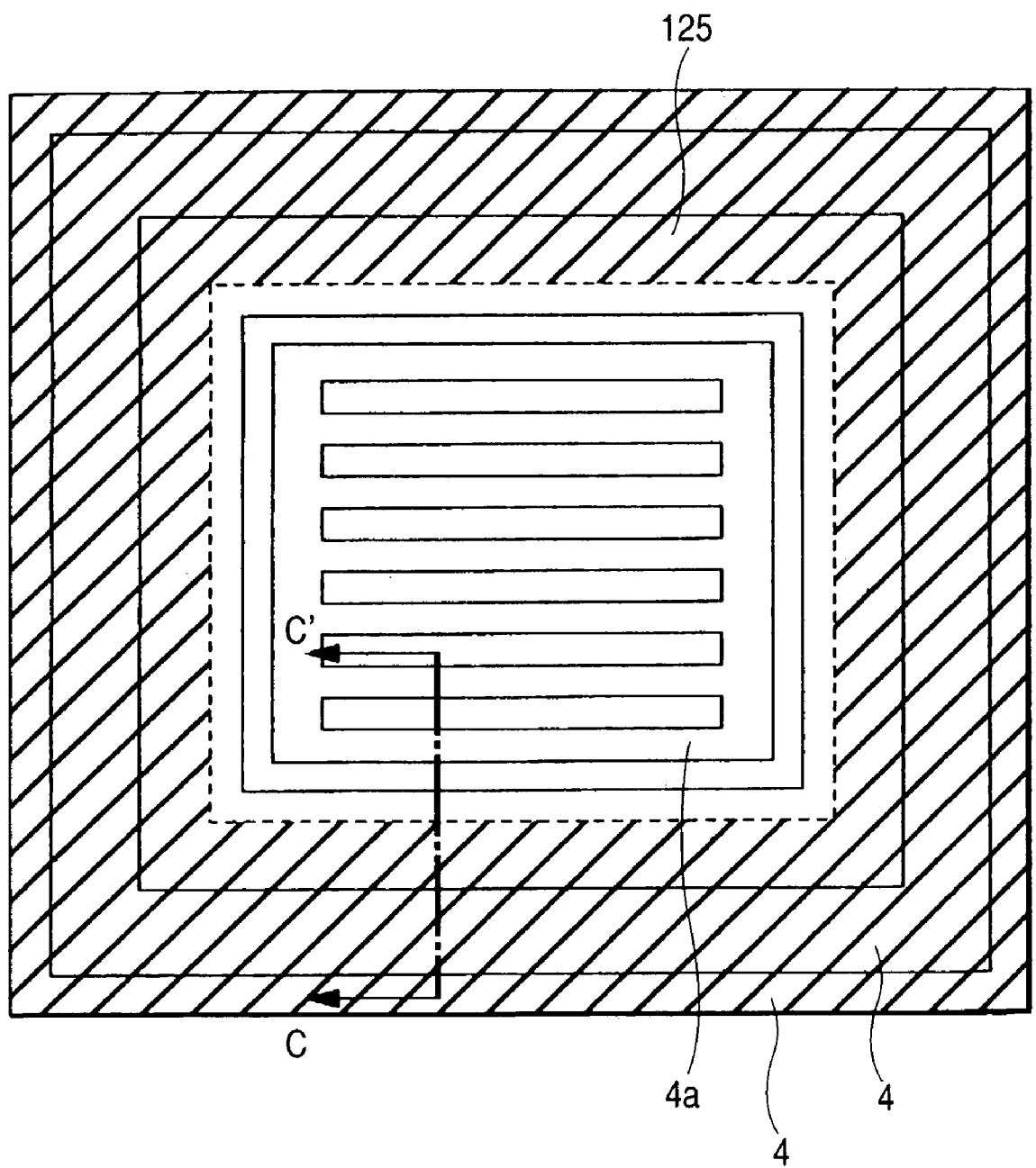
FIG. 28 is a plan view of the respective parts of the semiconductor device as it appears during a manufacturing step, showing a resist pattern.

First, after the step shown in FIG. 12 in the foregoing embodiment 1, a resist pattern 125, as shown in FIGS. 27 and 28, is formed on the silicon oxide film 5, that is embedded in the element isolation trench 4 (see FIG. 12), and in at least not less than one capacitor formation trench 4a. Then, dry etching is performed by using the resist pattern 125 as a mask, thereby to remove the portions of the silicon oxide film 5 embedded in the capacitor formation trench 4a and a part of the element isolation trench 4.

Then, the gate insulating film (the low-voltage gate insulating film 15 or the high-voltage gate insulating film 16) of the MISFET is formed in the same manner as with the steps shown in FIG. 15 and subsequent figures of the foregoing embodiment 1.

The subsequent steps are the same as in the foregoing embodiment 1, and hence a description thereof will be omitted.

Thus, in this embodiment 2, by utilizing a part of the element isolation trench 4 as a part of the capacitor formation region, without adding another manufacturing step, it is possible to increase the capacitance per unit area of the capacitor.

Whereas, this embodiment 2 has been described based on the foregoing embodiment 1, but it can also be carried out in a similar manner based on the subsequent embodiments.

Embodiment 3

Figure 29:
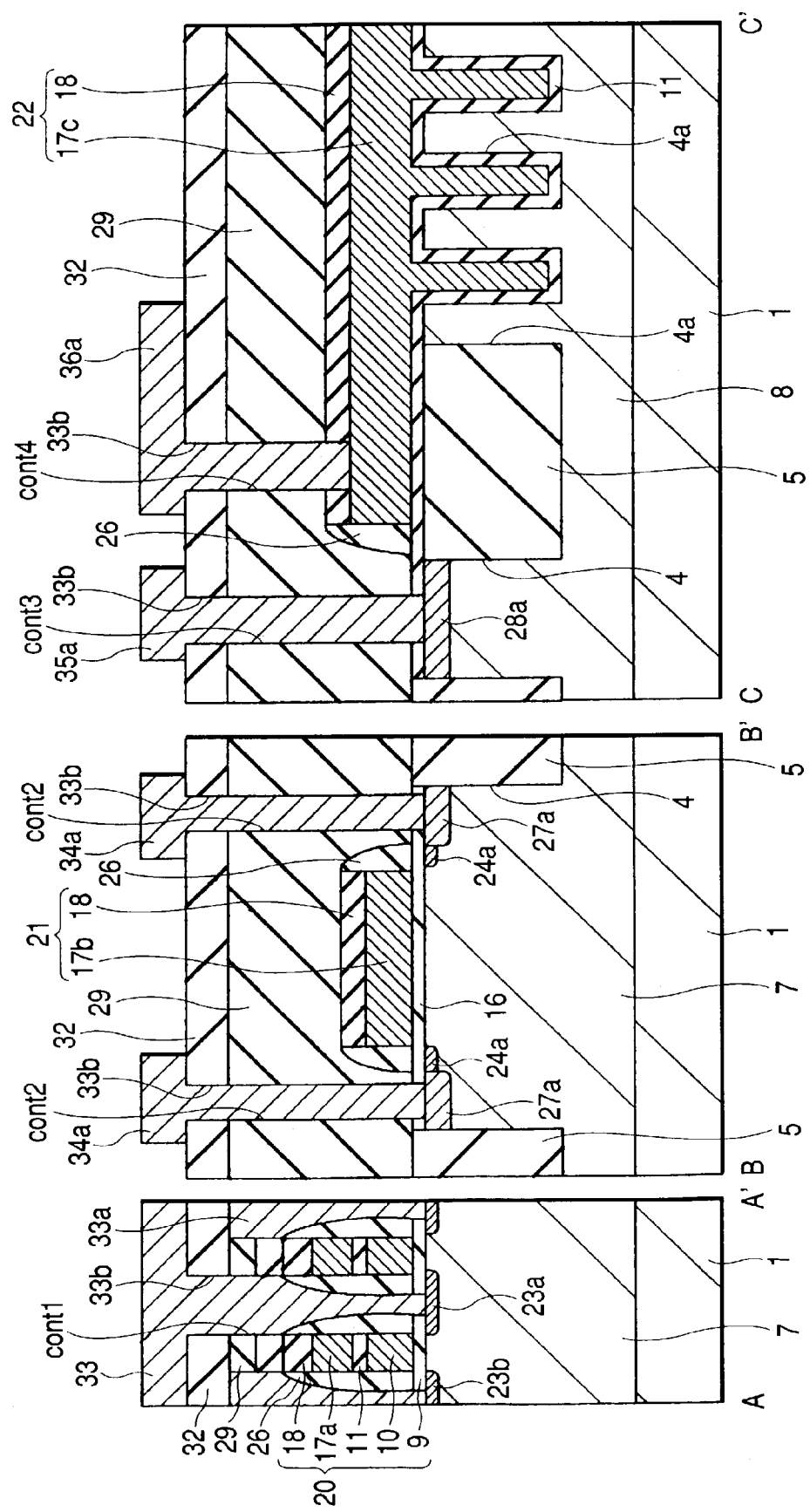
FIG. 29 is a cross sectional view of the respective parts of a semiconductor device representing an Embodiment 3 of the present invention.

The configuration of the essential parts of a semiconductor device of embodiment 3 of the present invention is shown in FIG. 29.

In the foregoing embodiment 1, the step of forming the gate insulating films (the low-voltage gate insulating film 15 and the high-voltage gate insulating film 16) of the MISFETs was the same step as the step of forming the dielectric film 15a or 16a of the capacitor. However, in this embodiment 3, the NONO film 11, which is the memory gate interlayer film (second memory gate insulating film) of the memory cell and the capacitor dielectric film of the capacitor, are formed of the dielectric film of the same layer. Namely, the step of forming the NONO film 11, which is the memory gate interlayer film (second memory gate insulating film) of the memory cell, and the step of forming the capacitor dielectric film of the capacitor are set to be the same.

Incidentally, for convenience in the description, a description of the same part in the following process as was used in the foregoing embodiment 1 will be omitted. As for the MISFETs, the gate insulating film is formed so as to be divided into the high-voltage and low-voltage films, as with Embodiment 1. However, a description will be mainly given of the high-voltage one.

After the step of forming the polysilicon layer 10a, which is to serve as the floating gate electrode (electrode electric charge storage layer) of the memory cell shown in FIG. 10 in the foregoing embodiment 1, the entire surface of the memory cell and MISFET formation regions is covered with a resist, with the polysilicon layer 10a being formed. Thereafter, the portion of the polysilicon layer 10a formed on the capacitor formation region is removed by dry etching.

Figure 30:
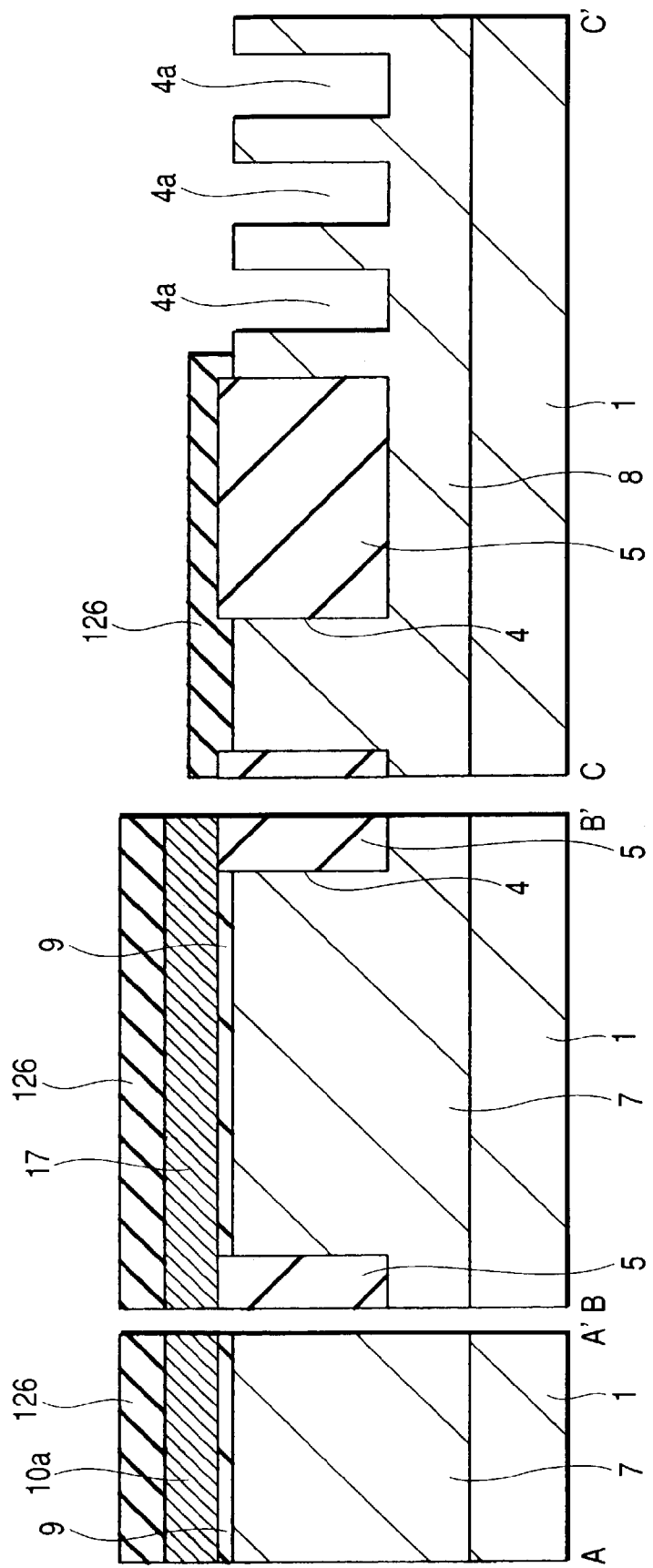
FIG. 30 is a cross sectional view of the respective parts of the semiconductor device representing Embodiment 3 of the present invention, during a step in the manufacturing process thereof.

Then, as shown in FIG. 30, the entire surface of the memory cell formation region and the MISFET formation region and the region, except for the capacitor formation trenches 4a, of the capacitor formation region are covered with a resist pattern 126. Thereafter, the memory tunnel insulating film 9 in the capacitor formation region and the portions of the silicon oxide film 5 embedded in the capacitor formation trenches 4a are sequentially removed by dry etching.

Figure 31:
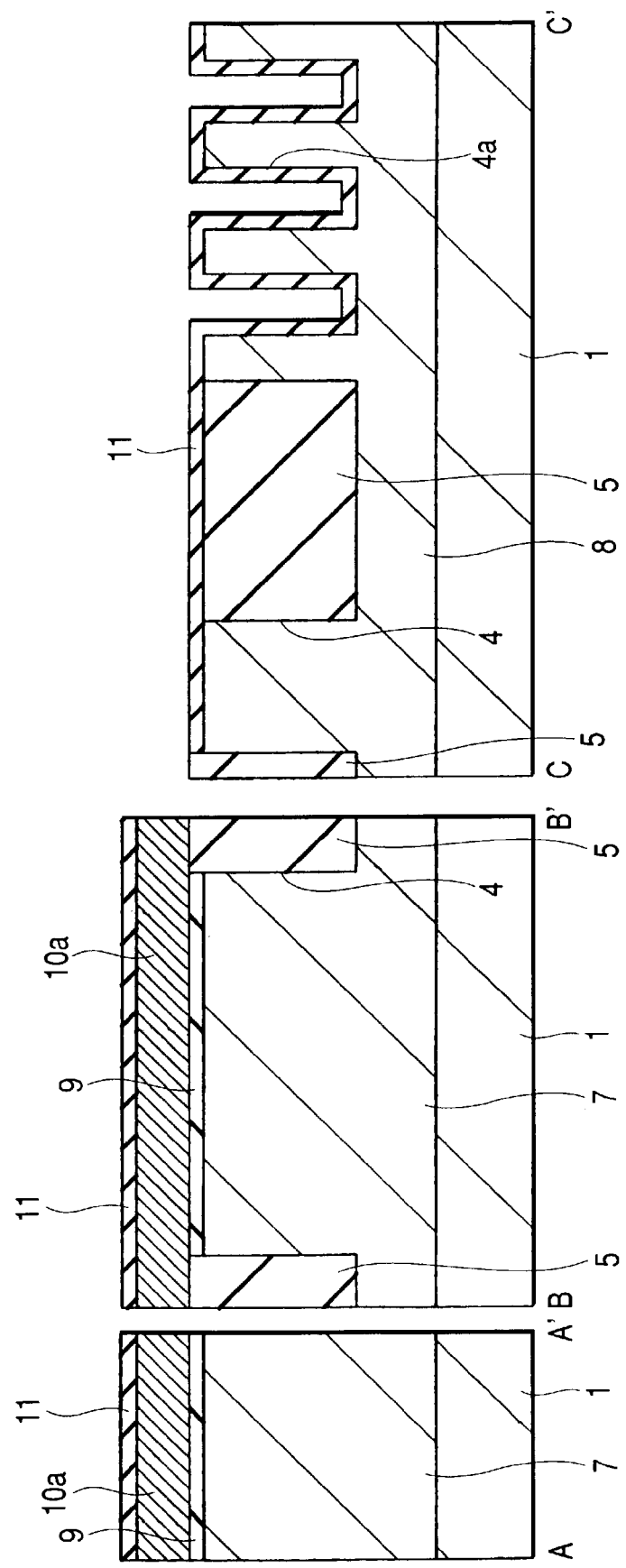
FIG. 31 is a cross sectional view of the respective parts of the semiconductor device as it appears during a manufacturing step subsequent to the step of FIG. 30.

Then, as shown in FIG. 31, on the entire surface of the memory cell formation region, and the entire surface of the MISFET formation region, and the capacitor formation region, the NONO film 11, which is to serve as the gate interlayer film of the memory cell, is formed by the same step as in Embodiment 1. Namely, the insulating film that is used for the formation of the memory gate interlayer film 11 and the dielectric film of the capacitor are formed by the same step.

Figure 32:
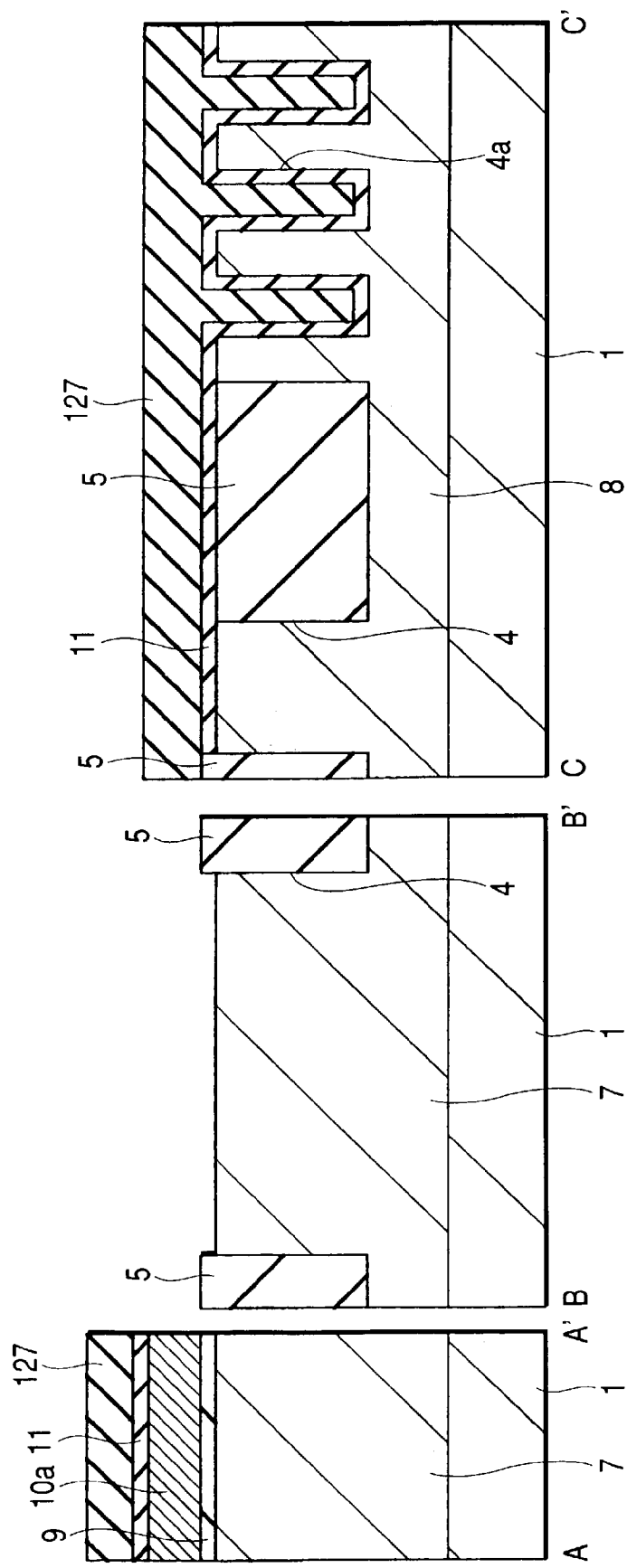
FIG. 32 is a cross sectional view of the respective parts of the semiconductor device as it appears during a manufacturing step subsequent to the step of FIG. 31.
Figure 33:
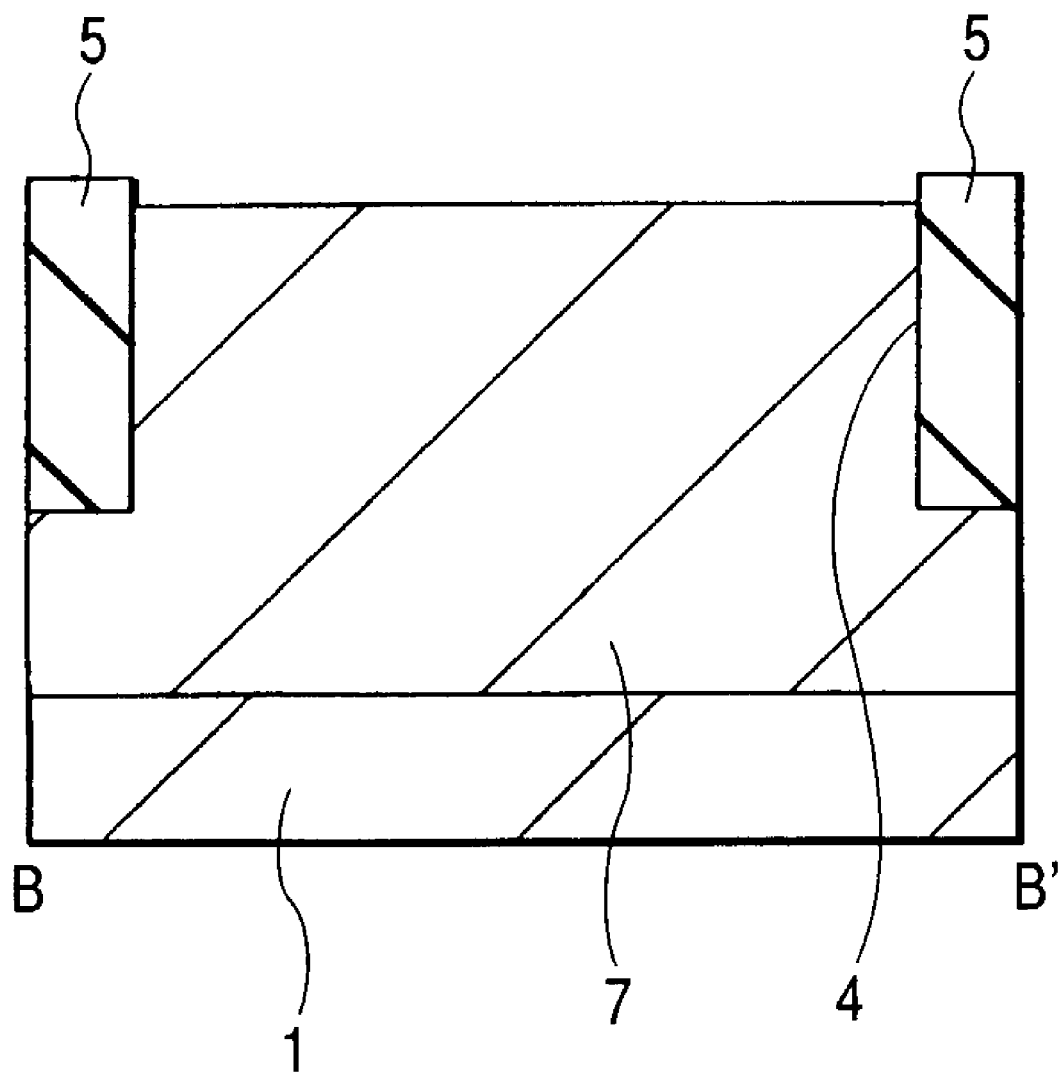
FIG. 33 is a cross sectional view of the MISFET portion of a semiconductor device as it appears during a manufacturing step for Embodiment 3 of the present invention.

Then, as shown in FIG. 32, the entire surface of the memory cell and capacitor formation region is covered with a resist 127. Thereafter, the NONO film 11, the polysilicon layer 10a, and the memory tunnel insulating film 9 formed on the MISFET formation region are removed by dry etching. Whereas, as shown in FIG. 33, they are also removed similarly in the region for forming the low-voltage gate insulating film 15.

Figure 34:
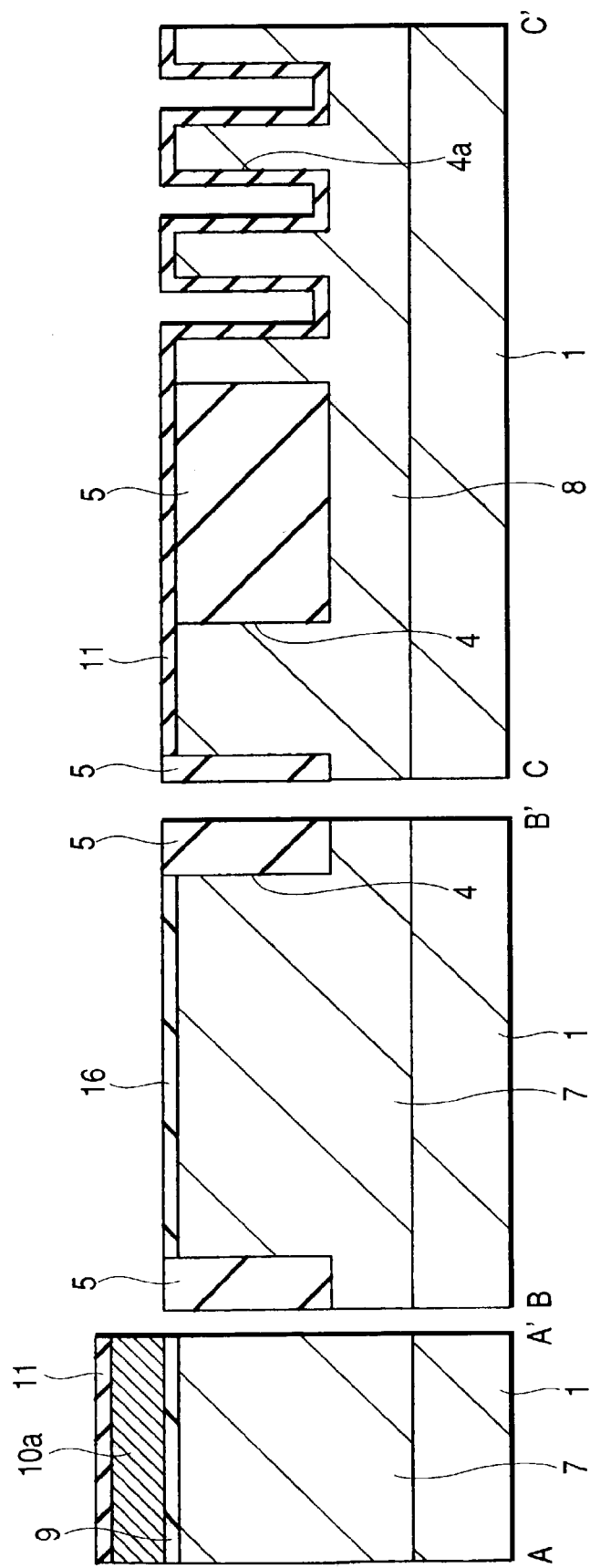
FIG. 34 is a cross sectional view of the respective parts of the semiconductor device as it appears during a manufacturing step subsequent to the step of FIG. 32.
Figure 35:
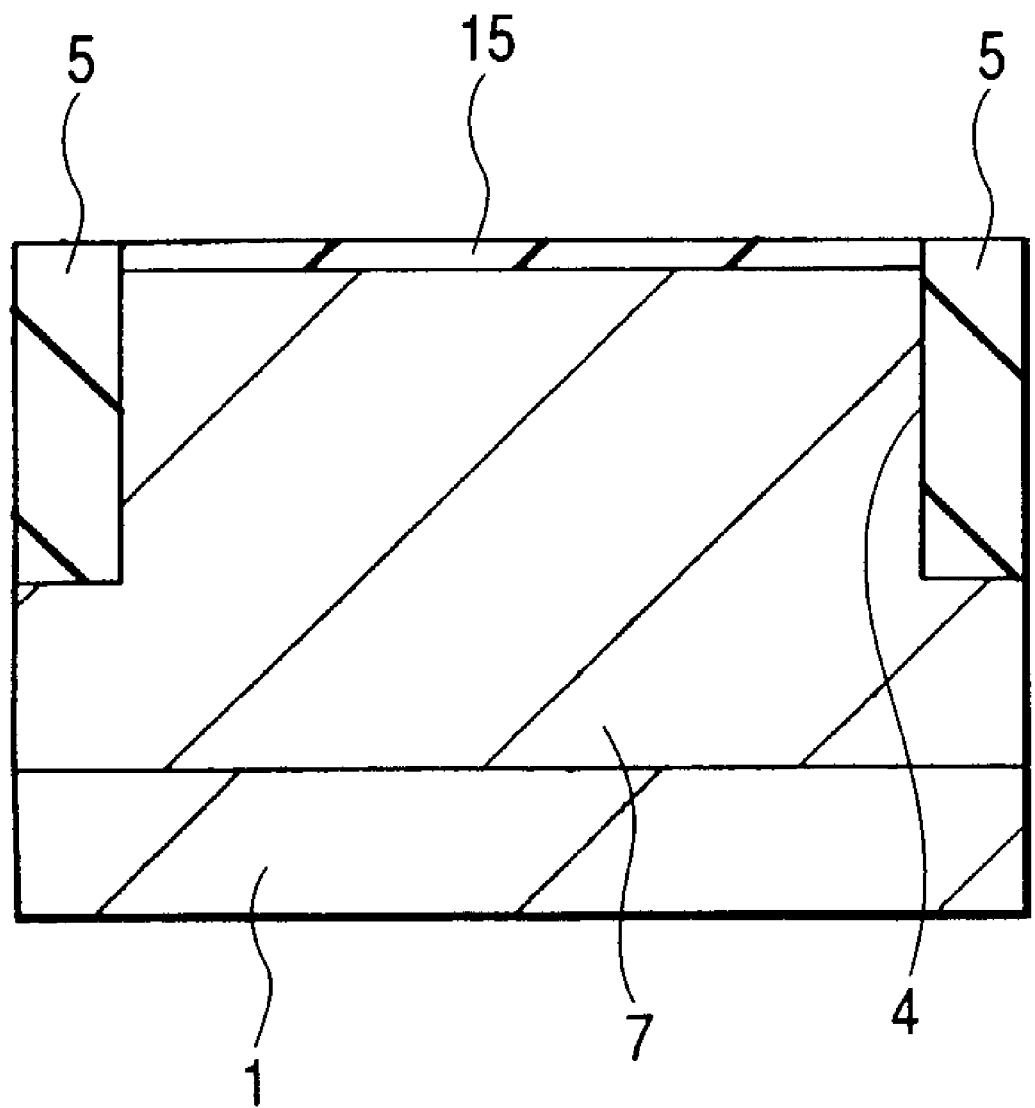
FIG. 35 is a cross sectional view of the respective parts of the semiconductor device as it appears during a manufacturing step subsequent to the step of FIG. 33.

Subsequently, the high-voltage gate insulating film 16 and the low-voltage insulating film 15 are formed in the MISFET formation regions. As for the processes for forming the high-voltage gate insulating film 16 and the low-voltage insulating film 15, different processes are respectively adopted for (a) the high-voltage gate insulating film and (b) the low-voltage gate insulating film, as with the foregoing embodiment 1. The manufacturing processes thereof are respectively the same as in Embodiment 1, and hence a description thereof will be omitted (see FIGS. 34 and 35).

Figure 36:
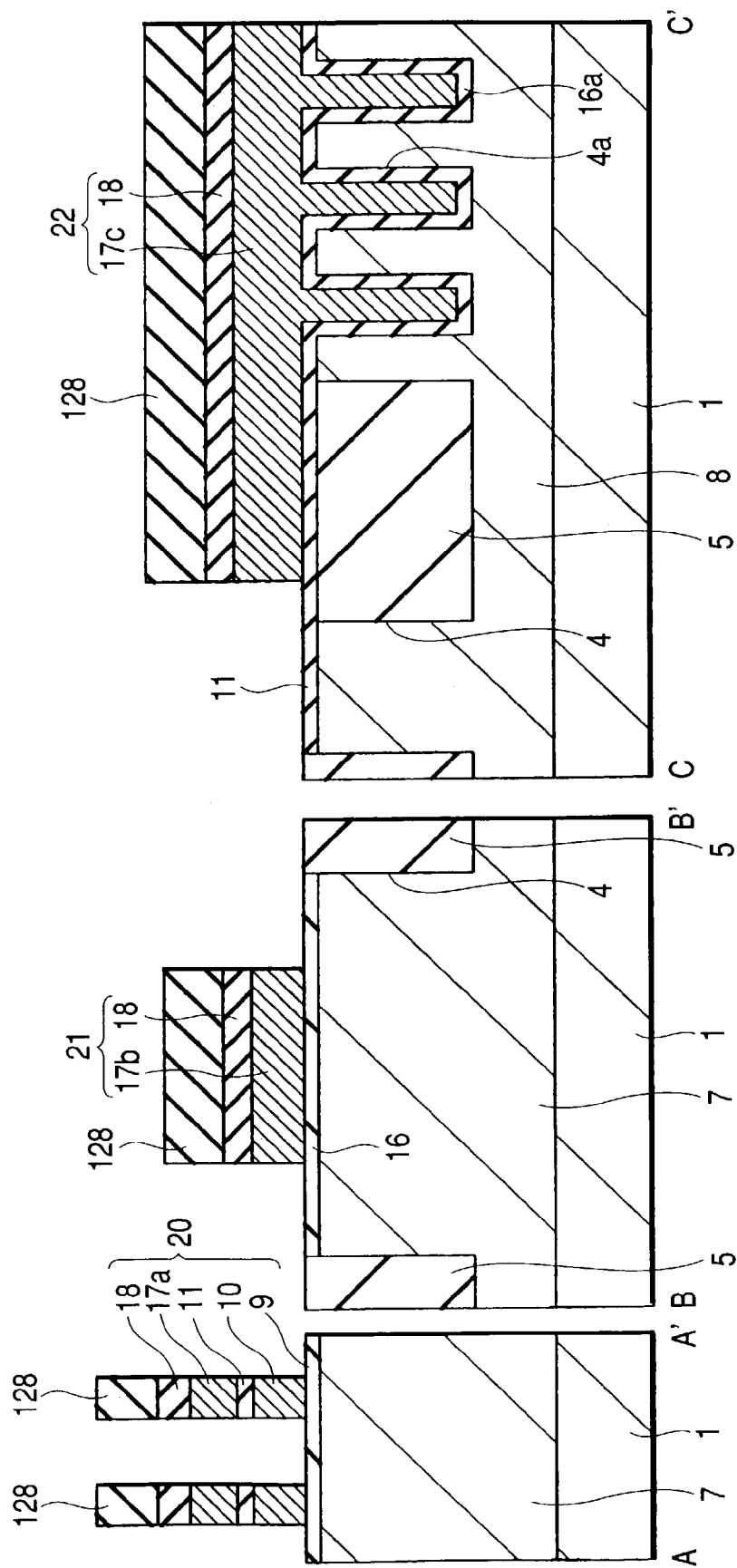
FIG. 36 is a cross sectional view of the respective parts of the semiconductor device as it appears during a manufacturing step subsequent to the step of FIG. 34.

Then, as shown in FIG. 36, on the NONO film 11 that is formed on the memory cell and capacitor formation regions and the gate insulating film that is formed on the MISFET formation region, the polysilicon film, which is to serve as the control gate electrode (memory gate electrode) 17a of the memory cell, and the silicon oxide film 18, which is to serve as a cap layer, are sequentially deposited by a CVD process.

Then, a resist pattern 128 is formed. The memory gate electrode structure 20, the gate electrode structure 21 of the MISFET, and the capacitor upper electrode structure 22 are formed by dry etching using the resist pattern 128. Namely, the conductive film that is used for the formation of the memory gate electrode structure 20, the gate electrode structure 21 of the MISFET, and the capacitor upper electrode structure 22 is formed by the same step.

Below, it is possible to form the semiconductor device having the nonvolatile memory shown in FIG. 29 through the same manufacturing process as was used in the foregoing embodiment 1, and hence a description thereof will be omitted.

Thus, by forming the capacitor dielectric film of the capacitor and the memory gate interlayer film of the memory cell by the same step, it is possible to simplify the manufacturing process. Further, by using the NONO film 11 in place of the low-voltage gate insulating film 15 or the high-voltage gate insulating film 16 of the MISFET as the capacitor dielectric film of the capacitor, it is possible to implement a high reliability capacitor dielectric film.

Embodiment 4

Figure 37:
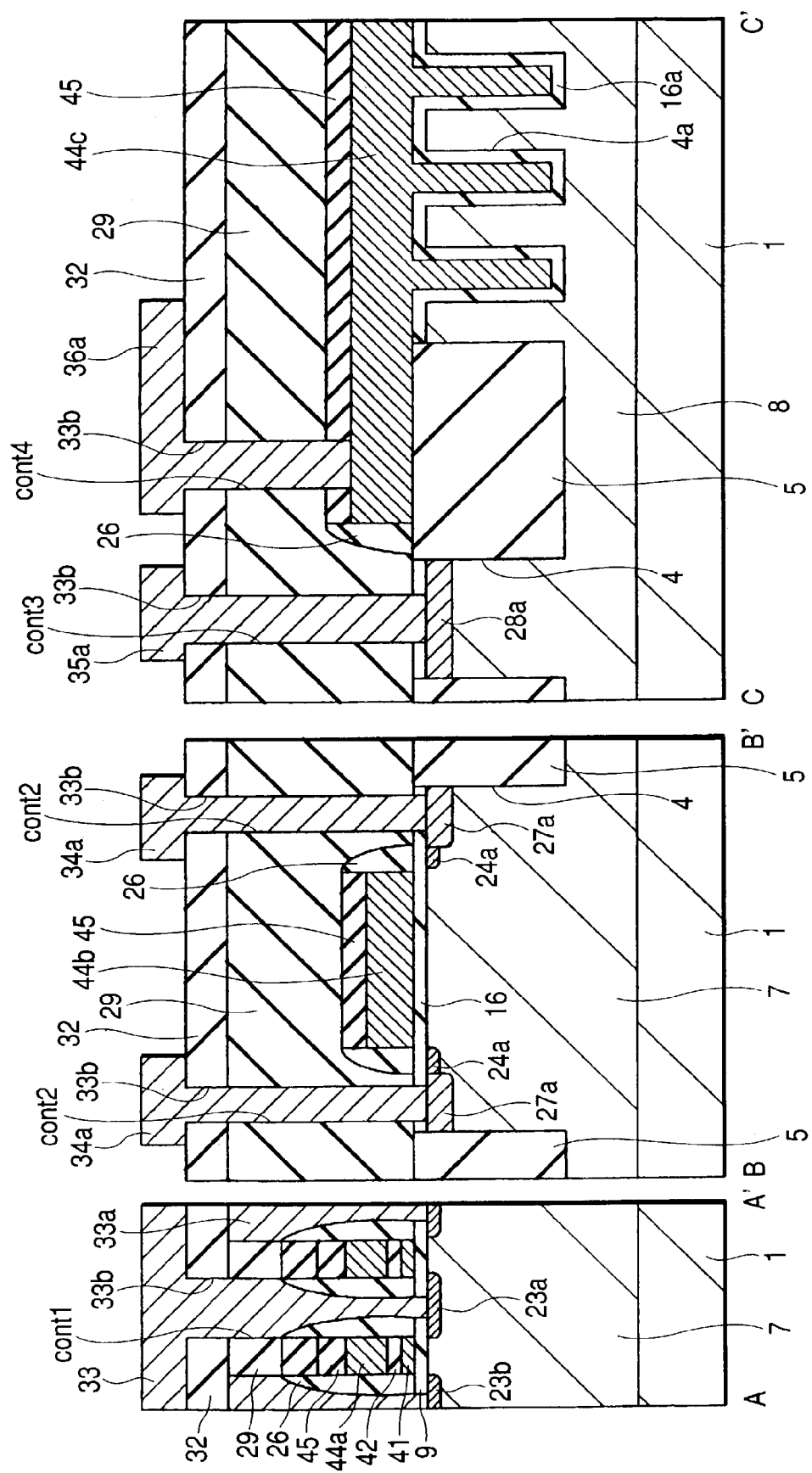
FIG. 37 is a cross sectional view of the respective parts of a semiconductor device representing an Embodiment 4 of the present invention.

The configuration of the main parts of a semiconductor device of embodiment 4 of the present invention is shown in FIG. 37.

In the foregoing embodiment 1, as shown in the steps of forming the memory cell of FIGS. 10 to 22, the polysilicon layer 10a is formed as the electric charge storage layer of the memory cell. However, a silicon nitride film 41 is used to form the electric charge storage layer. Incidentally, the silicon nitride film 41 stores electric charges by capturing electrons in the trap of the silicon nitride film 41.

For convenience in description, a description of the same part in the following process as was used in the foregoing embodiment 1 will be omitted.

Figure 38:
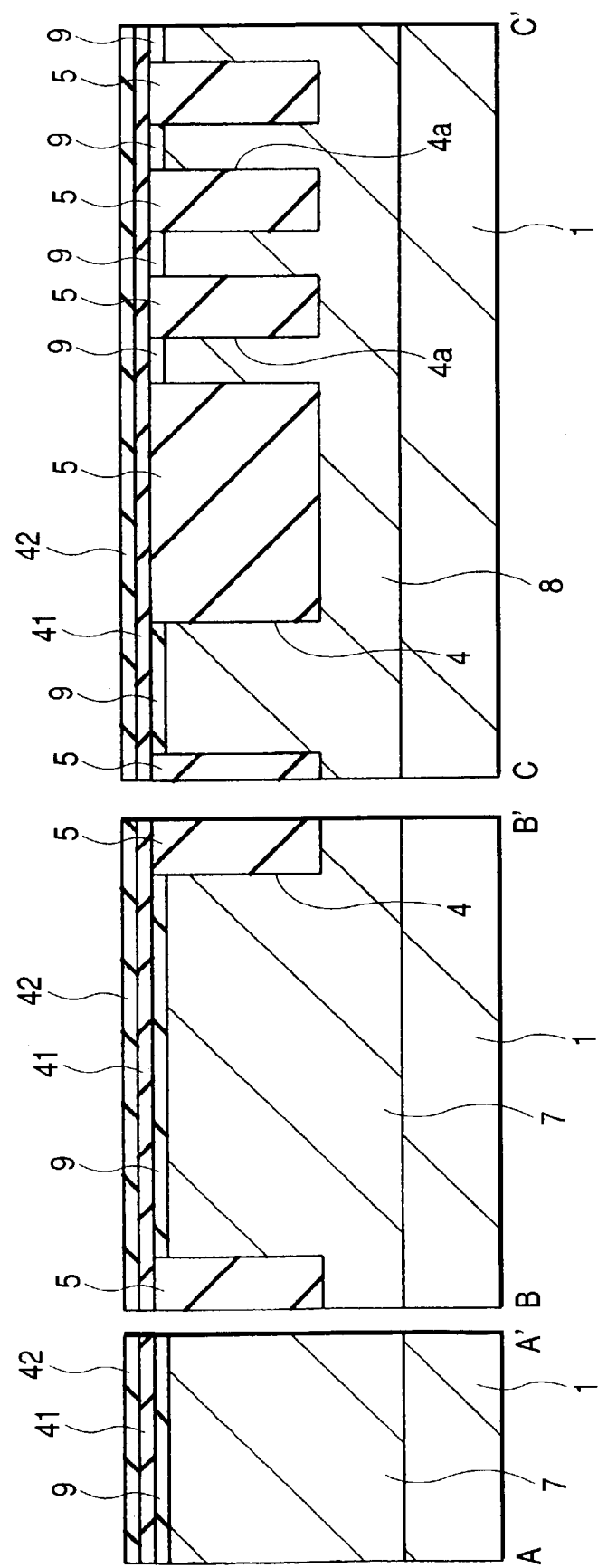
FIG. 38 is a cross sectional view of the respective parts of the semiconductor device representing Embodiment 4 of the present invention, showing a step in the manufacturing process thereof.

After the step shown in FIG. 10 in the foregoing embodiment 1, as shown in FIG. 38, on the memory tunnel insulating film 9, the silicon nitride film 41 and a silicon oxide film 42 are sequentially deposited by using, for example, a CVD process. The silicon nitride film 41 has a function of storing electric charges as a substitute for the floating gate electrode of the memory cell.

Figure 39:
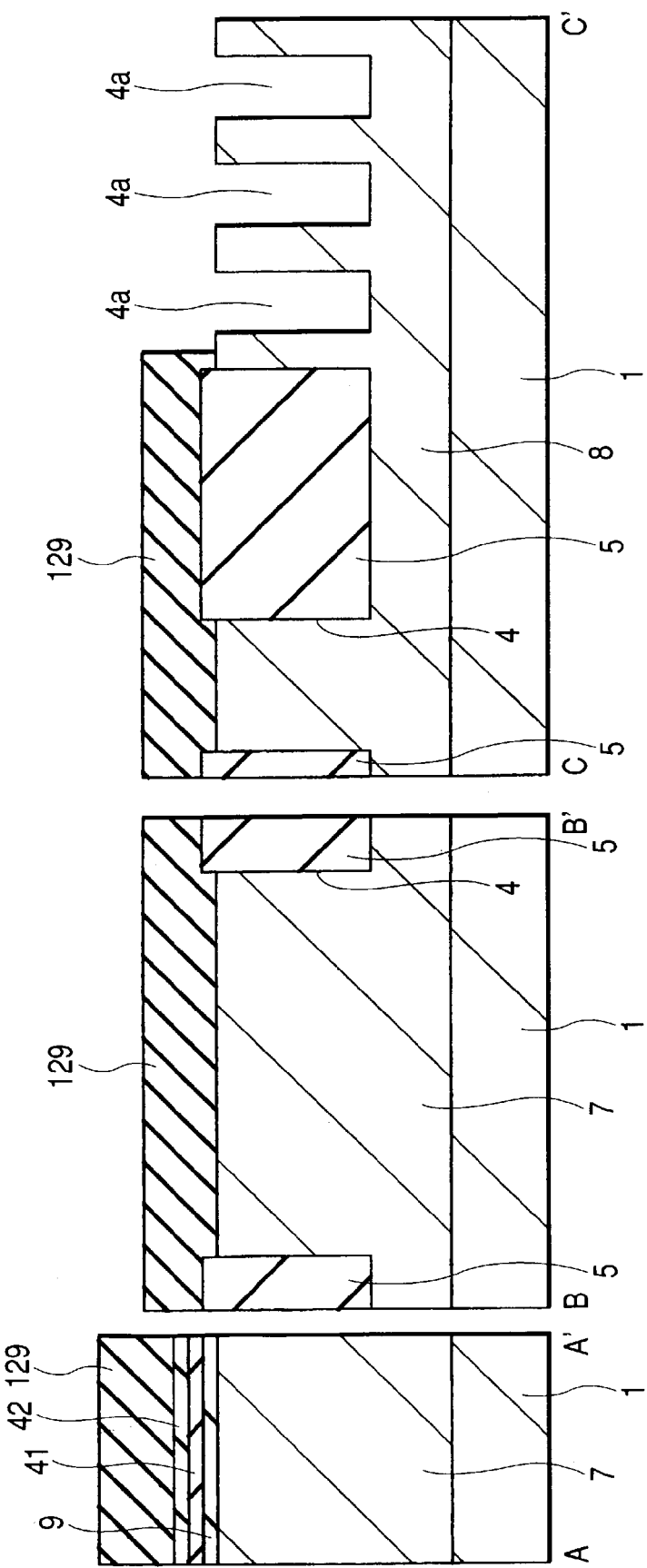
FIG. 39 is a cross sectional view of the respective parts of the semiconductor device as it appears during a manufacturing step subsequent to the step of FIG. 38.

Then, as shown in FIG. 39, the entire surface of the memory cell formation region is covered with a resist pattern 129. Then, the portions of the silicon oxide film 42, the silicon nitride film 41 and the memory tunnel insulating film 9 that are formed on the MISFET formation region and the capacitor formation region are sequentially removed by etching. Subsequently, the resist pattern 122 shown in FIG. 14 in the foregoing embodiment 1 is formed, and the portions of the silicon oxide film 5 embedded in the capacitor formation trenches 4a are removed.

Figure 40:
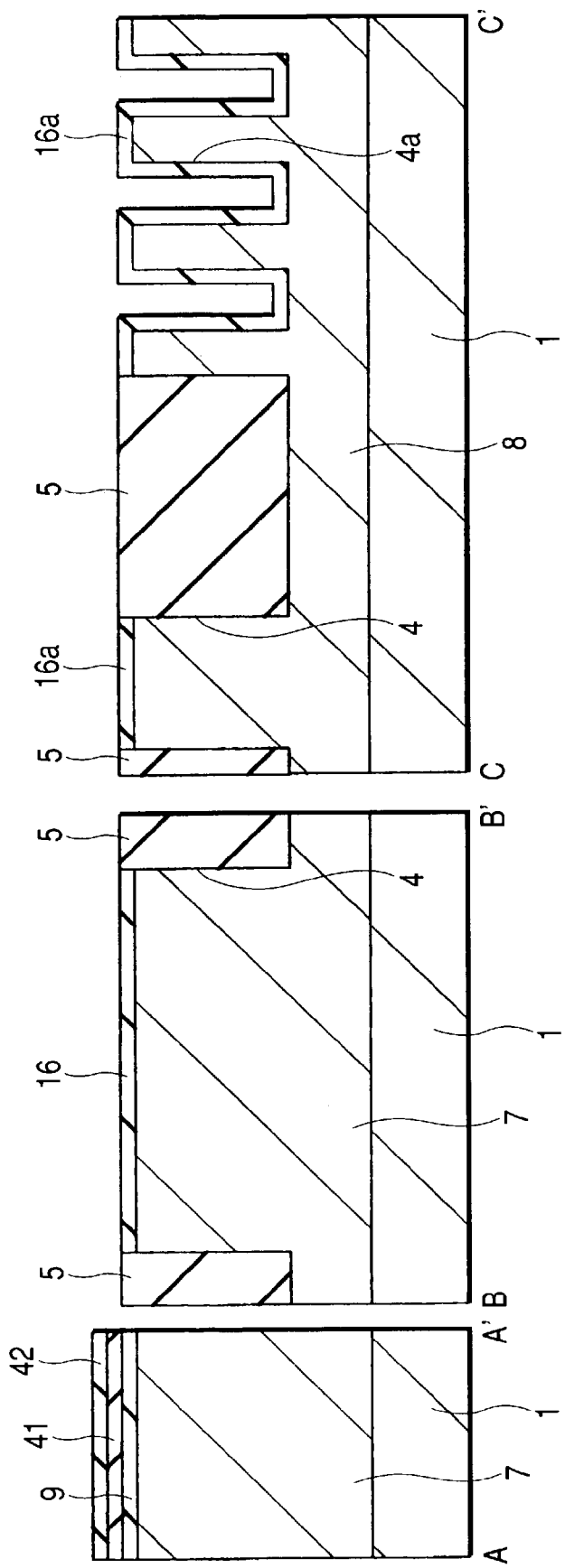
FIG. 40 is a cross sectional view of the respective parts of the semiconductor device as it appears during a manufacturing step subsequent to the step of FIG. 39.

Subsequently, as shown in FIG. 40, the gate insulating films (the low-voltage gate insulating film 15 and the high-voltage gate insulating film 16) of the MISFETs and the dielectric film 16a are formed on the MISFET formation regions and the capacitor formation region, respectively, by the same step as in the foregoing embodiment 1.

Figure 41:
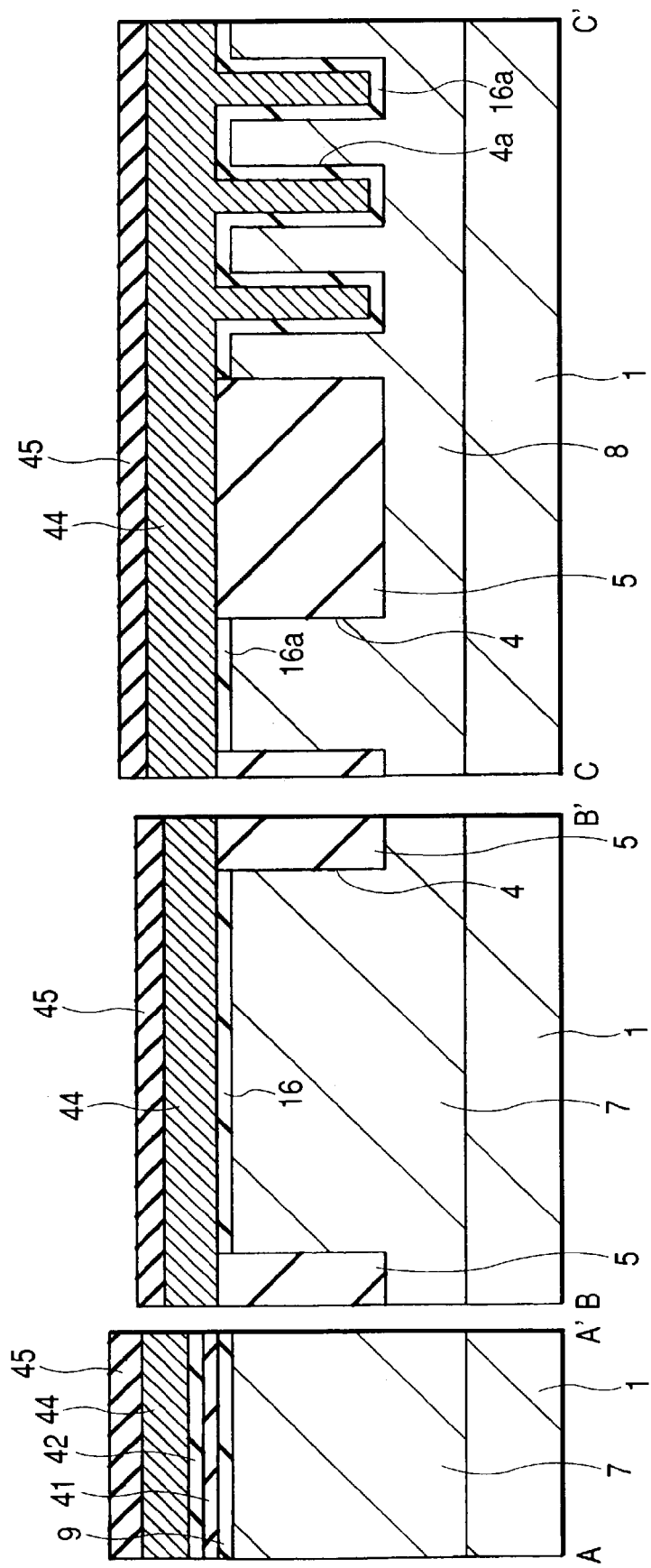
FIG. 41 is a cross sectional view of the respective parts of the semiconductor device as it appears during a manufacturing step subsequent to the step of FIG. 40.

Then, as shown in FIG. 41, on the silicon oxide film 42 formed on the memory cell formation region, and on the low-voltage gate insulating film 15 or the high-voltage gate insulating film 16 formed on the MISFET formation region and the capacitor formation region, a polysilicon film 44 and a silicon oxide film 45 are sequentially deposited by using a CVD process.

Figure 42:
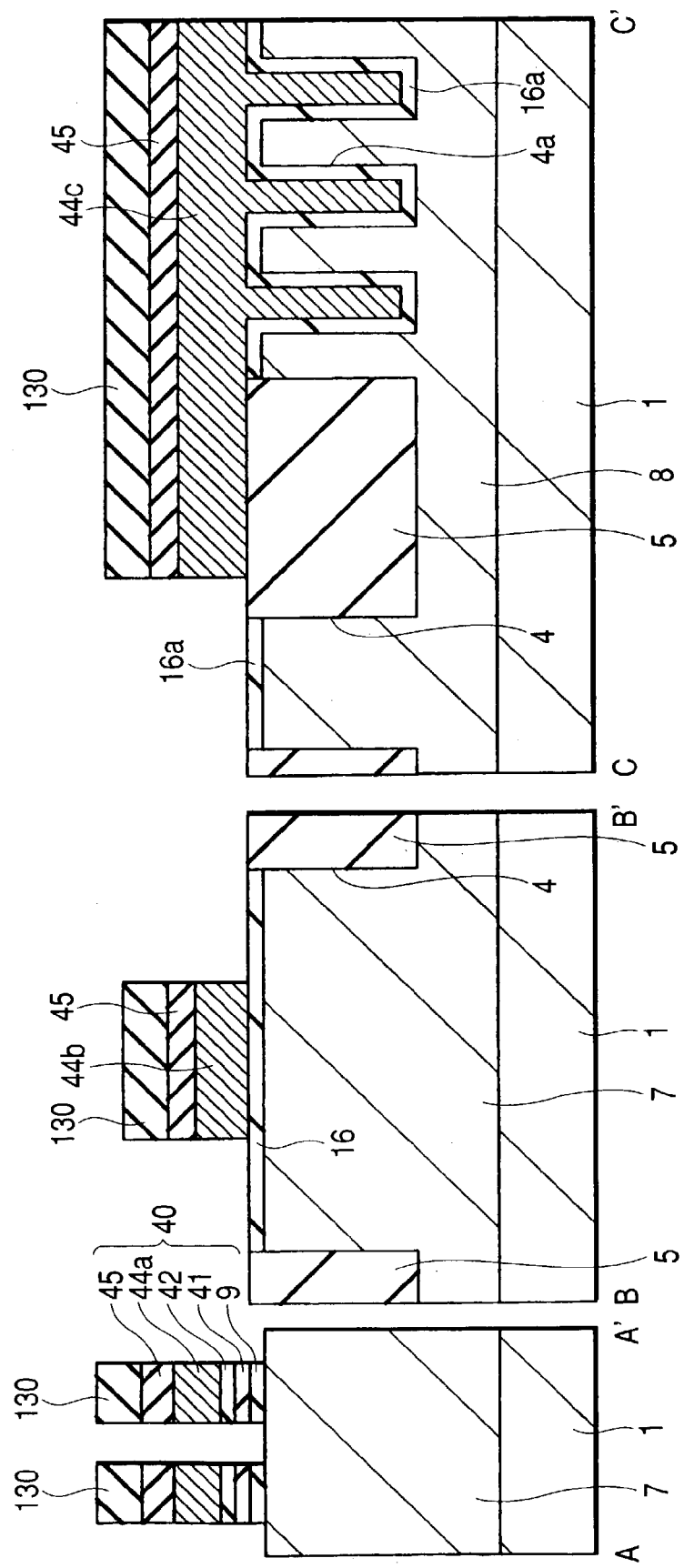
FIG. 42 is a cross sectional view of the respective parts of the semiconductor device as it appears during a manufacturing step subsequent to the step of FIG. 41.

Then, as shown in FIG. 42, patterning is performed by using a resist pattern 130 as a mask, thereby to form a memory gate electrode 44a, a gate electrode 44b of the MISFET, and an upper electrode 44c of the capacitor. Namely, the memory gate electrode 44a, the gate electrode 44b of the MISFET, and the upper electrode 44c of the capacitor are composed of a conductive film of the same layer, and the conductive film used for the formation of the memory gate electrode 44a, the gate electrode 44b of the MISFET, and the upper electrode 44c of the capacitor is formed by the same step. In accordance with the steps up to this point, it is possible to form a memory gate electrode structure 40 that is composed of the memory tunnel insulating film 9, the silicon nitride film 41, the silicon oxide film 42, the memory gate electrode 44a, and the silicon oxide film 45.

In the subsequent steps, the semiconductor device having the nonvolatile memory shown in FIG. 37 is formed through the same steps as used in the foregoing embodiment 1, and hence a description thereof will be omitted.

Thus, in this embodiment 4, the electric charge storage layer of the memory cell is formed by using the silicon nitride film 41 in place of the polysilicon layer 10a in the foregoing embodiment 1. However, as compared with the case where the polysilicon film 10a, which is a continuous conductive film, performs electric charge storage, the electron traps in the silicon nitride film 41 are discontinuous and discrete. Therefore, even when a charge leakage path, such as a pinhole, occurs in a part of the memory tunnel insulating film 9, all of the stored electric charges will not disappear. As a result, it is possible to establish inherently strong retention characteristics.

Whereas, the electric charge storage layer of the memory cell may also be formed of so-called Si nano-dots composed of silicon spheres each having a diameter of several nanometers in place of the silicon nitride film 41. Also, in such a case, it is possible to obtain the foregoing same effects as obtained in this embodiment 4.

Embodiment 5

Figure 43:
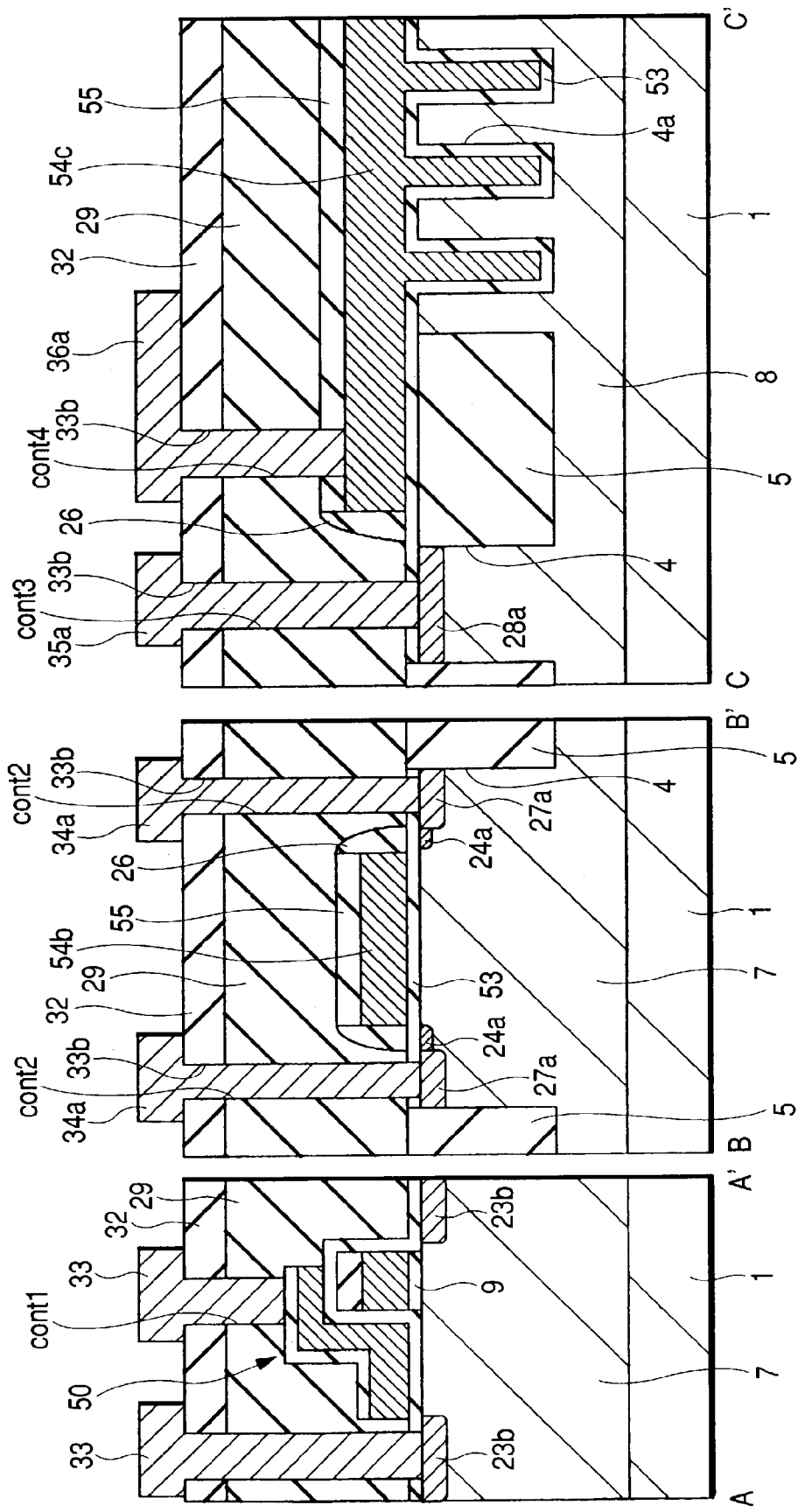
FIG. 43 is a cross sectional view of the respective parts of a semiconductor device representing an Embodiment 5 of the present invention.

The configuration of the main parts of a semiconductor device of embodiment 5 of the present invention is shown in FIG. 43.

In the foregoing embodiment 4, as a modified example of the foregoing embodiment 1, the memory gate electrode structure 40 was formed in place of the memory gate electrode structure 20. However, in this embodiment 5, the gate electrode structure is formed in a so-called split-gate type as a memory gate electrode structure 50, as shown in FIG. 43.

Incidentally, for convenience in the description, a description of the same part in the following process as was used in the foregoing embodiment 1 will be omitted.

Figure 44:
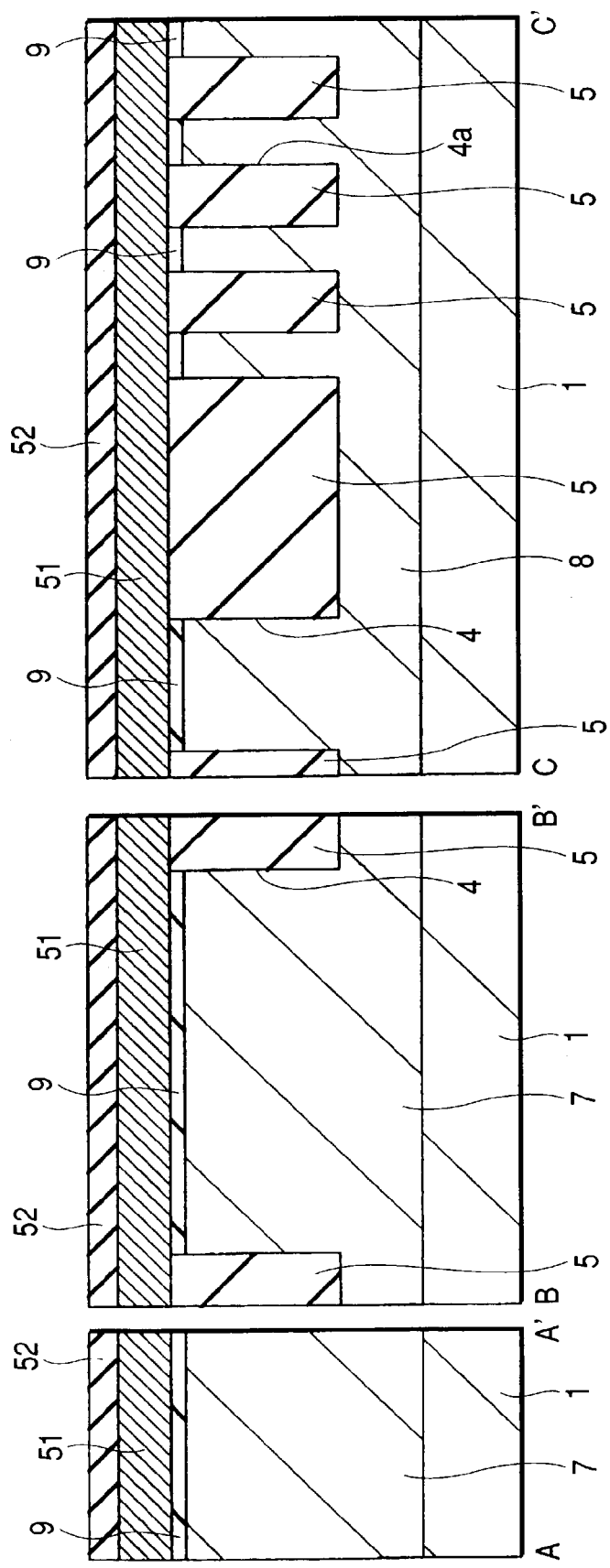
FIG. 44 is a cross sectional view of the respective parts of the semiconductor device representing Embodiment 5 of the present invention, showing a step in the manufacturing process thereof.

After the step shown in FIG. 10 in the foregoing embodiment 1, as shown in FIG. 44, on the memory tunnel insulating film 9, a polysilicon film 51 and a silicon oxide film 52 are sequentially deposited by, for example, a CVD process. Incidentally, the silicon oxide film 52 may also be formed by thermally oxidizing the surface of the polysilicon film 51.

Figure 45:
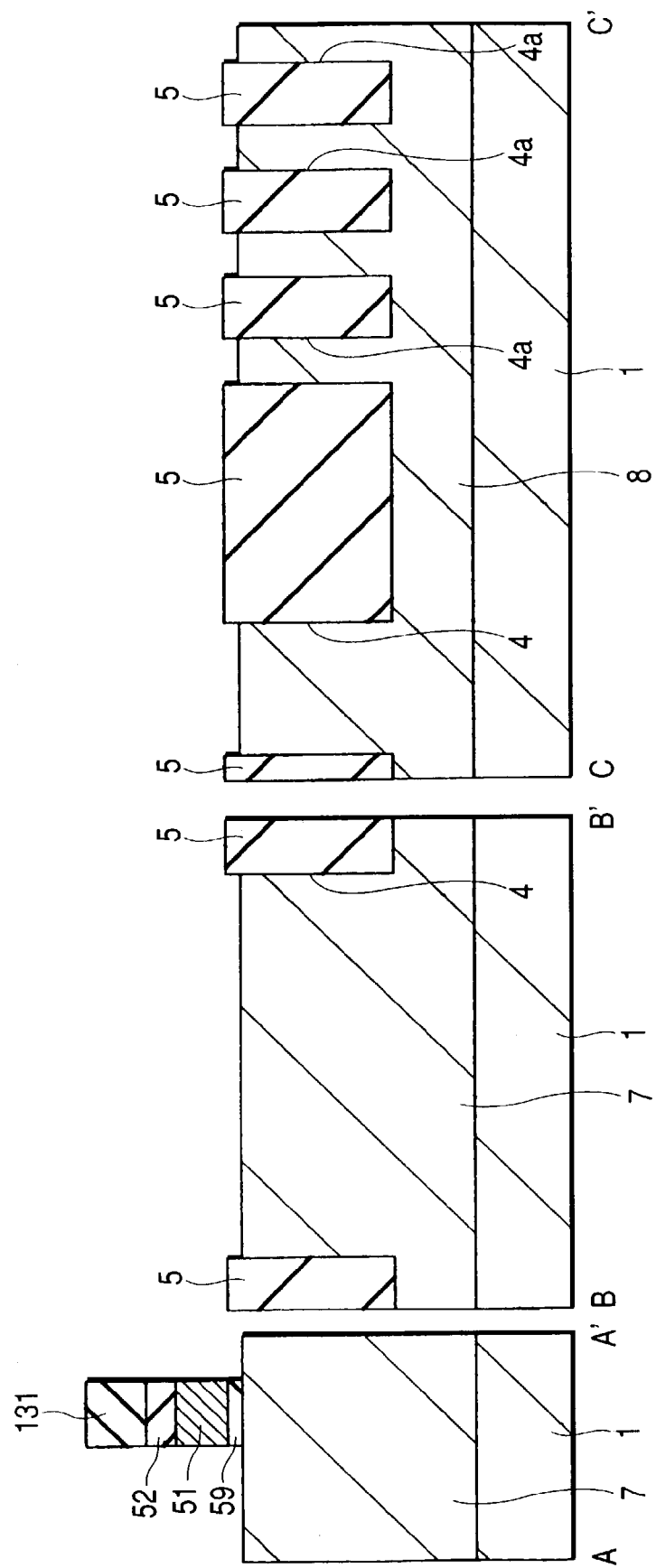
FIG. 45 is a cross sectional view of the respective parts of the semiconductor device as it appears during a manufacturing step subsequent to the step of FIG. 44.

Then, as shown in FIG. 45, a resist pattern 131 is formed on the silicon oxide film 52 of the memory cell formation region. Thereafter, the silicon oxide film 52, the polysilicon film 51, and the memory tunnel insulating film 9 are sequentially patterned, and selectively removed. The electric charge storage layer of the memory cell is formed of the polysilicon film 51.

Figure 46:
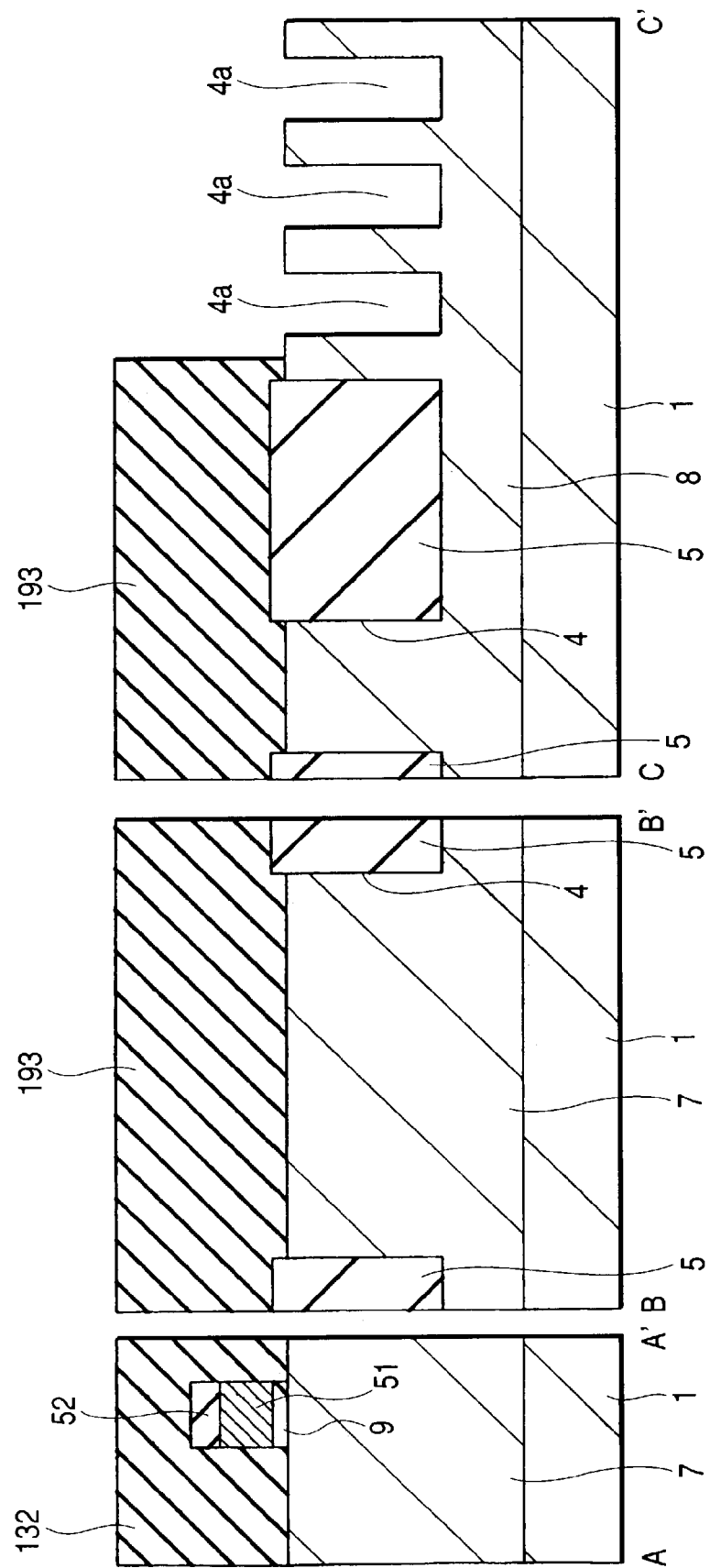
FIG. 46 is a cross sectional view of the respective parts of the semiconductor device as it appears during a manufacturing step subsequent to the step of FIG. 45.

Then, as shown in FIG. 46, a resist pattern 132 is formed by using the same mask as the mask shown in FIG. 14 in the foregoing embodiment 1. Thus, the silicon oxide film 5 formed in the capacitor formation trenches 4a of the capacitor is selectively removed.

Figure 47:
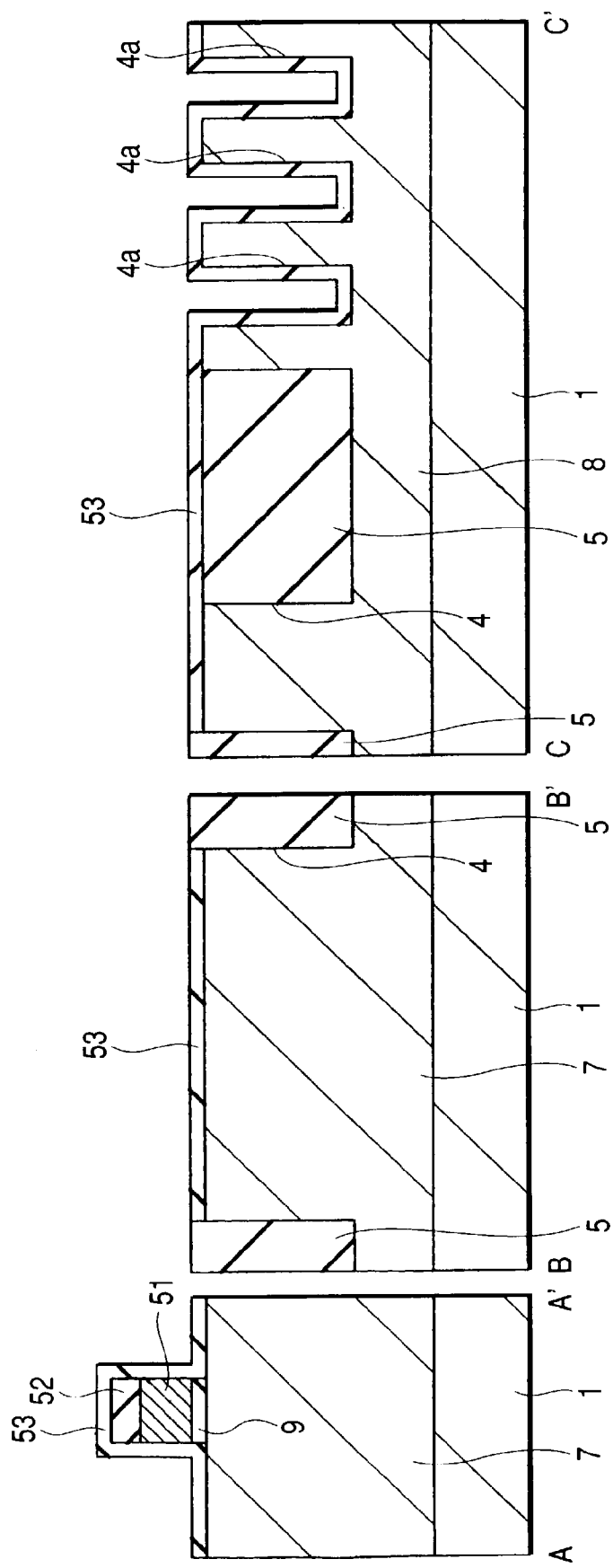
FIG. 47 is a cross sectional view of the respective parts of the semiconductor device as it appears during a manufacturing step subsequent to the step of FIG. 46.

Then, as shown in FIG. 47, a silicon oxide film, which is to serve as a gate insulating film 53 of the MISFET, is formed by using, for example, a CVD process. Whereas, the silicon oxide film to be the gate insulating film 53 of the MISFET may also be formed into different films by the same steps as the steps of forming the high-voltage gate insulating film 16 (see FIG. 2) and the low-voltage gate insulating film 15 (see FIG. 3) in the foregoing embodiment 1.

Figure 48:
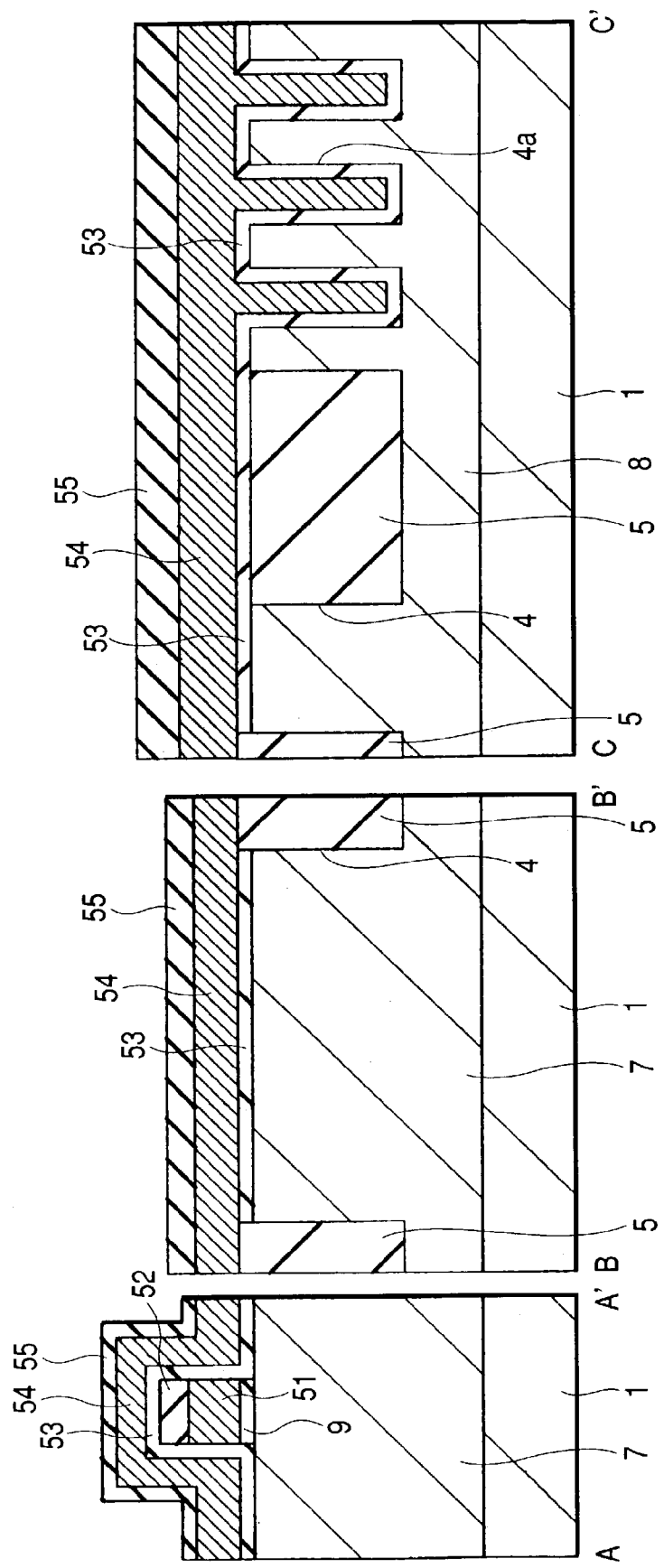
FIG. 48 is a cross sectional view of the respective parts of the semiconductor device as it appears during a manufacturing step subsequent to the step of FIG. 47.

Then, as shown in FIG. 48, on the gate insulating film 53, a polysilicon film 54 and a silicon oxide film 55 are sequentially deposited by using, for example, a CVD process.

Figure 49:
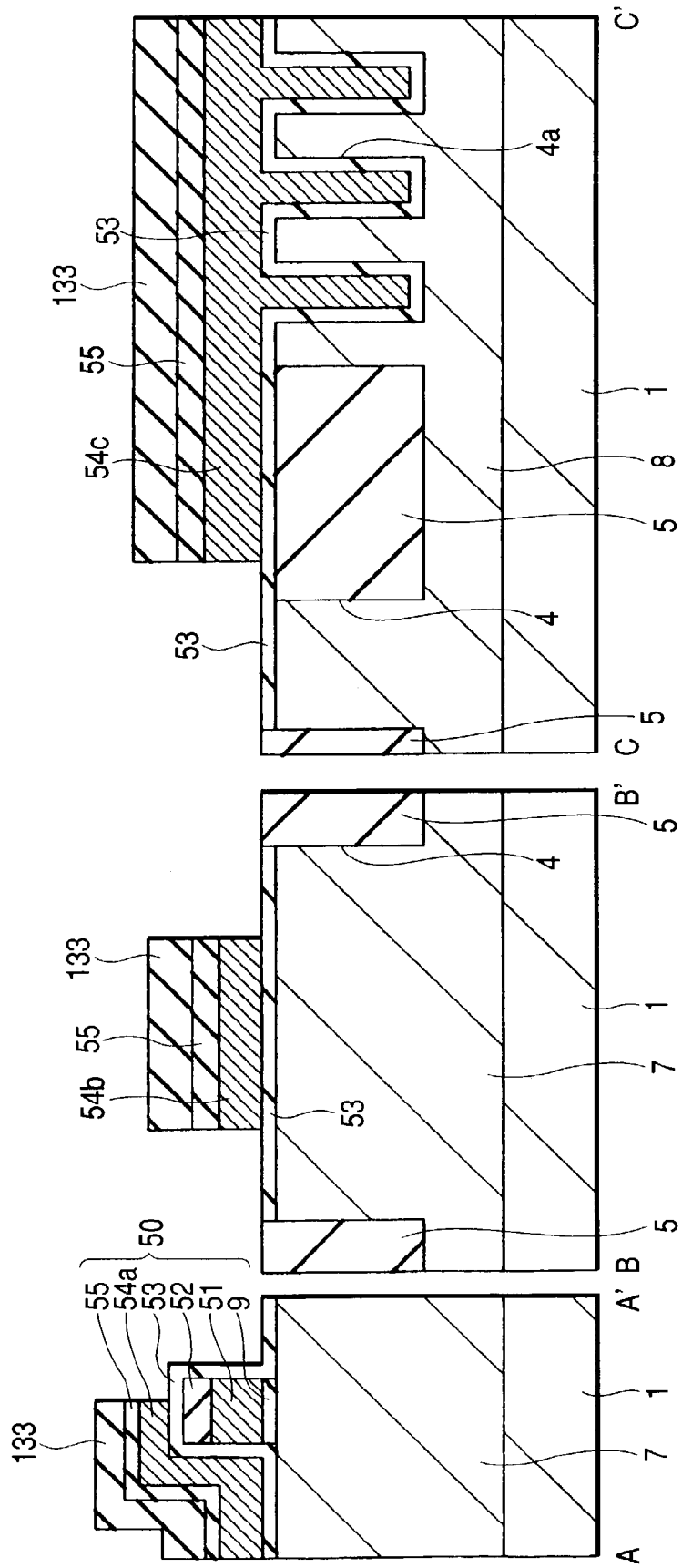
FIG. 49 is a cross sectional view of the respective parts of the semiconductor device as it appears during a manufacturing step subsequent to the step of FIG. 48.

Then, as shown in FIG. 49, a resist pattern 133 is formed. Thus, the silicon oxide film 55 and the polysilicon film 54 are selectively removed by patterning. As a result, it is possible to form a memory gate electrode 54a, a gate electrode 54b of the MISFET, and an upper electrode 54c of the capacitor. In accordance with the steps up to this point, it is possible to form a memory gate electrode structure 50 that is composed of the memory tunnel insulating film 9, the polysilicon film 51, the silicon oxide film 52, the gate insulating film 53, the memory gate electrode 54a, and the silicon oxide film 55.

In the subsequent steps, it is possible to form the semiconductor device having the nonvolatile memory shown in FIG. 43 through the same manufacturing steps as used in the foregoing embodiment 1, and hence a description thereof will be omitted.

Thus, also when the memory gate electrode portion is formed in the configuration as shown in this embodiment 5, it is possible to obtain the same effects as obtained in the foregoing embodiment 1.

Embodiment 6

Figure 50:
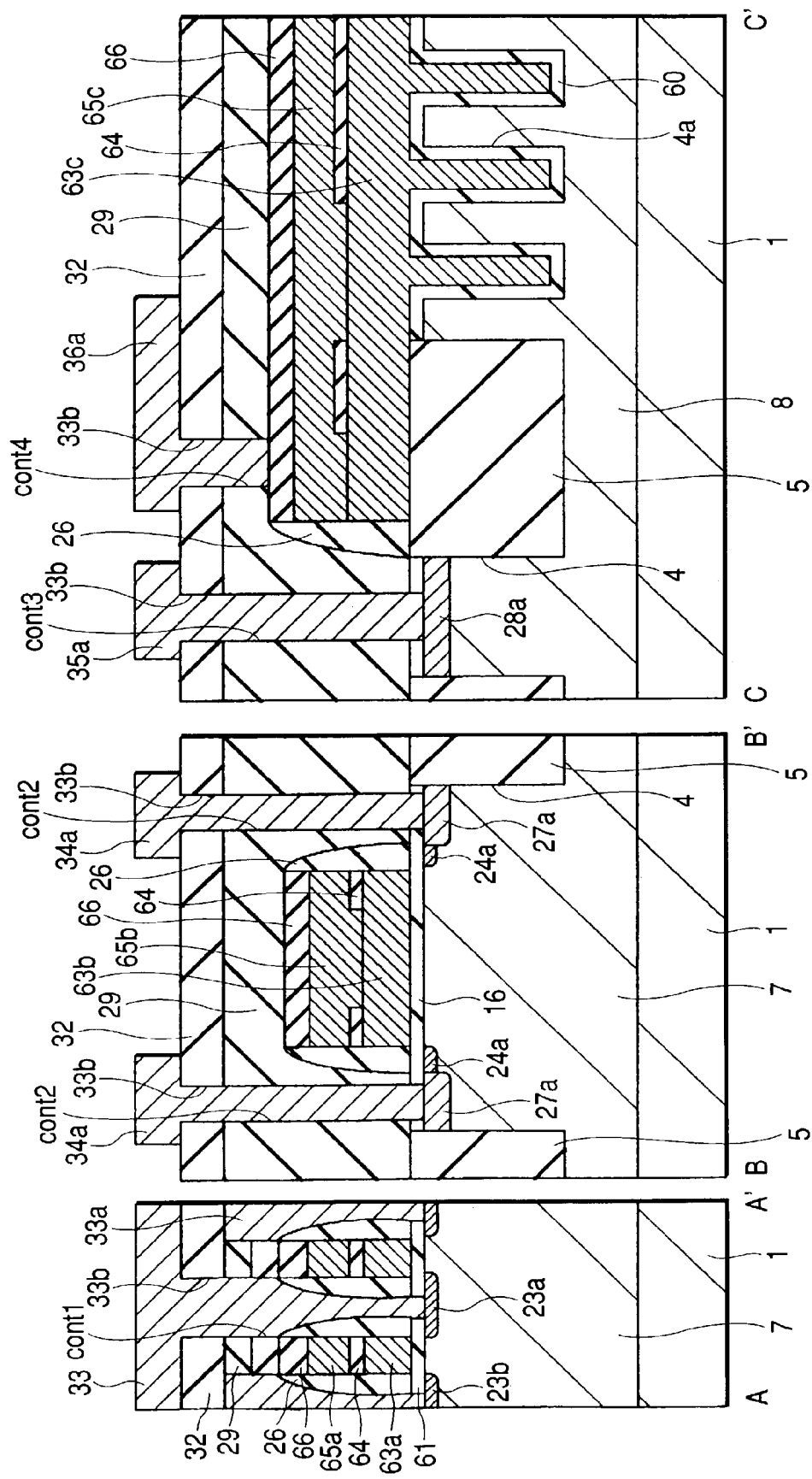
FIG. 50 is a cross sectional view of the respective parts of a semiconductor device representing Embodiment 6 of the present invention.

The configuration of the main parts of a semiconductor device of embodiment 6 of the present invention is shown in FIG. 50.

In the foregoing embodiment 1, the gate electrode of the MISFET and the upper electrode of the capacitor were formed of the polysilicon layer 17 (see FIG. 21) serving as the control gate electrode 17a (see FIG. 2) of the memory cell. However, in this embodiment 6, these electrodes are formed by using the polysilicon layer 10a serving as the floating gate electrode 10 (see FIG. 2) of the memory cell and the polysilicon layer 17 serving as the control gate electrode 17a.

Incidentally, for convenience in the description, a description of the same part in the following process as was used in the foregoing embodiment 1 will be omitted.

Figure 51:
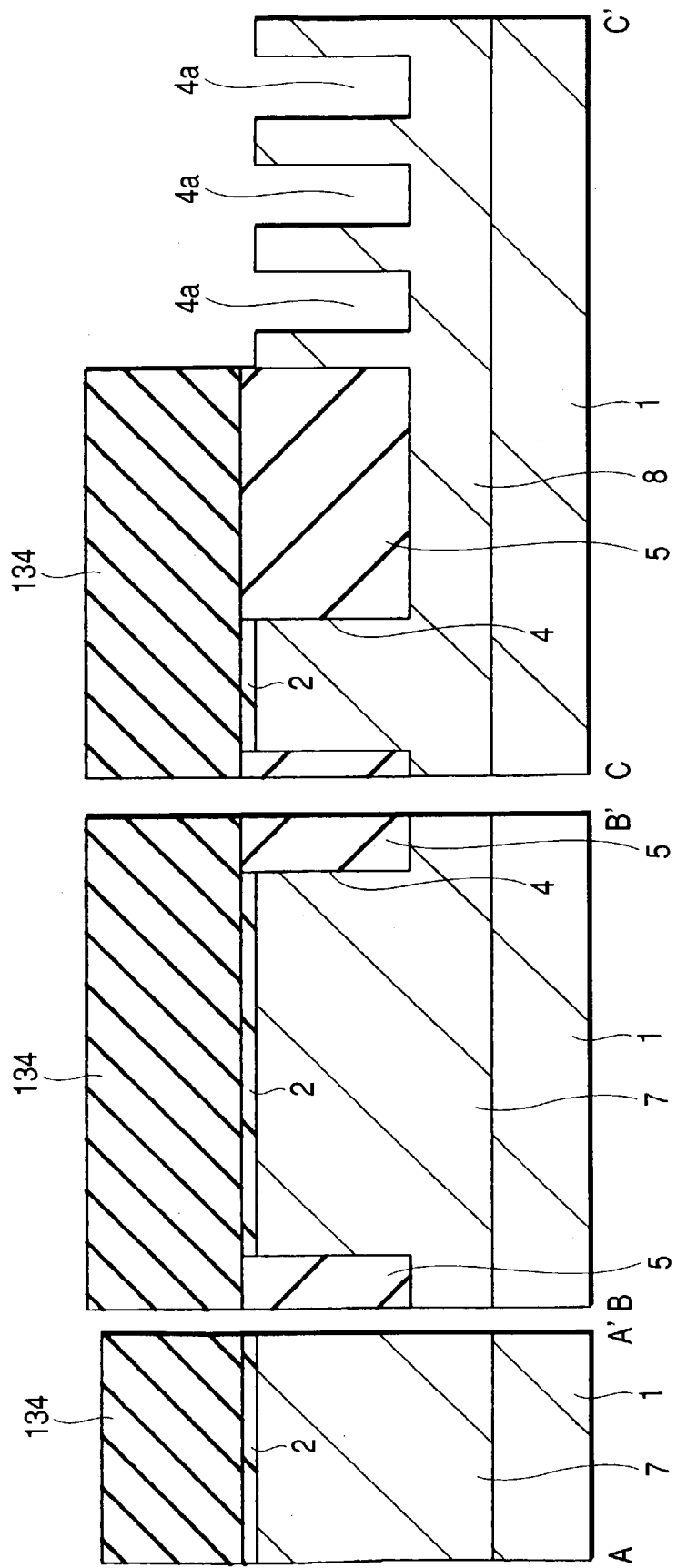
FIG. 51 is a cross sectional view of the respective parts of the semiconductor device representing Embodiment 6 of the present invention, showing a step in the manufacturing process thereof.

After the step shown in FIG. 9 in the foregoing embodiment 1, as shown in FIG. 51, the region except for the capacitor formation trenches 4a is covered with a resist pattern 134. Thus, the silicon oxide film 5 embedded in the capacitor formation trenches 4a is etched and removed.

Figure 52:
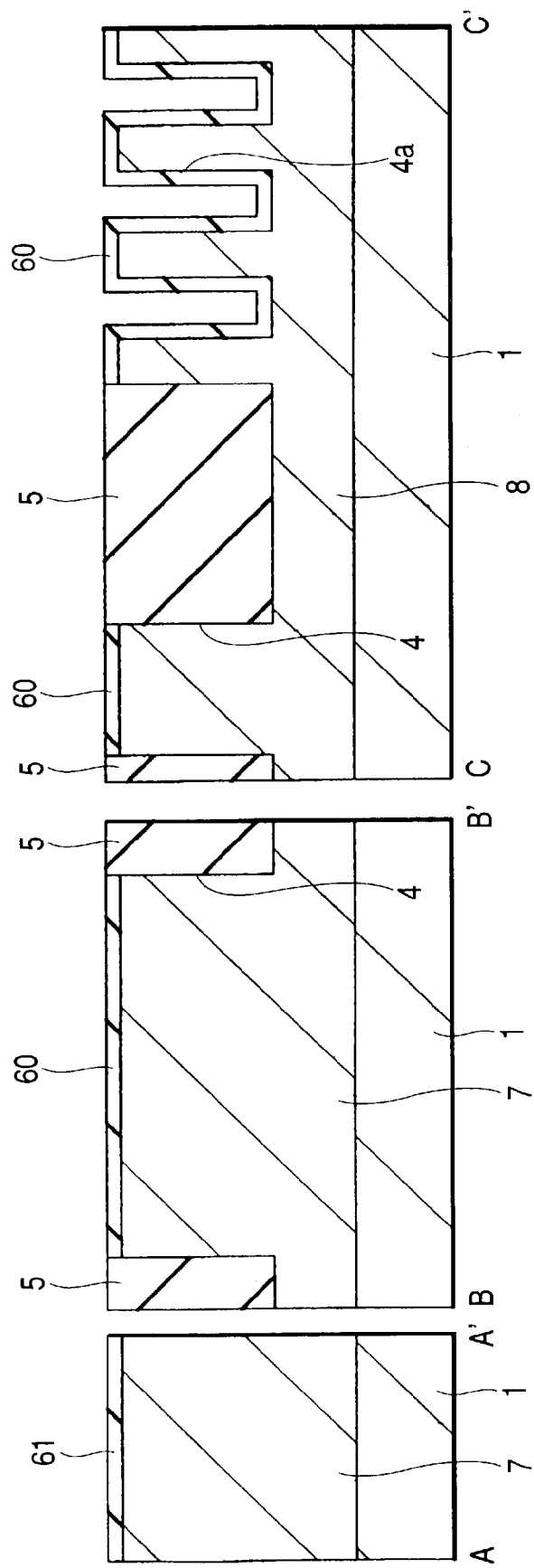
FIG. 52 is a cross sectional view of the respective parts of the semiconductor device as it appears during a manufacturing step subsequent to the step of FIG. 51.

Then, as shown in FIG. 52, for example, the semiconductor substrate 1 is thermally oxidized, thereby to form a gate insulating film 60 on the MISFET formation region, and, simultaneously, to also form the gate insulating film 60 on the capacitor formation trenches 4a. Herein, the gate insulating film 60 may also be formed into different films by the same steps as the steps of forming the high-voltage gate insulating film 16 (see FIG. 2) and the low-voltage gate insulating film 15 (see FIG. 3) in the foregoing embodiment 1. Further, at this step, the same oxide film as the gate insulating film 60 is also formed on the memory cell formation region.

Then, the entire surface of the MISFET formation region and the capacitor formation region is covered with a resist. Thereafter, the portion of the oxide film on the surface of the memory cell formation region is etched and removed. Subsequently, the semiconductor substrate 1 is thermally oxidized, thereby to form a silicon oxide film 61, which is to serve as the memory tunnel insulating film on the memory cell formation region.

Figure 53:
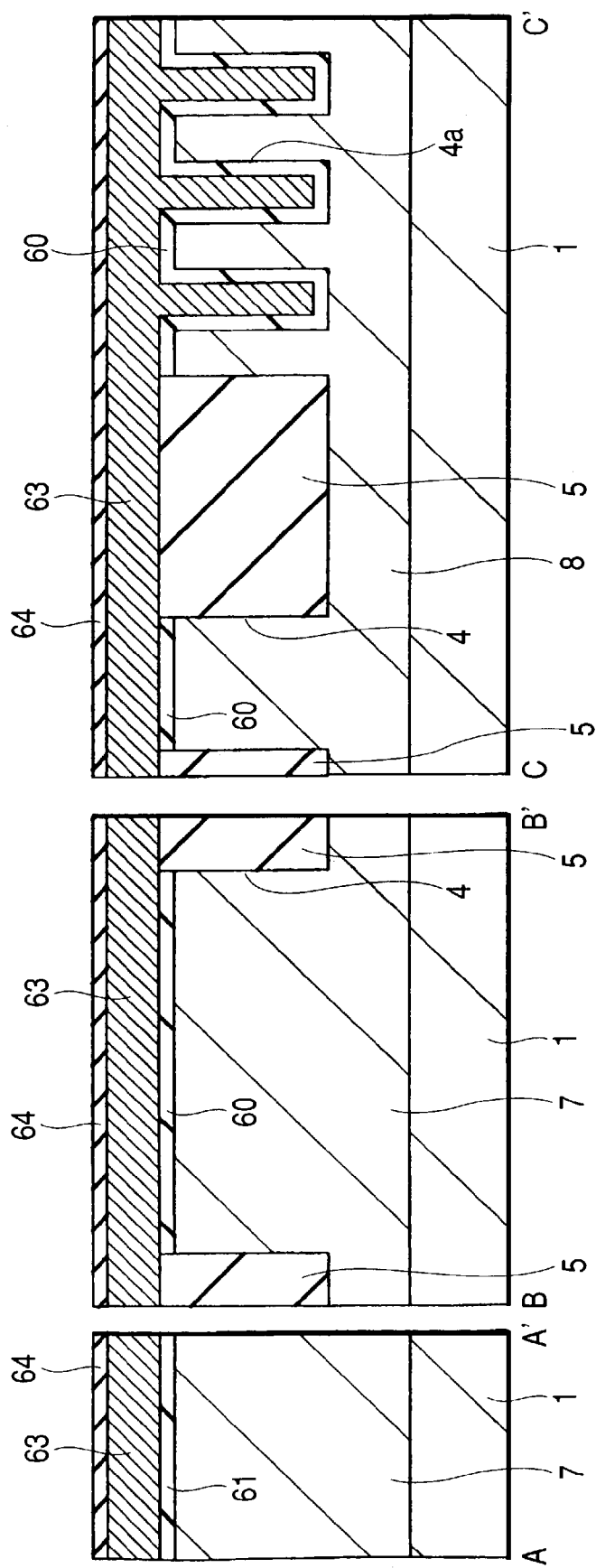
FIG. 53 is a cross sectional view of the respective parts of the semiconductor device as it appears during a manufacturing step subsequent to the step of FIG. 52.

Then, as shown in FIG. 53, on the entire surface of the semiconductor substrate 1, a polysilicon film 63, which is to serve as a floating gate electrode (electric charge storage layer) of the memory cell, is deposited by using a CVD process. Then, a NONO film 64, which is to serve as a memory gate interlayer film, is formed on the polysilicon film 63.

Figure 54:
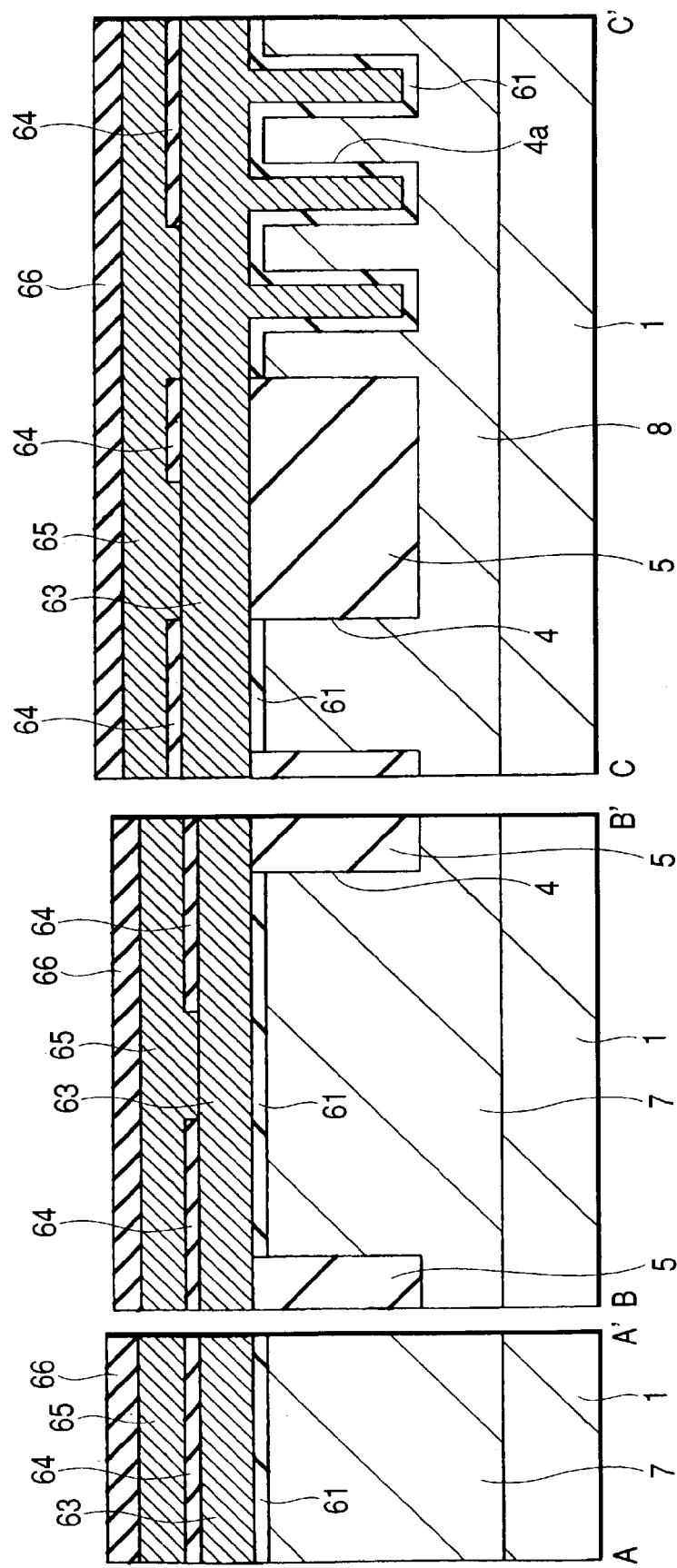
FIG. 54 is a cross sectional view of the respective parts of the semiconductor device as it appears during a manufacturing step subsequent to the step of FIG. 53.

Then, as shown in FIG. 54, a part of the NONO film 64 that is formed on the MISFET formation region and the capacitor formation region is selectively removed. Thereafter, on the exposed polysilicon film 63 and NONO film 64, a polysilicon film 65, which is to serve as a control gate electrode (memory gate electrode) of the memory cell, and a silicon oxide film 66, which is to serve as a cap layer, are sequentially deposited by using a CVD process. This allows the establishment of continuity between the polysilicon film 63 and the polysilicon film 65 that are formed on the MISFET formation region and the capacitor formation region. Subsequently, by dry etching using a resist pattern, the silicon oxide film 66, the polysilicon film 65, the NONO film 64, the polysilicon film 63, and the silicon oxide film 61 are patterned and, thereby, selectively removed. As a result, it is possible to form memory gate electrodes 63a and 65a, gate electrodes 63b and 65b of the MISFET, and capacitor upper electrode 63c and 65c, as shown in FIG. 50.

In the subsequent steps, it is possible to form the semiconductor device having the nonvolatile memory of this embodiment 6, as shown in FIG. 50, through the same steps as used in the foregoing embodiment 1, and, hence, a description thereof will be omitted.

As described above, the floating gate electrode and the memory gate electrode of the memory cell are formed by the same step for the gate electrode of the MISFET and the capacitor upper electrode. Namely, the floating gate electrode and the memory gate electrode of the memory cell, the gate electrode of the MISFET, and the capacitor upper electrode are composed of a conductive film of the same layer. The conductive film used for the formation of the floating gate electrode and the memory gate electrode of the memory cell, the gate electrode of the MISFET, and the capacitor upper electrode is formed by the same step. By performing the formation thereof in this manner, it is possible to simplify the manufacturing process.

Thus, instead of forming the gate electrode of the MISFET and the capacitor upper electrode only from the polysilicon film which is to serve as the control gate electrode of the memory cell, when both the polysilicon film, which is to serve as the floating gate electrode of the memory cell, and the polysilicon film, which is to serve as the control gate electrode, are used, it is possible to obtain the same effects as obtained in the foregoing embodiments 1 to 5.

Up to this point, the present invention has been described specifically by way of various embodiments of the invention, which should not be construed as limiting the scope of the present invention. It is needless to say that various changes and modifications may be made without departing the scope of the invention. For example, each of the foregoing embodiments 1 to 6 may also be combined with one or a plurality of the other embodiments.

The effects obtainable in accordance with typical aspects of the present invention as disclosed in this application will be briefly described as follows.

A capacitor (capacitive element) is formed of a plurality of capacitor formation trenches that are formed in a capacitor formation region, a capacitor dielectric film formed on the capacitor formation region, including the inside of the plurality of the capacitor formation trenches, and capacitor electrodes. As a result, it is possible to increase the surface area of the capacitor, and thereby to improve the capacitor capacitance per unit area.

On a semiconductor substrate, an element isolation trench and the capacitor formation trenches formed in the capacitor are formed by the same step. As a result, it is possible to simplify the manufacturing process of the semiconductor device.

Whereas, the gate insulating film of the MISFET and the dielectric film of the capacitor on the capacitor formation trenches are formed by the same step. As a result, it is possible to simplify the manufacturing process of the semiconductor device.

Further, the capacitor dielectric film in the capacitor formation region, and a memory gate interlayer film of a memory cell are formed by the same step. As a result, it is possible to simplify the manufacturing process of the semiconductor device.

Still further, the dielectric film of the capacitor is formed by using the memory gate interlayer film (NONO film) of the memory cell in place of using a gate insulating film of a MISFET. As a result, it is possible to form a high reliability capacitor dielectric film.

What is claimed is:

1. A method of manufacturing a semiconductor device comprising: semiconductor elements; element isolation trenches each for isolation between the semiconductor elements formed in a MISFET formation region arranged in a first well; capacitor formation trenches formed in capacitor formation regions arranged in a second well separated from the first well; and capacitor electrodes each formed inside the capacitor formation trenches via a dielectric film, the method comprising steps of:
(a) forming the capacitor formation trenches in capacitor formation regions arranged in said second well separated from said first well by a step of forming the element isolation trenches in a semiconductor substrate;
(b) embedding insulating films in the element isolation trenches formed in the MISFET formation region arranged in the first well and in the capacitor formation trenches;
(c) removing the insulating film embedded in the capacitor formation trenches while leaving the insulating film embedded in the element isolation trenches; and
(d) forming gate electrodes in the MISFET formation region by a step of forming capacitor electrodes in the capacitor formation regions.

2. A method of manufacturing a semiconductor device having MISFETs and capacitors, comprising the steps of:
(a) forming element isolation trenches each for isolation between the MISFETs in a semiconductor substrate, and forming capacitor formation trenches in the semiconductor substrate;
(b) embedding insulating films in the element isolation trenches and the capacitor formation trenches;
(c) removing the insulating film embedded in the capacitor formation trenches while leaving the insulating film embedded in the isolation element trenches;
(d) forming a first well in the semiconductor substrate, the first well surrounding a MISFET of said MISFETs;
(e) forming a second well in the semiconductor substrate, the second well surrounding the capacitor formation trenches, the second well being separated from the first well; and
(f) forming a gate insulating film of the MISFETs over the first well, and forming a capacitor dielectric film over the capacitor formation trenches.

3. A method of manufacturing a semiconductor device having MISFETs and capacitors, comprising the steps of:
(a) forming element isolation trenches each for isolation between the MISFETs in a semiconductor substrate, and forming capacitor formation trenches in the semiconductor substrate;
(b) embedding insulating films in the element isolation trenches and the capacitor formation trenches;
(c) removing the insulating film embedded in the capacitor formation trenches while leaving the insulating film embedded in the isolation element trenches;
(d) forming a first well in the semiconductor substrate, the first well surrounding a MISFET of said MISFETs;
(e) forming a second well in the semiconductor substrate, the second well surrounding the capacitor formation trenches, the second well being separated from the first well;
(f) forming a gate insulating film of the MISFETs over the first well, and forming a capacitor dielectric film over the capacitor formation trenches; and
(g) forming gate electrodes of the MISFETs over the gate insulating film, and forming capacitor electrodes over the capacitor dielectric film.

4. A method of manufacturing a semiconductor device having memory cells, MISFETs and capacitors, comprising the steps of:
(a) forming element isolation trenches each for isolation between the MISFETs and between the memory cells in a semiconductor substrate, and forming capacitor formation trenches in the semiconductor substrate;
(b) embedding insulating films in the element isolation trenches and the capacitor formation trenches;
(c) removing the insulating film embedded in the capacitor formation trenches while leaving the insulating film embedded in the isolation element trenches;
(d) forming a first well in the semiconductor substrate, the first well surrounding a MISFET of said MISFETs;
(e) forming a second well in the semiconductor substrate, the second well surrounding the capacitor formation trenches, the second well being separated from the first well;
(f) forming a third well in the semiconductor substrate, the third well surrounding the memory cells, the third well being separated from the first and second wells;
(g) forming a gate insulating film of the MISFETs over the first well, and forming a capacitor dielectric film over the capacitor formation trenches;

(h) forming a first memory gate insulating film over the third well; and (i) forming an electric charge storage layer over the first memory gate insulating film, forming gate electrodes over the gate insulating film, and forming capacitor electrodes over the capacitor dielectric film.

5. A method of manufacturing a semiconductor device having memory cells, MISFETs and capacitors, comprising the steps of:

(a) forming element isolation trenches each for isolation between the MISFETs and between the memory cells in a semiconductor substrate, and forming capacitor formation trenches in the semiconductor substrate;

(b) embedding insulating films in the element isolation trenches and the capacitor formation trenches;

(c) removing the insulating film embedded in the capacitor formation trenches while leaving the insulating film embedded in the isolation element trenches;

(d) forming a first well in the semiconductor substrate, the first well surrounding a MISFET of said MISFETs;

(e) forming a second well in the semiconductor substrate, the second well surrounding the capacitor formation trenches, the second well being separated from the first well;

(f) forming a third well in the semiconductor substrate, the third well surrounding the memory cells, the third well being separated from the first and second wells;

(g) forming a gate insulating film of the MISFETs over the first well, and forming a capacitor dielectric film over the capacitor formation trenches;

(h) forming a first memory gate insulating film over the third well;

(i) forming an electric charge storage layer over the first memory gate insulating film;

(j) forming a second memory gate insulating film over the electric charge storage layer; and (k) forming memory gate electrodes over the second memory gate insulating film, forming gate electrodes over the gate insulating film, and forming capacitor electrodes over the capacitor dielectric film.

6. A method of manufacturing a semiconductor device having memory cells, MISFETs and capacitors, comprising the steps of:

(a) forming element isolation trenches each for isolation between the MISFETs and between the memory cells in a semiconductor substrate, and forming capacitor formation trenches in the semiconductor substrate;

(b) embedding insulating films in the element isolation trenches and the capacitor formation trenches;

(c) removing the insulating film embedded in the capacitor formation trenches while leaving the insulating film embedded in the isolation element trenches;

(d) forming a first well in the semiconductor substrate, the first well surrounding a MISFET of said MISFETs;

(e) forming a second well in the semiconductor substrate, the second well surrounding the capacitor formation trenches, the second well being separated from the first well;

(f) forming a third well in the semiconductor substrate, the third well surrounding the memory cells, the third well being separated from the first and second wells;

(g) forming a gate insulating film of the MISFETs over the first well;

(h) forming a first memory gate insulating film over the third well;

(i) forming an electric charge storage layer over the first memory gate insulating film;

(j) forming a second memory gate insulating film over the electric charge storage layer, and forming a capacitor dielectric film over the capacitor formation trenches; and (k) forming memory gate electrodes over the second memory gate insulating film, forming gate electrodes of the MISFETs over the gate insulating film, and forming capacitor electrodes over the capacitor dielectric film.

7. A method of manufacturing a semiconductor device having memory cells and capacitors, comprising the steps of:

(a) forming element isolation trenches each for isolation between the memory cells in the semiconductor substrate, and forming capacitor formation trenches in the semiconductor substrate;

(b) embedding insulating films in the element isolation trenches and the capacitor formation trenches;

(c) removing the insulating film embedded in the capacitor formation trenches while leaving the insulating film embedded in the isolation element trenches;

(d) forming a second well in the semiconductor substrate, the second well surrounding the capacitor formation trenches;

(e) forming a third well in the semiconductor substrate, the third well surrounding the memory cells, the third well being separated from the second well;

(f) forming a first memory gate insulating film over the third well;

(g) forming an electric charge storage layer over the first memory gate insulating film; and (h) forming a second memory gate insulating film over the electric charge storage layer, and a capacitor dielectric film in the capacitor formation trenches.

8. A method of manufacturing a semiconductor device having memory cells and capacitors, comprising the steps of:

(a) forming element isolation trenches each for isolation between the memory cells in a semiconductor substrate, and forming capacitor formation trenches in the semiconductor substrate;

(b) embedding insulating films in the element isolation trenches and the capacitor formation trenches;

(c) removing the insulating film embedded in the capacitor formation trenches while leaving the insulating film embedded in the isolation element trenches;

(d) forming a second well in the semiconductor substrate, the second well surrounding the capacitor formation trenches;

(e) forming a third well in the semiconductor substrate, the third well surrounding the memory cells, the third well being separated from the second well;

(f) forming a first memory gate insulating film over the third well;

(g) forming an electric charge storage layer over the first memory gate insulating film;

(h) forming a second memory gate insulating film over the electric charge storage layer, and forming a capacitor dielectric film in the capacitor formation trenches; and (i) forming memory gate electrodes over the second memory gate insulating film, and forming capacitor electrodes over the capacitor dielectric film.

9. The method of manufacturing a semiconductor device according to claim 1, wherein the capacitor formation trenches are formed in the shape of holes, stripes, or a lattice.

10. The method of manufacturing a semiconductor device according to claim 1 wherein in the step (c), a part of the insulating film embedded in the element isolation trenches, and the insulating film embedded in the capacitor formation trenches, are removed, while leaving another part of the insulating film embedded in the element isolation trenches.

11. The method of manufacturing a semiconductor device according to claim 2, wherein the MISFETs include a first MISFET for high voltage and a second MISFET for low voltage, and
wherein the thickness of the gate insulating film of the first MISFET is larger than the thickness of the gate insulating film of the second MISFET.

12. The method of manufacturing a semiconductor device according to claim 5,
wherein the second memory gate insulating film and the capacitor dielectric film include a multilayer film comprised of a silicon oxide film and a silicon nitride film.

13. The method of manufacturing a semiconductor device according to claim 5,
wherein the electric charge storage layer includes a silicon nitride film or a Si nano-dot.

14. The method of manufacturing a semiconductor device according to claim 5,
wherein the electric charge storage layer includes a polysilicon film.

15. The method of manufacturing a semiconductor device according to claim 5,
wherein the memory gate electrodes include a polysilicon film.

16. The method of manufacturing a semiconductor device according to claim 1,
wherein the capacitor dielectric film and each of the capacitor electrodes are formed over a plurality of the capacitor formation trenches.

17. The method of manufacturing a semiconductor device according to claim 16,
wherein the plurality of the capacitor formation trenches are formed in the shape of holes, stripes, or a matrix.

18. The method of manufacturing a semiconductor device according to claim 5, further comprising the steps of:
forming a charge pump circuit of a plurality of the MISFETs and a plurality of the capacitors; and
electrically connecting the charge pump circuit to the memory gate electrodes.

19. The method of manufacturing a semiconductor device according to claim 6, further comprising the steps of:
forming a charge pump circuit of a plurality of the MISFETs and a plurality of the capacitors; and
electrically connecting the charge pump circuit to the memory gate electrodes.

20. The method of manufacturing a semiconductor device according to claim 1, wherein said element isolation trenches are formed at least in part in an element isolation region separate from said capacitor formation regions.

21. The method of manufacturing a semiconductor device according to claim 11, wherein said capacitor dielectric film and the gate insulating film of the first MISFET are formed in a same step.

22. The method of manufacturing a semiconductor device according to claim 11, wherein said capacitor dielectric film and the gate insulating film of the second MISFET are formed in a same step.

23. The method of manufacturing a semiconductor device according to claim 3, wherein said gate electrodes and said capacitor electrodes are formed in a same step.

24. The method of manufacturing a semiconductor device according to claim 5, wherein said second memory gate insulating film and said capacitor dielectric film are formed in a same step.

25. The method of manufacturing a semiconductor device according to claim 8, wherein steps (d) and (e) are the same step.

26. The method of manufacturing a semiconductor device according to claim 8, wherein steps (d) and (e) are different steps.

27. The method of manufacturing a semiconductor device according to claim 7, wherein steps (d) and (e) are the same step.

28. The method of manufacturing a semiconductor device according to claim 7, wherein steps (d) and (e) are different steps.

29. The method of manufacturing a semiconductor device according to claim 6, wherein steps (d) and (e) are the same step.

30. The method of manufacturing a semiconductor device according to claim 6, wherein steps (d) and (e) are different steps.

31. The method of manufacturing a semiconductor device according to claim 5, wherein steps (d) and (e) are the same step.

32. The method of manufacturing a semiconductor device according to claim 5, wherein steps (d) and (e) are different steps.

33. The method of manufacturing a semiconductor device according to claim 4, wherein steps (d) and (e) are the same step.

34. The method of manufacturing a semiconductor device according to claim 4, wherein steps (d) and (e) are different steps.

35. The method of manufacturing a semiconductor device according to claim 3, wherein steps (d) and (e) are the same step.

36. The method of manufacturing a semiconductor device according to claim 3, wherein steps (d) and (e) are different steps.

37. The method of manufacturing a semiconductor device according to claim 2, wherein steps (d) and (e) are the same step.

38. The method of manufacturing a semiconductor device according to claim 2, wherein steps (d) and (e) are different steps.

* * * * *